United States Patent
Sakamoto et al.

(10) Patent No.: US 6,909,178 B2
(45) Date of Patent: *Jun. 21, 2005

(54) SEMICONDUCTOR DEVICE AND METHOD OF MANUFACTURING THE SAME

(75) Inventors: Noriaki Sakamoto, Gunma (JP); Yoshiyuki Kobayashi, Gunma (JP); Junji Sakamoto, Gunma (JP); Yukio Okada, Gunma (JP); Yusuke Igarashi, Gunma (JP); Eiju Maehara, Gunma (JP); Kouji Takahashi, Gunma (JP); Takeshi Nakamura, Gunma (JP)

(73) Assignee: Sanyo Electric Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 10/460,600

(22) Filed: Jun. 12, 2003

(65) Prior Publication Data

US 2004/0038471 A1 Feb. 26, 2004

Related U.S. Application Data

(60) Continuation-in-part of application No. 10/236,502, filed on Sep. 6, 2002, now Pat. No. 6,596,564, which is a division of application No. 09/809,849, filed on Mar. 16, 2001, now Pat. No. 6,462,418.

(60) Provisional application No. 60/462,463, filed on Apr. 11, 2003, provisional application No. 60/462,468, filed on Apr. 11, 2003, provisional application No. 60/462,109, filed on Apr. 11, 2003, and provisional application No. 60/461,998, filed on Apr. 11, 2003.

(30) Foreign Application Priority Data

Sep. 6, 2000 (JP) ......................................... 2000-269467

(51) Int. Cl.$^7$ .............................................. H01L 23/34
(52) U.S. Cl. ...................... 257/725; 257/680; 257/685; 257/686; 257/753; 257/783
(58) Field of Search ................................ 257/680, 685, 257/686, 753, 783

(56) References Cited

U.S. PATENT DOCUMENTS 6,020,629 A * 2/2000 Farnworth et al. .......... 257/686

* cited by examiner

*Primary Examiner*—David Nelms
*Assistant Examiner*—Mai-Huong Tran
(74) *Attorney, Agent, or Firm*—Fish & Richardson P.C.

(57) ABSTRACT

As conductive patterns 11A to 11D are formed burying in a insulating resin 10 and a conductive foil 20 is formed being half-etched, thickness of the device is made thin. As an electrode for radiation 11D is provided, a semiconductor device superior in radiation is provided.

16 Claims, 37 Drawing Sheets

SEMICONDUCTOR DEVICE AND METHOD OF MANUFACTURING THE SAME

This application is a continuation-in-part (and claims the benefit of priority under 35 USC 120) of U.S. application Ser. No. 10/236,502, filed Sep. 6, 2002, now U.S. Pat. No. 6,596,564 which is a divisional of U.S. application Ser. No. 09/809,849 filed Mar. 16, 2001 now U.S. Pat. No. 6,462,418 and claims the benefit of priority under 35 USC 119 of U.S. Provisional Nos. 60/462,463, 60/462,468, 60/462,109, and 60/461,998, all filed on Apr. 11, 2003. The disclosure of the prior applications is considered part of (and is incorporated by reference in) the disclosure of this application.

BACKGROUND OF THE INVENTION

1. Description of the Related Art

The present invention relates to a semiconductor device and a method for manufacturing the same, particularly a semiconductor device radiating excellently heat from the semiconductor device and a method for manufacturing the same.

2. Description of the Related Art

In recent years, use of IC package for portable equipment or small, hi-density mounting equipment progresses, and the conventional IC package and its concept of mounting are largely changing. These details are described in *CSP technology, and mounting material and device supporting the technology*—special issue of DENSHI ZAIRYO (p. 22, September 1998).

FIG. 9 is a structure adopting a flexible sheet 50 as an interposer board, a copper foil pattern 51 is put on the flexible sheet through adhesive, and an IC chip is fixed. There is a pad for bonding 53 formed at periphery of the IC chip as the conductive pattern 51. A pad for connecting solder ball 54 is formed through a conductive path 51B formed in one body (integrally) with the pad for bonding 53.

At backside of the pad for connecting solder ball 54, an opening 56 where the flexible sheet is opened, and through the opening 56, a solder ball 55 is formed. The entire body is sealed with an insulating resin 58 using the flexible sheet 50 as a board. Symbol 57 is a bonding wire.

When a semiconductor device is used as an example of circuit devices, a conventional package-type semiconductor device sealed by ordinary transfer molding is popular. This is mounted on a printed substrate PS, as in FIG. 10.

In the package-type semiconductor device, the semiconductor chip 502 is covered with a resin layer 503, and a lead terminal 504 for external connection is led out through the side of the resin layer 503.

However, the package-type semiconductor device 501 does not satisfy the requirements of down-sizing, thickness reduction and weight reduction, since the lead terminal 504 is led outside from the resin layer 503 and since the overall size of the device is large.

Accordingly, various companies have tried various structures, competing with others in order to realize down-sized, thin-walled and lightweight semiconductor devices. Recently, CSP (chip-size packages) have been developed, including wafer scale CSP of which the size is equal to the chip size and other CSP that are larger in some degree than the chip size.

FIG. 11 shows a CSP 506 that is larger in some degree than the chip size, in which the glass-epoxy substrate 505 serves as a supporting board. As illustrated, a transistor chip T is mounted on the glass-epoxy substrate 505, and this is described below.

On the surface of the glass-epoxy substrate 505, a first electrode 507, a second electrode 508 and a die pad 509 are formed; and on the back thereof, a first back electrode 510 and a second back electrode 511 are formed. Via the through-hole TH, the first electrode 507 is electrically connected to the first back electrode 510 and the second electrode 508 to the second back electrode 511. The bare transistor chip T is attached to the die pad 509. The emitter electrode of the transistor is connected to the first electrode 507 via a bonding wire 512; and the base electrode thereof is to the second electrode 508 via another bonding wire 512. Further, a resin layer 513 is formed on the glass-epoxy substrate 505 to cover the transistor chip T.

Though is has the glass-epoxy substrate 505, the CSP 506 is advantageous in that the extending structure from the chip T to the back electrodes 510 and 511 for external connection is simple and the cost for manufacturing it is low, as compared with wafer scale CSP.

As in FIG. 10, the CSP 506 is mounted on a printed substrate PS. Electrodes and wires are formed on the printed substrate PS to constitute electric circuits; and the CSP 506, the package-type semiconductor device 501 or other devices such as chip resistor CR and chip capacitor CC are electrically connected and fixed to them.

The circuit thus formed on the printed substrate is fitted in various sets.

A method for manufacturing the CSP is described below with reference to FIG. 12 and FIG. 13.

First, a glass-epoxy substrate 505 as a supporting board is prepared, and Cu foils 520 and 521 are attached to both surfaces thereof via an insulating adhesive (FIG. 12A). Next, the Cu foils 520 and 521 are partly coated with an etching-resistant resist 522, corresponding to the first electrode 507, the second electrode 508, the die pad 509, the first back electrode 510 and the second back electrode 511, and the Cu foil 520 and 521 are patterned. The patterning may be carried out separately on the face and the back of the substrate (FIG. 12B).

Next, using a drill or laser, holes for through-holes TH are formed in the glass-epoxy substrate, and these are plated to be through-holes TH. Via each through-hole TH, the first electrode 507 is electrically connected to the first back electrode 510, and the second electrode 508 to the second back electrode 510 (FIG. 12C).

Though not shown, the first electrode 507 and the second electrode 508 to be bonding posts are plated with Ni, the die pad 509 to be a die bonding post is plated with Au, and a transistor chip T is die-bonded to the die pad 509.

Finally, the emitter electrode of the transistor chip T is connected to the first electrode 507 and the base electrode thereof to the second electrode 508 via a bonding wire 512, and this is covered with a resin layer 513 (FIG. 12D).

The process gives a CSP type electric device that has the supporting board 505. In this process, a flexible sheet may be used for the supporting board.

On the other hand, a method of manufacturing semiconductor devices on a ceramic substrate is described with reference to the flowchart of FIG. 13. A ceramic substrate as supporting board is prepared, and through-holes are formed therein. Next, both surfaces of the substrate are printed with a conductive paste to form face and back electrodes thereon, and these are sintered. After this, the process of this method is the same as that of FIG. 12, until the thus-constructed structure is covered with a resin layer. However, the ceramic substrate used herein is extremely brittle and is readily cracked, different from flexible sheets and glass-epoxy substrates, and is therefore problematic in that it is not applicable to resin mold sealing. Accordingly, in this process, the substrate with necessary elements mounted thereon is potted with a sealing resin, cured and flattened by polishing it, and finally this is diced into individual chips with a dicing machine.

However in case of adopting a flexible sheet 50 as an interposer board, the flexible sheet formed on a rear surface of IC chip is very expensive, and there are problems that cost rises, thickness of the package becomes thick, and weight increases.

There is a problem that heat resistance from a back face of the IC chip to a back face of the package becomes large in a supporting board because the supporting board comprises material other than metal. For said supporting board, there is a flexible sheet, a ceramic board, or a printed board. A heat conduction path comprising material superior in heat conduction is the bonding wire 57, the copper foil 51, and the solder ball 55, the above supporting board has a structure not to radiate fully at driving. Therefore there is a problem that driving current does not flow fully because of temperature rise of IC chip at driving.

In FIG. 11, the transistor chip T, the connecting means 507 to 512 and the resin layer 513 are all indispensable constitutive elements for electric connection to external units and for transistor protection. Heretofore, It has heretofore been difficult to provide a down-sized, thin-walled and lightweight circuit device that comprises these constitutive elements.

As so mentioned hereinabove, the glass-epoxy substrate 505 used as supporting board is naturally unnecessary. However, for bonding the electrodes thereto in the process of manufacturing semiconductor devices, the supporting board is used, and the glass-epoxy substrate 505 is indispensable in the manufacturing process.

For these reasons, the glass-epoxy substrate 505 is indispensably used and it increases the production costs. In addition, since the glass-epoxy substrate 505 is thick, the circuit device comprising it is inevitably thick and is limited in point of down-sizing, thickness reduction and weight reduction.

Further, the glass-epoxy substrate and the ceramic substrate indispensably require a step of forming through-holes through which the electrodes formed on the two surfaces thereof are connected to each other, and therefore manufacturing time is long and industrial-scale mass production is very difficult.

SUMMARY OF THE INVENTION

The invention is carried out in view of the above problems, and intends to obtain a reliable semiconductor device having a small package and a good radiation characteristics.

The problems are solved having a pad provided facing to a bonding electrode of a semiconductor chip, an electrode for radiation provided at an arranged area of said semiconductor chip, a insulating adhesion means provided on said electrode for radiation, said semiconductor chip fixed to said insulating adhesion means and electrically connected to said pad, and a insulating resin sealing (molding) said semiconductor chip so as to expose a back face of said pad and said insulating adhesion means and to make in one body.

The problem is solved by that said insulating adhesion means comprises an adhesion sheet or adhesive.

The problem is solved by that said semiconductor element is mounted in face-up type and that said pad and said bonding electrode are connected with fine metal wires (bonding wires).

The problem is solved by providing: plural bonding pads provided so as to surround one area; external connection electrodes extended in one body with said bonding pads; an electrode for radiation provided at said one area; a insulating adhesion means provided at said electrode for radiation; a semiconductor chip fixed through said insulating adhesion means; bonding wires connecting said bonding electrodes and said bonding pads on said semiconductor chip; and a insulating resin covering said semiconductor chip, said bonding pads, said electrode for radiation, said external connection electrodes, and said bonding wires and exposing back faces of said external connection electrodes, back faces of said electrodes for radiation, and back faces of said insulating adhesion means.

The problem is solved by providing: plural pads provided so as to surround one area; an electrode for radiation provided at said one area; a insulating adhesion means provided at said electrode for radiation; a semiconductor chip fixed through said insulating adhesion means; connecting means connecting said bonding electrodes and said pads on said semiconductor chip; and a insulating resin covering said semiconductor chip, said bonding pads, and said connection means, and exposing back faces of said bonding pads and said insulating adhesion means; wherein the back face of said bonding pads are used as the external connection electrode.

The problem is solved by that said connection means comprises a bonding wire or brazing material.

The problem is solved by that a side face of said pad, bonding pad, or external connection electrode comprises a curved structure.

The problem is solved by preparing a conductive foil and half-etching so that a conductive pattern is formed in projection shape;

providing an insulating adhesion means so as to fill in an isolation trench formed by said half-etching;

fixing a semiconductor chip through said insulating adhesion means so as to connect said conductive pattern electrically and;

providing a insulating resin at said conductive foil so as to seal said semiconductor chip and said conductive pattern; and removing a back face of said conductive foil so as to exposing a back face of said insulating adhesion means and to separate as said conductive pattern.

The problem is solved by preparing a conductive foil and half-etching so that a conductive pattern comprising at least a pad and an electrode for radiation is formed in projection shape;

forming an insulating adhesion means so as to cover said electrode for radiation and fill in an isolation trench adjacent to the electrode;

fixing a semiconductor chip through said insulating adhesion means so as to connect said conductive pattern electrically and;

providing a insulating resin at said conductive foil so as to seal said semiconductor chip and said conductive pad; and removing a back face of said conductive foil so as to exposing a back face of said insulating adhesion means and to separate said conductive pattern.

By providing the semiconductor device, it is possible to transfer heat of a semiconductor chip to an electrode for radiation. As a conductive pattern including the electrode for radiation is formed without using a supporting board, it is possible to decrease cost and to make thickness of the semiconductor device thin.

The invention is carried out in view of the above problems, and characterized by comprising multiple conductive patterns for element mounting thereon that is electrically separated from each other by a isolation trench, a thermosetting resin layer that fills the isolation trench to cover the surface of the conductive pattern, a circuit element fixed above the thermosetting resin layer, and an insulating resin that covers the circuit element to integrally support the conductive pattern bonded to the thermosetting resin layer.

In the invention, the conductive foil to be a conductive pattern functions by itself as a supporting board, and the conductive foil supports the entire structure while the isolation trench is formed and while the circuit elements are mounted and covered with an insulating resin. When the conductive foil is separated into individual conductive patterns, the insulating resin functions as the supporting board. Accordingly, the minimum constitutive components—circuit element, conductive foil and insulating resin may be enough for the invention. This means that the invention does not require the supporting board that is indispensable in the related art technology of manufacturing circuit devices, and it reduces the production costs. In the invention, in addition, the supporting board is unnecessary, the conductive pattern is embedded in the insulating resin, and the thickness of the insulating resin and the conductive foil may be varied in any desired manner. Thus characterized by these advantages, still another advantage of the invention is that it produces extremely thin-walled circuit devices.

The manufacturing method of the invention is characterized by comprising a step of preparing conductive foil, and a step of forming a isolation trench that does not exceed the thickness of the conductive foil in a region thereof at least except the region to be a conductive pattern thereby to form the conductive pattern, and a step of coating at least a part of the surface of the conductive pattern with a thermosetting resin layer to fill the isolation trench, and a step of selectively removing the thermosetting resin layer in the site to which the electrodes of a circuit element mounted on the conductive pattern are bonded, and a step of fixing a circuit element above the conductive pattern and a step of forming a connecting means for electrically connecting the electrodes of the circuit element to the desired site of the conductive pattern, and a step of molding it with an insulating resin that covers the circuit element and bonds to the thermosetting resin layer.

In the manufacturing method of the invention, since the conductive pattern is coated with a semi-cured thermosetting resin layer immediately after its formation, the isolation trench can be completely filled with a liquid thermosetting resin of low viscosity, and the adhesion strength of the two is significantly increased. In addition, since the thermosetting resin layer covers the conductive pattern immediately after the conductive pattern has been formed, the surface of the conductive pattern is not oxidized in the subsequent heating step for die bonding or wire bonding, and the reliability of the devices fabricated is high.

DESCRIPTION OF THE PREFERRED EMBODIMENTS (First Embodiment)

Figure 1A:
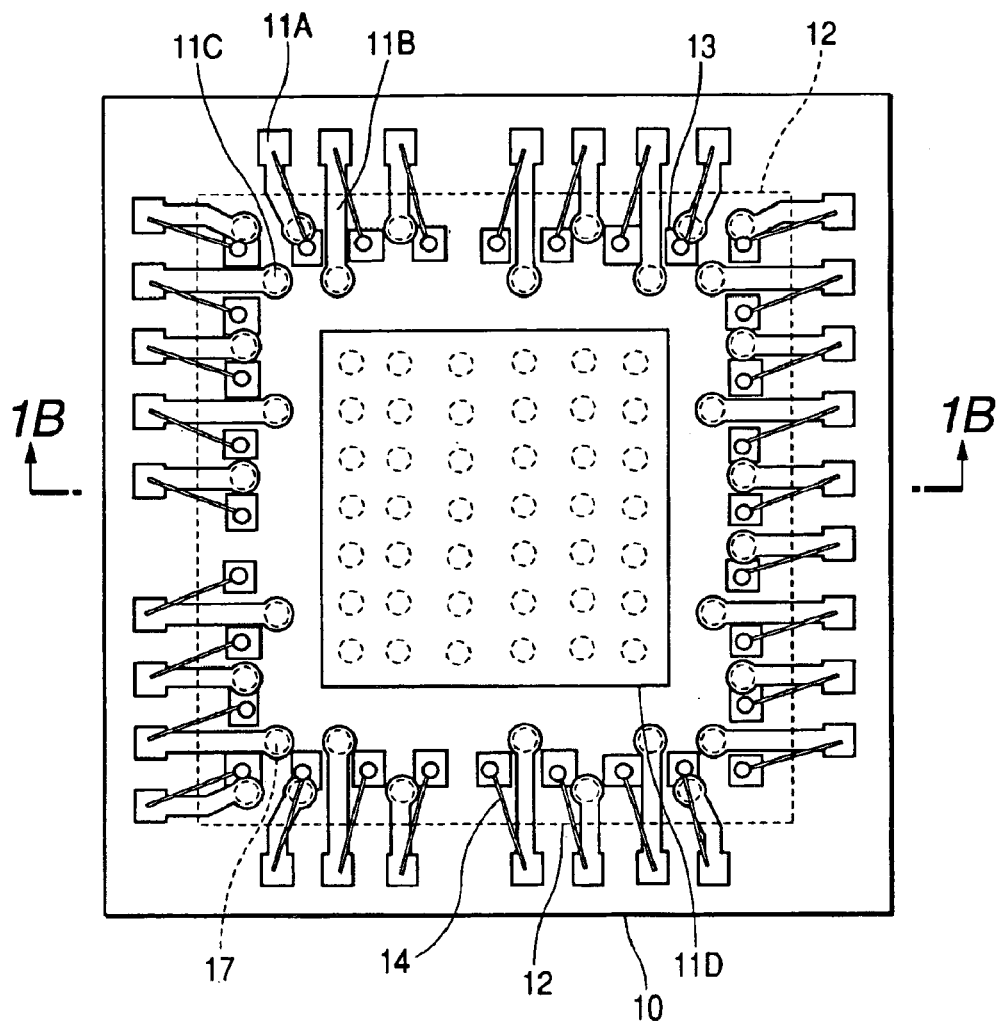
FIG. 1 shows a semiconductor device of the invention.
Figure 1B:
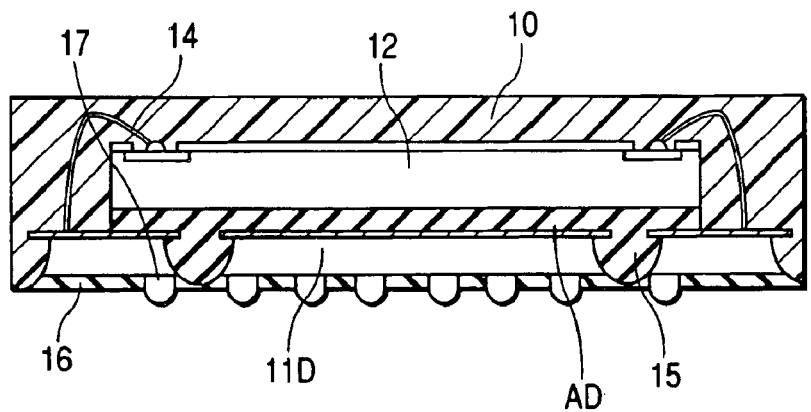

First, a semiconductor device of the invention is described referring to FIG. 1. FIG. 1A is a plan view of the semiconductor device, and FIG. 1B is a section view cut with A—A line.

FIG. 1 shows a insulating resin 10 buried with the following chips. They are pads 11A, conductive paths 11B in one body with the pads 11A, external connection electrodes 11C provided at the other ends of the conductive paths 11B in one body with the conductive paths 11B. Further an electrode for radiating 11D provided at one area surrounded by the conductive patterns 11A, 11B, and 11C and a semiconductor chip 12 provided on the electrode for radiating 11D are buried. The semiconductor chip 12 is fixed to the electrode for radiating 11D through a insulating adhesion means AD, and is shown with dotted line in FIG. 1A.

A bonding electrode 13 of the semiconductor chip 12 and the pad 11A are electrically connected through a bonding wire 14.

Side face of said conductive pattern 11A to 11D is etched with non-anisotropy, and has a curved structure because of being formed with wet etching so as to generate anchor effect by the curved structure.

The structure consists of four materials: the semiconductor chip 12, plural conductive patterns 11A to 11C, the electrode for radiation 11D, the insulating adhesion means AD, and the insulating resin 10 burying them. In arranged area of the semiconductor chip 12, said insulating adhesion means AD is formed on and between the conductive patterns 11A to 11D, particularly is provided in the isolation trench 15 formed by etching so as to expose the back face. The insulating resin 10 seals all including these materials. Said pads 11A and semiconductor chip 12 are supported by the insulating resin 10.

For the insulating adhesion means, adhesive comprising insulating material and insulating sheet of adhesiveness are desirable. As clear in the description below, material is desirable to bond entire wafer and to pattern by photolithography. For the insulating resin, thermosetting resin such as epoxy resin and thermoplastic resin such as polyimide resin and polyphenylenesulfide are used. All kinds of resin are used if they are resins hardening using a die and covering by dipping and painting. For the conductive patterns 11A to 11D, conductive foil of Cu as main material, conductive foil of Al as main material, Fe—Ni alloy, laminated product of Cu—Al, or laminated product of Al—Cu—Al is used. Of course, even other material is possible to use, particularly conductive material easy to etch and easy to evaporate by laser is desirable. Considering half-etching ability, forming ability of plating, and thermal stress, conductive material of Cu as main material formed by rolling is desirable.

The invention has a characteristic to prevent remove of the conductive pattern because the insulating resin 10 and the insulating adhesion means AD are filled into even said isolation trench 15. By carrying out non-anisotropic etching using dry etching or wet etching for etching, the side faces of pads 11A are made into curved structure so as to generate anchor effect. As the result, the structure that the conductive patterns 11A to 11D do not come out (remove) from the insulating resin 10 (package) is realized.

Further the back faces of the conductive patterns 11A to 11D expose at the back face of the package. Accordingly the back face of the electrode 11D for radiation is fixed with the electrode on the mounting board. The structure can radiate heat generating from the semiconductor chip 12 on the electrode of the mounting board, can prevent temperature rise of the semiconductor chip 12, and can increase driving current of the semiconductor chip 12. The electrode for radiation 11C and the semiconductor chip 12 may be connected electrically.

Because the conductive patterns 11A to 11D are supported by insulating resin 10 in the semiconductor device, a supporting board is not need. This construction is a characteristic of the invention. As described at the prior art, the conductive path of the conventional semiconductor device is supported by a supporting board (flexible sheet, printed board, or ceramic board), or supported by a lead frame, the construction which is not need originally is added. However the circuit device consists of necessary minimum components and does not need the supporting board so that the device has a characteristic to be thin, light, and inexpensive because of low material cost.

At the back face of the package, the conductive patterns 11A to 11D expose. By covering brazing material such as solder for example, at the area, the brazing material can get wet thickly because area of the electrode for radiation 11D is broad. Therefore brazing material of the back face of the external connection electrode 11C is not wet at the electrode of the mounting board at fixing on the mounting board, so it is assumed to become bad connection.

To solve that, a insulating film 16 is formed at the back face of the semiconductor device 15. Circles of dotted line shown FIG. 1A show the external connection electrodes 11C and electrodes for radiation 11D exposing from the insulating film 16. That is, as the insulating film 16 covers portions except the circles and size of circle portions is substantially same size, thickness of brazing material formed here is substantially same. This is similar as after solder printing and after reflow. This is similar about conductive paste such as Ag, Au, Ag—Au, Ag—Pd and so on. By the structure, bad quality of the electrical connection means 23 are depressed. An exposing portion 17 of the electrode for radiation 11D may be formed larger than exposing size of the external connection electrode 11C considering radiation of the semiconductor chip. As all of the external connection electrodes 11C are substantially same size, all area of the external connection electrodes 11C may be exposed at entire area, and a part of the back face of the electrode for radiation 11D may be exposed from the insulating film 16 with substantially same size.

By providing the insulating film 16, it is possible to extend the conductive path provided at the mounting board to the back face of the semiconductor device. Although the conductive path provided at the mounting board side is generally arranged going around the fixed area of said semiconductor device, forming said insulating film 16 can arrange without going around. Further as the insulating resin 10 and the insulating adhesion means AD project from the conductive pattern, a gap is formed between the conductive path of the mounting board side and the conductive pattern so as to prevent short.

(Second Embodiment)

The method for manufacturing shows the method for manufacturing of the semiconductor chip 15 shown in FIG. 1, and FIG. 2 to FIG. 6 are section views corresponding to A—A line of FIG. 1A.

Figure 2:
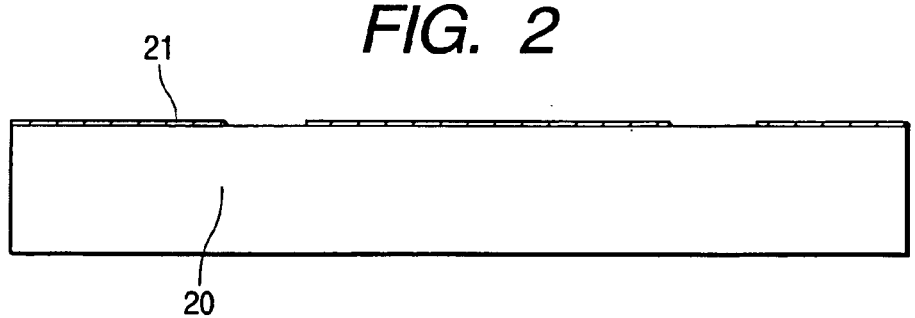
FIG. 2 is a view for showing a method for manufacturing the semiconductor device of the invention.

First, a conductive foil 20 is provided as FIG. 2. Thickness thereof is desirably 10 $\mu$m to 300 $\mu$m, here rolled copper foil of 70 $\mu$m is used. Next on the front face of the conductive foil 20, a conductive film 21 or a photo resist is formed as etching-resist.

The pattern is same pattern as the pads 11A in FIG. 1A, the conductive paths 11B, the external connection electrode 11C, and the electrodes for radiation 11D. In the case of using the photo resist instead of the conductive film 21, a conductive film such as Au, Ag, Pd or Ni is formed at a part corresponding to at least pad in the lower layer of the photo resist. This is provided to make bonding possible. (Refer FIG. 2 about the above.)

Next, a conductive foil 20 is half-etched through said conductive film 21 or photo resist. Depth of etching may be thinner than thickness of conductive foil 20. The thinner the depth of etching, forming the finer pattern is possible.

By half-etching, conductive patterns 11A to 11D appear at surface of the conductive foil 20 in projection shape. As above-mentioned, here Cu foil formed by roll and made of Cu as main material is used for the conductive foil 20. For the conductive foil, conductive foil made of AL, conductive foil made of Fe—Ni alloy, layered product of Cu-AL, or layered product of Al—Cu—Al may be used. Especially the layered product of Al—Cu—Al prevents bend appearing by difference of coefficient of thermal expansion.

At part corresponding to dotted line of FIG. 1, a insulating adhesion means AD is formed. The insulating adhesion means AD is provided at an isolation trench 15 between the electrode of radiation 11D and the external connection electrode 11C, at an isolation trench 15 between the electrode of radiation 11D and the conductive path 11B, and on them. (Refer FIG. 3 about the above.)

Next, a semiconductor chip 12 is fixed at one area providing the insulating adhesion means AD, a bonding electrode 13 of the semiconductor chip 12 and the bonding pad 11A are electrically connected. In the figure, as the semiconductor chip 12 is mounted in face up type, a bonding wire 14 is used for the connection means.

In the bonding, the bonding pads 11A are in one body with the conductive foil 20, and further a back face of the conductive foil 20 contacts face of table of a bonding machine because the back face is flat. Therefore if the conductive foil 20 is entirely fixed to the bonding table, there is not position shift of the bonding pads 11A, and bonding energy is transferred efficiently to the bonding wire 14 and the bonding pads 11A. Therefore the bonding wire 14 is connected improving fixing strength thereof. Fixing the bonding table is possible by providing plural vacuum suction holes at entire face of the table for example. The conductive foil 21 may be pushed from upper side.

The semiconductor chip is mounted without using the supporting board, and height of the semiconductor chip 12 is arranged low as thickness as the supporting board. Therefore it is possible that thickness of the package is made thin. (Refer to FIG. 4 about the above.)

An insulating resin 10 is formed so as to cover the conductive patterns 11A to 11D formed by half-etched, the semiconductor chip 12, and the bonding wire 14. For the insulating resin, both of thermoplasticity and thermosetting property may be used.

Transfer molding, injection molding, dipping, or painting realizes the resin. For the resin material, thermosetting resin such as epoxy resin is realized by transfer molding and thermoplastic resin such as liquid polymer and polyphenylenesulfide is realized by injection molding.

In the mode for carrying out, thickness of the insulating resin is adjusted so as to cover 100 $\mu$m upper from an upper limit face of the bonding wire 14. The thickness may be made thick or thin considering strength of the semiconductor device.

In the injection of resin, as the conductive patterns 11A to 11D are in one body with the sheet-shape conductive foil 20, position of the conductive patterns 11A to 11D does not shift at all as long as the conductive foil 20 does not shift.

As above-mentioned, in the insulating resin 10, the conductive patterns 11A to 11D formed as projection and the semiconductor chip 12 are buried, and the conductive foil 20 of lower part than the projection exposes at the back face. (Refer FIG. 5 about the above.)

Next, the conductive foil 20 exposing at the back face of the insulating resin 10 is removed and the conductive patterns 11A to 11D are individually separated.

Various methods are considered for the separating process, that is, the back face may be separated removing by etching or grinding by polishing or grinding. Both of them may be used. There is a problem that shavings of the conductive foil 20 and bur-shape rolled metal extended thin to outside cut into the insulating resin 10 and the insulating adhesion means AD at grinding till the insulating resin 10 exposes for example. Therefore separating the conductive pattern by etching, the device is formed without that metal of the conductive foil 20 cuts into the insulating resin 10 existing between the conductive pattern 11A to 11D and the insulating adhesion means AD. Thus short between the conductive pattern 11A to 11D of fine interval is prevented. (Refer FIG. 5 about the above.)

In the case that plural units becoming the semiconductor device 15 are formed, dicing process is added after the separating process.

Although the units are separated individually using the dicing machine here, it is possible by chocolate breaking, pressing, and cutting.

Figure 6:
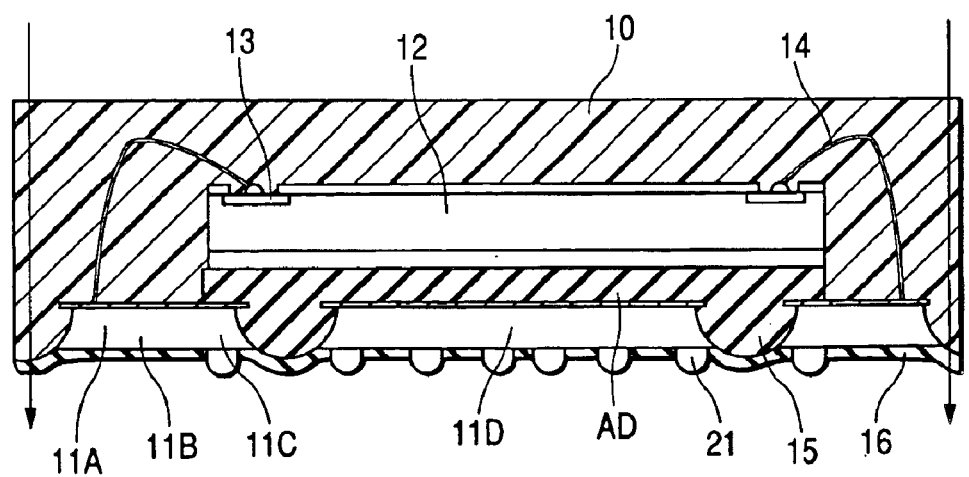
FIG. 6 is a view for showing a method for manufacturing the semiconductor device of the invention.

Here the insulating film 16 is formed on the conductive patterns 11A to 11D exposing at the back face separated and is patterned so as to exposes the parts shown in circle of dotted line of FIG. 1A, and after that, is diced along an arrow shown in FIG. 6 to be each of the semiconductor devices.

The solder 21 may be formed before or after dicing.

The above method for manufacturing realizes a light, thin, short, small package where a semiconductor chip buried in insulating material.

Figure 3:
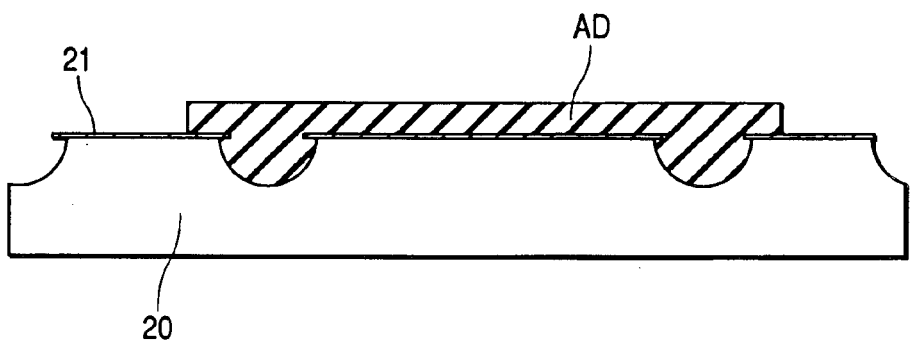
FIG. 3 is a view for showing a method for manufacturing the semiconductor device of the invention.
Figure 4:
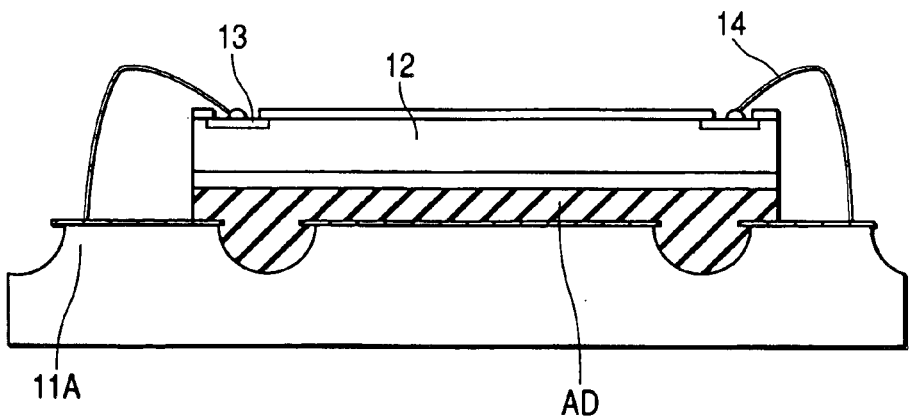
FIG. 4 is a view for showing a method for manufacturing the semiconductor device of the invention.
Figure 5:
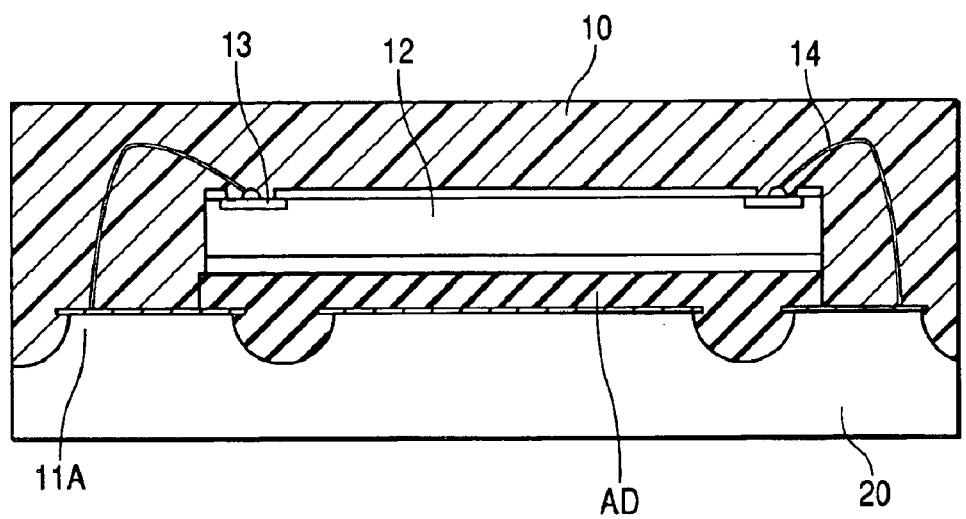
FIG. 5 is a view for showing a method for manufacturing the semiconductor device of the invention.

The insulating adhesion means AD shown in FIG. 3 and FIG. 4 may be bonded at the stage of wafer before the semiconductor 12 is individually separated. That is, if sheet-shaped adhesive is formed on the back face of wafer at the stage wafer and the wafer is cut with the sheet at dicing, the process forming the insulating adhesion means AD on the conductive foil 20, shown in FIG. 3, is not need.

Figure 7:
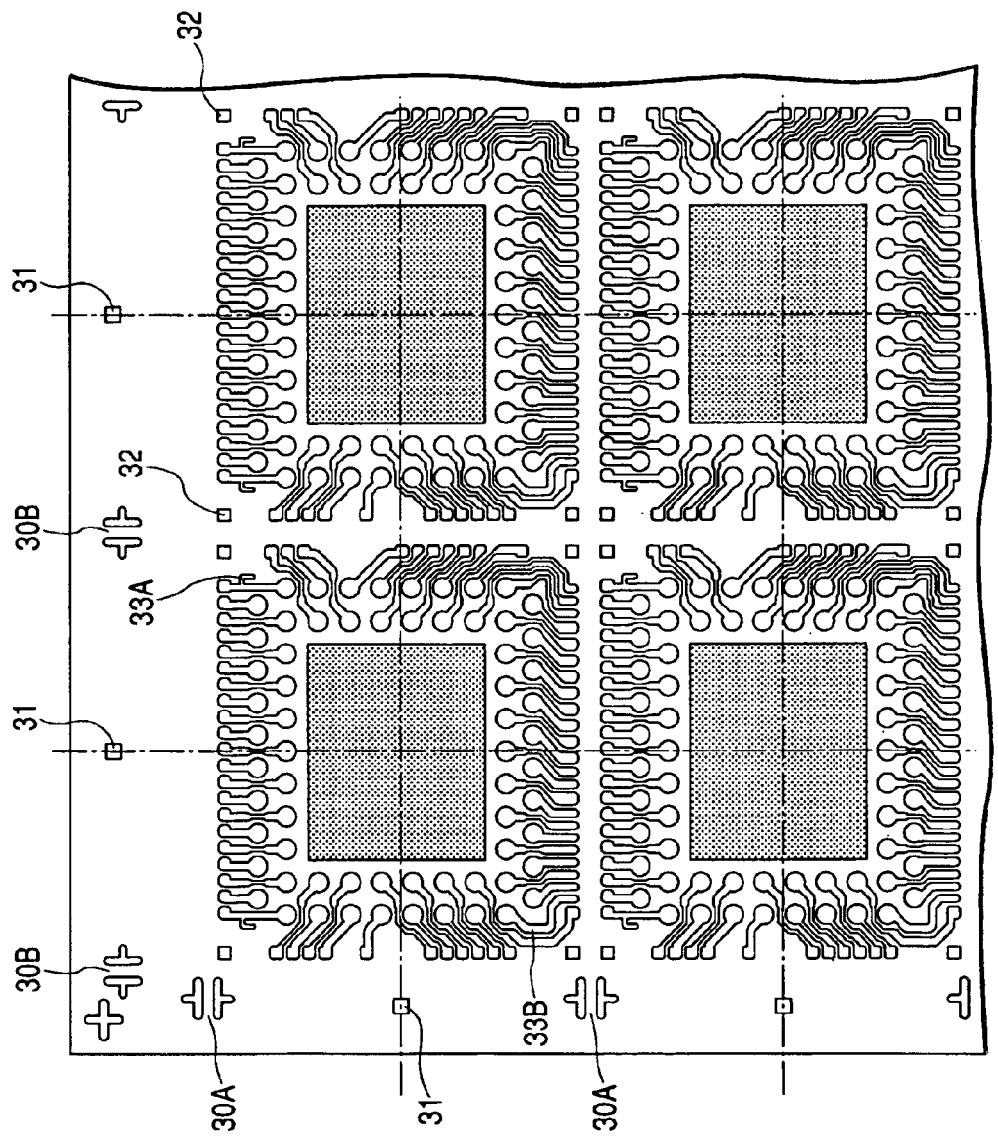
FIG. 7 shows a conductive pattern to be employed in the semiconductor device of the invention.

FIG. 7 shows a conductive pattern formed on the conductive foil 20. Here four units are formed vertically, and horizontally eight units are formed so as to have a shape like lead frame.

Symbols 30A and 30B are marks showing position of dicing line, and between two lines dicing blade is arranged so as to separate the semiconductor device individually. Symbols 31 and 32 are indexing marks. L shape lines shown with symbols 33A and 33B show corner portion of the chip. At the corner portion, the corner of the chip is arranged and fixed.

Next, effect generating by the above method for manufacturing is described.

First, as the conductive pattern is half-etched and supported in one body of the conductive foil, a board used for supporting past is removed.

Second, as the pad half-etched to make projection is formed on the conductive foil, it is possible to make the pad fine. Therefore it is possible to make width and gap of the pad narrow so as to form a small package in plan size.

Third, as the device consists of necessary minimum components: the conductive pattern, the semiconductor chip, the connection means, and sealing material, useless material is removed so as to realize thin semiconductor device extremely depressing cost.

Fourth, as the pads are formed becoming projection by half-etching and individually separated after sealing, tie bar and hanging lead are not need. Therefore forming and cutting tie bar (hanging lead) is not need at all in the invention.

Fifth, as the conductive foil is removed from the back face of the insulating resin after the conductive pattern becoming the projection is buried in the insulating resin and is separated, bur of resin generating between leads as the conventional lead framed is removed.

Sixth, as the semiconductor is fixed to the electrode for radiation through the insulating adhesive means and the electrode for radiation exposes from the back face thereof, heat generating from the semiconductor device is efficiently radiated from the back face thereof. By mixing the under-fill material with filler such as Si oxide film and aluminum oxide, radiation of the device is more improved. By unifying the filler size, it is possible that gap between the semiconductor chip 12 and the conductive pattern is kept uniform.

(Third Embodiment)

Figure 8A:
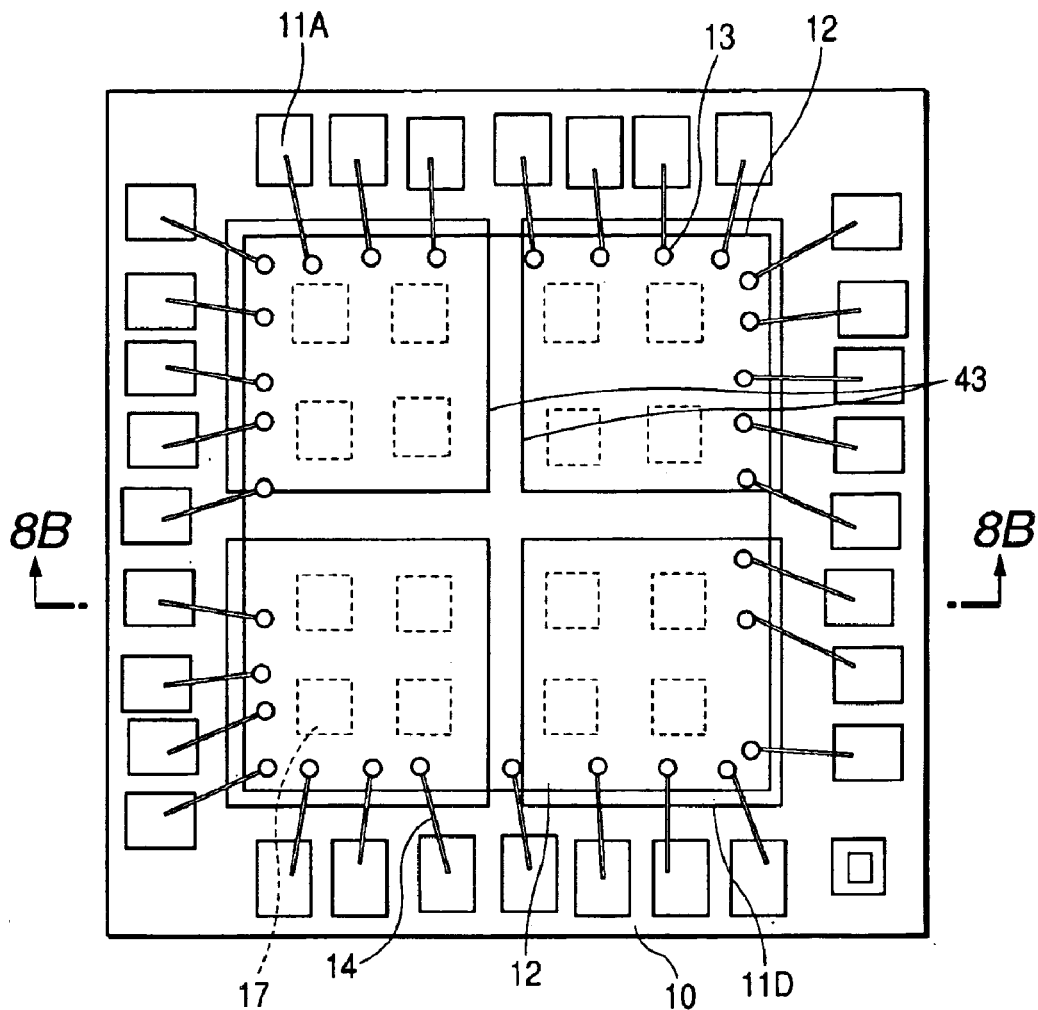
FIG. 8 shows a semiconductor device of the invention.
Figure 8B:
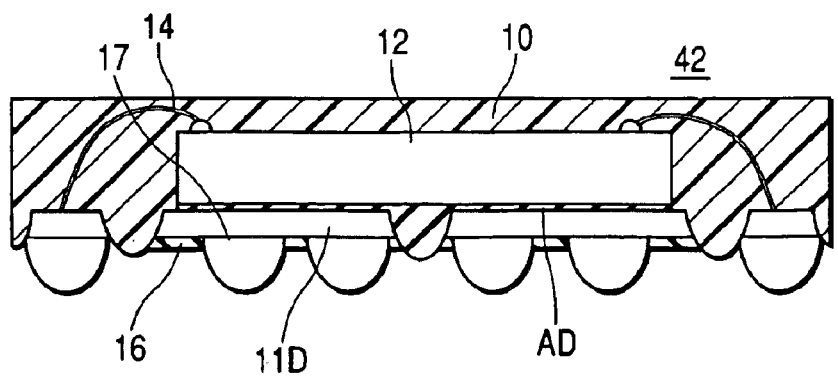
Figure 9A:
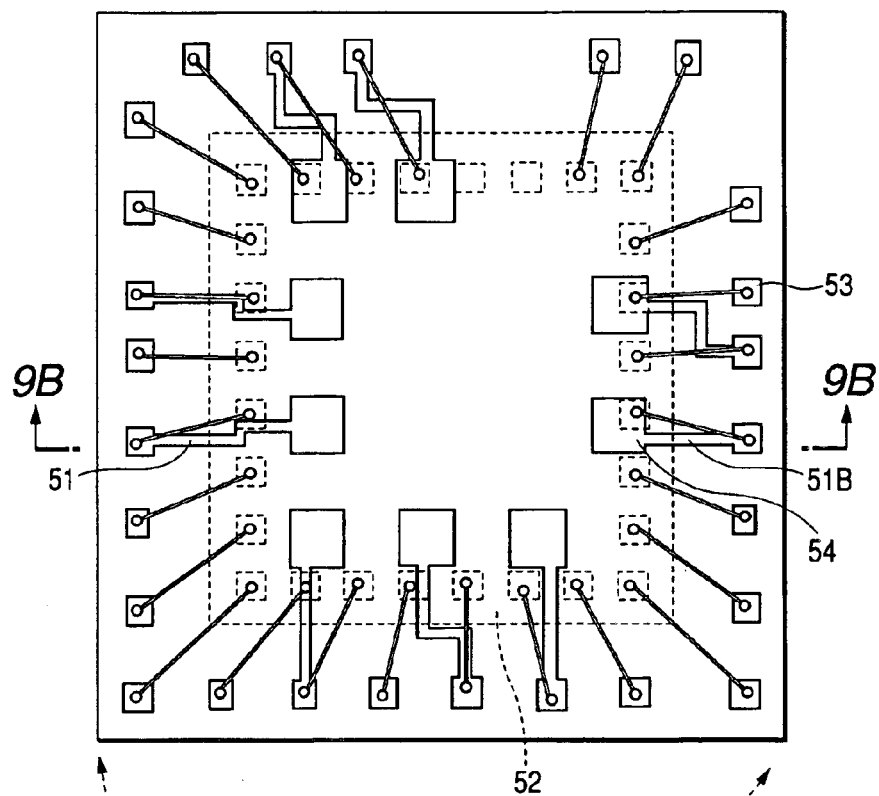
FIG. 9 shows a conventional semiconductor device.
Figure 9B:
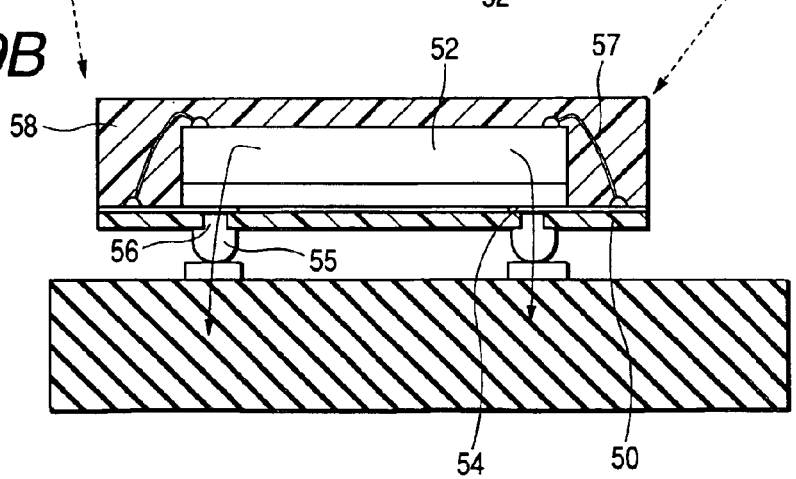

FIG. 8 shows the semiconductor device 42. FIG. 8A is a plan view of the device, and FIG. 8B is a section view cut by A—A line.

Although the pad 11A is formed in one body with the conductive path 11B and the external connection electrode 11C in FIG. 1, here the back face of the pad 11A becomes the external connection electrode.

As the back face of the pad 11A is formed in rectangle, the pattern exposing from the insulating film 16 is formed in same pattern as said rectangle. The trenches 43 are formed so that the electrode 11D for radiation and chip 12 can be adhered appropriately by filling the insulating adhesion means into said trenches. Thereby the electrode 11D for radiation is divided to plural.

As clear from the above description, in the invention, even the conductive foil (or conductive foil) where the conductive pattern formed in island shape has thickness is buried in the insulating adhesion means and the insulating resin. As the electrode for radiation positioning at the back face of the semiconductor chip, it is possible to improve radiation of the semiconductor chip. Further as the supporting board is not used, it is possible to realize a thin and light package.

The device consists of necessary minimum components of the conductive pattern, the semiconductor chip, and the insulating resin, and becomes a circuit device useless for resources. Therefore extra components do not exist till completion, and a semiconductor device decreasing cost thereof extremely.

(Fourth Embodiment)

The fourth embodiment of the circuit device of the invention is described with reference to FIG. 14.

The circuit device of the invention comprises multiple conductive patterns for element mounting thereon that is electrically separated from each other by a isolation trench, a thermosetting resin layer that fills the isolation trench to cover the surface of the conductive pattern, a circuit element fixed on the thermosetting resin layer, and an insulating resin that covers the circuit element to integrally support the conductive pattern bonded to the thermosetting resin layer.

Figure 14:
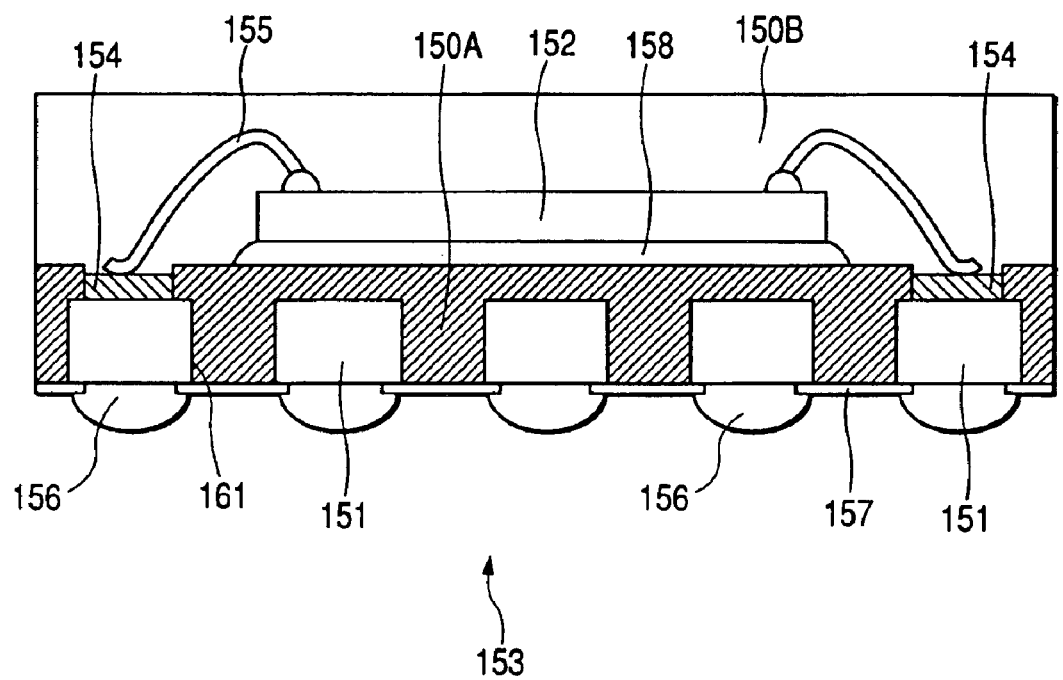
FIG. 14 shows a circuit device of the invention.

FIG. 14 shows a circuit device 153 having a conductive pattern 151 embedded in a thermosetting resin layer 150A, in which a circuit element 152 is fixed on the conductive pattern 151 and the conductive pattern 151 are supported by an insulating resin 150B bonded to the thermosetting resin layer 150A.

This structure comprises four elements, the circuit element 152, the multiple conductive patterns 151, the thermosetting resin layer 150A to envelop the conductive pattern 151, and the insulating resin 150B that bonds to the resin layer 150A. In this, the conductive patterns 151 are separated by a isolation trench 161 filled with the thermosetting resin layer 150A. The conductive pattern 151 is supported by the thermosetting resin layer 150A and the insulating resin 150B.

For the thermosetting resin layer 150A that characterizes the invention, a thermosetting resin such as epoxy resin is used. The resin fills the isolation trench 161 and covers the surface of the conductive pattern 151. To form the thermosetting resin layer 150A, a liquid material prepared by dissolving a thermosetting resin in an organic solvent is cast over the isolation trench 161 and the conductive pattern 151, semi-cured to evaporate away the organic solvent, and then finally cured. Preferably, a filler such as silica or alumina is added to the thermosetting resin layer 150A to reduce the thermal expansion difference between the layer 150A and the conductive pattern 151. In general, the thermal expansion coefficient of epoxy resin is 50 ppm/° C.; that of epoxy resin containing the filler is from 15 to 30 ppm/° C.; and that of copper to form the conductive pattern 151 is 18 ppm/° C. Therefore, the filler may remove the thermal expansion mismatch between epoxy resin and copper.

Since the thermosetting resin layer 150A is filled into the isolation trench 161 while it is a liquid of low viscosity, it may well adhere to the inner walls of the isolation trench 161, as compared with epoxy resin to be transfer-molded, and the adhesion strength between the two may be increased significantly.

Another method may be employed for forming the thermosetting resin layer 150A, which comprises pressing a semi-sheet-like film of thermosetting resin such as epoxy resin against the conductive pattern 151 followed by finally curing it thereon under heat to thereby cover the conductive pattern 151 and fill the isolation trench 161 with the resin.

For the insulating resin 150B, any of thermosetting resin such as epoxy resin, or thermoplastic resin such as polyphenylene sulfide can be used. Not limited to these, the insulating resin may be any and every resin that may be solidified in molds, or may be applied to semiconductor by dipping or coating. However, in consideration of its bonding strength to the thermosetting resin layer 150A, resin of the same type is preferred for the two. Therefore, in this, thermosetting resin such as epoxy resin is used for the insulating resin 150B.

For the conductive pattern 151, for example, any of conductive foil consisting essentially of Cu, conductive foil consisting essentially of Al, or conductive foil consisting essentially of Fe—Ni alloy or the like can be used. Needless to say, any other conductive material may also be used. Especially etchable conductive materials and conductive materials evaporable by laser are preferred.

For connecting the circuit element 152 to any other element, a bonding wire 155 is used in a face-up structure, or a conductive ball of solder, a flattenable conductive ball or other solder material is used in a face-down structure. The connecting means is selected depending on the type of the circuit element 152 and the mounting method thereof.

The conductive pattern 151 to which is fitted the bonding wire 155 or solder is selectively exposed out of the thermosetting resin layer 150A, and the exposed surface of the conductive pattern 151 is covered with a conductive film 154. For the conductive film 154, usable is any of Ag, Au, Pt or Pd. The back electrode 156 is formed on the conductive pattern 151 through low-vacuum or high-vacuum coating, plating or sintering that includes vapor deposition, sputtering, CVD and the like. The back electrode 156 is formed by selectively exposing out a predetermined region of the conductive pattern 151 with masking the other region thereof with a resist layer 157, followed by applying a conductive material such as solder to the exposed region, and the back electrodes are protruding electrodes.

In this circuit device, the conductive pattern 151 is supported by the thermosetting resin layer 150A and the insulating resin 150B, and therefore does not require a supporting board for it. This constitution characterizes the invention. As so described hereinabove with reference to the related art, the conductive paths in conventional circuit devices are supported by a supporting board or by a lead frame, and they require superfluous structures that are naturally unnecessary. However, the circuit device of the invention is composed of the least necessary constitutive elements, not requiring a supporting board, and it may be thinned and low-priced.

Another advantage of the circuit device of the invention is that the thermosetting resin layer 150A therein covers the circuit element 152 and fills the isolation trench 161 between the conductive patterns 151 for individual insulation.

In the circuit device, the thermosetting resin layer 150A and the insulating resin 150B integrally support the structure in such a manner that the insulating resin 150B covers the circuit element 152 and the thermosetting resin layer 150A fills the isolation trench 161 between the conductive pattern 151 with the back thereof only exposed outside.

The circuit element 152 is fixed onto the thermosetting resin layer 150A that covers the conductive pattern 151, via an insulating adhesive 158, and the circuit element 152 is therefore electrically insulated from the conductive pattern 151. As a result, the conductive pattern 151 to be formed below the circuit element 152 may be a fine pattern of any form, and the latitude in wiring with the pattern significantly increases. Each electrode pad of the circuit element 152 is connected to the conductive film 154 that is formed on a part of the conductive pattern 151 around it and serves as a bonding pad, via the bonding wire 155. Accordingly, the back electrode 156 may be formed on the conductive pattern 151 below the circuit element 152, and this realizes an equivalently two-layered wiring structure.

Exposing the back of the conductive path characterizes the invention. The back of the conductive path may be connected to external elements, therefore not requiring through-holes TH as in the conventional structure in FIG. 12.

Moreover, since the circuit element 152 is disposed on the thin thermosetting resin layer 150A and fixed thereto via the insulating adhesive 158, the heat generated by the circuit element 152 may be transferred to the substrate via the thermosetting resin layer 150A and via the conductive pattern 151. In particular, the structure is effective for semiconductor chips that require heat radiation when the driving current increases.

In this circuit device, the surface of the isolation trench 161 is substantially on the same level as the surface of the conductive pattern 151. This structure characterizes the invention. This does not have a difference in level for the back electrodes 510 and 511 as in FIG. 12. Therefore, the circuit device 153 is characterized in that it accepts horizontal movement.

In another embodiment, a UV-curable resin may be used in place of the thermosetting resin layer 150A. Concretely, a UV-curable resin is applied onto the structure, using a vacuum laminator, and then cured through exposure to UV rays and development to thereby form a cured UV resin film that covers the desired surface of the isolation trench 161 and the conductive pattern 151. UV-curable resin is a type of epoxy resin, and is therefore effective like the thermosetting resin layer 150A.

One embodiment of manufacturing the circuit device of the invention is described with reference to FIG. 15.

The method of the invention comprises a step of preparing conductive foil and forming a isolation trench that does not exceed the thickness of the conductive foil in a region of the conductive foil at least except the region to be a conductive pattern that has a number of parts to carry circuit elements mounted thereon, thereby to form the conductive pattern in multiple blocks; a step of coating the isolation trench and the conductive pattern with a thermosetting resin; a step of exposing a predetermined surface of the conductive pattern through laser etching; a step of forming a conductive film selectively on the exposed conductive pattern; a step of fixing circuit elements on the thermosetting resin layer; a step of forming a connecting means for electrically connecting the electrode of each circuit element to a desired part of the conductive pattern; a step of common-molding it with an insulating resin to collectively cover the circuit element on every element-mounting part and to fill the isolation trench; a step of removing the conductive foil in the thickness part with no isolation trench formed therein; a step of sticking the multiple blocks to an adhesive sheet via the insulating resin of each block; a step of measuring the characteristics of the circuit element on each element-mounting part of each block attached to the adhesive sheet; and a step of dicing the insulating resin into the individual element-mounting parts of each block attached to the adhesive sheet.

Figure 15:
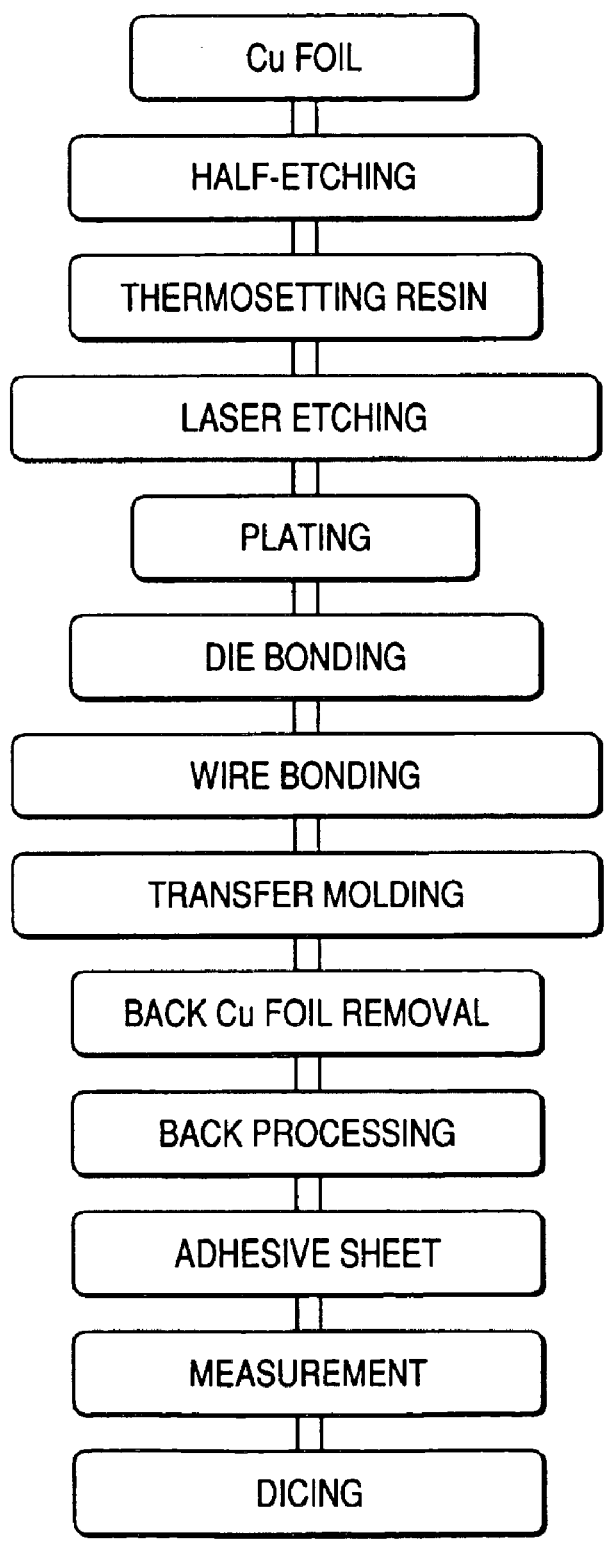
FIG. 15 is a view for showing a method for manufacturing the circuit device of the invention.

The flowchart of FIG. 15 does not correspond to the method as above. In this, the two flows of Cu foil and half-etching are to form a conductive pattern. In the next flow of thermosetting resin, the surface of the isolation trench and the conductive pattern is covered with a thermosetting resin. In the two flows of die bonding and wire bonding, a circuit element is fixed onto each element-mounting part, and its electrodes are connected to the conductive pattern. In the flow of transfer molding, an insulating resin is applied to the structure by common molding. In the flow of removing the back Cu foil, the conductive foil in the thickness part with no isolation trench formed therein is etched away. In the flow of back processing, the electrodes of the conductive pattern exposed to the back are processed. In the flow of adhesive sheet, multiple blocks are attached to an adhesive sheet. In the flow of measurement, the circuit elements built in the structure are checked and graded. In the flow of dicing, the insulating resin is diced into individual circuit devices.

Next described are the steps of the invention with reference to FIG. 14 and FIGS. 16 to 26.

Figure 16A:
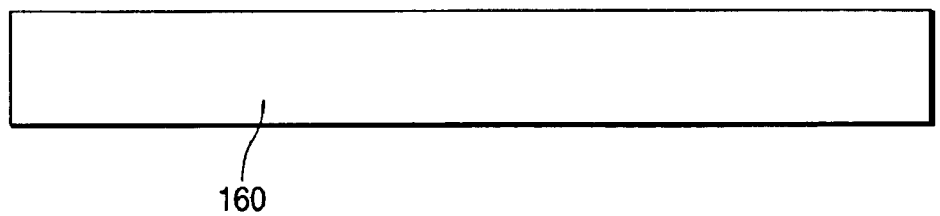
FIG. 16 is a view for showing a method for manufacturing the circuit device of the invention.
Figure 16B:
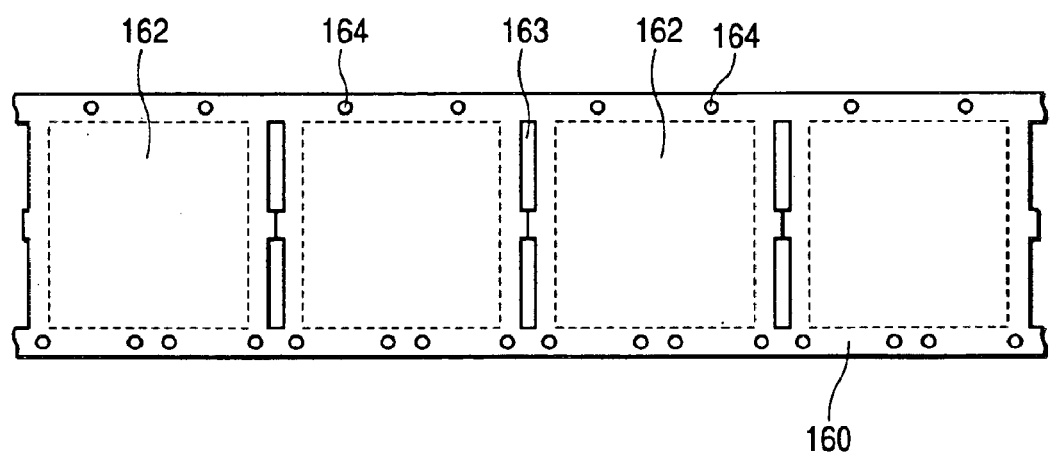
Figure 17:
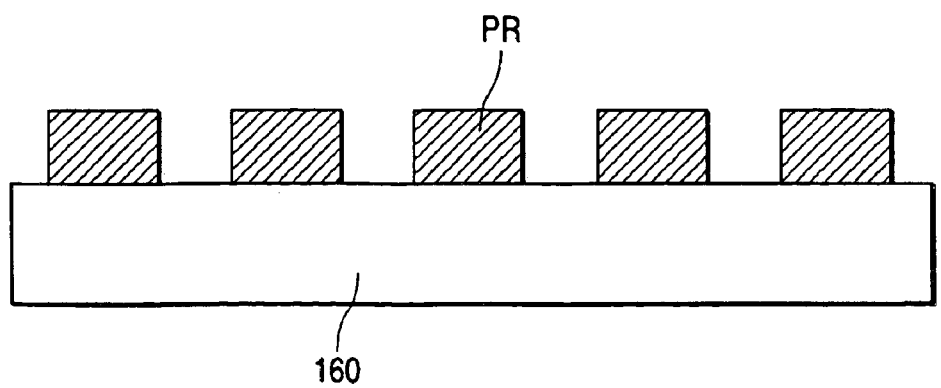
FIG. 17 is a view for showing a method for manufacturing the circuit device of the invention.

As in FIG. 16 to FIG. 18, the first step comprises preparing conductive foil 160, and forming a isolation trench 161 that does not exceed the thickness of the conductive foil 160 in a region of the conductive foil 160 at least except the region to be a conductive pattern 151 that has a number of parts to carry circuit elements 152 mounted thereon, thereby to form the conductive pattern 151 in multiple blocks.

In this step, a sheet of conductive foil 160 is prepared, as in FIG. 16A. The material for the conductive foil 160 is selected in consideration of solder adhesiveness thereto and the bondability and the platability thereof. For example, conductive foil of essentially Cu, conductive foil of essentially Al, or conductive foil of essentially Fe—Ni alloy or the like can be used.

The thickness of the conductive foil is preferably from 10 μm to 300 μm or so in view of the easiness in etching it. In this, a copper foil having a thickness of 125 μm is used. Basically, however, the conductive foil may be thicker than 300 μm or thinner than 10 μm. As will be mentioned hereinunder, the thickness of the conductive foil 160 may be such that it accepts the formation of a shallow isolation trench 161 therein.

The sheet-like conductive foil sheet 160 may be prepared in the form of a roll having a predetermined width, for example, 45 mm, and this may be fed to each step. Alternatively, strips of conductive foil 160 cut to have a predetermined size may be prepared and these may be fed to each step.

Concretely, four or five blocks 162 are formed on a conductive foil strip 160, spaced from each other as in FIG. 16B. Each block shall have a large number of element-mounting parts to be formed therein. A slit 163 is formed between the neighboring blocks 162, and this acts to absorb the stress of the conductive foil 160 in thermal treatment in the molding step, etc. Index holes 164 are formed at predetermined intervals in the upper and lower peripheries of the conductive foil 160, and these are for determining location in every step.

Next, a conductive pattern 151 is formed in every block.

As in FIG. 17, a photoresist (etching-resistant mask) PR is formed on the Cu foil 160, and this is patterned to partly expose the conductive foil 160 except the region to be a conductive pattern 151. Next, as in FIG. 18A, the conductive foil 160 is selectively etched via the photoresist PR.

The depth of the isolation trench 161 formed by the etching is, for example, from 20 to 30 μm, and the side wall thereof is roughened through oxidation or chemical polishing so as to increase its adhesiveness to the thermosetting resin layer 150A.

The side wall of the isolation trench 161 is schematically drawn to be straight in the figures, but may have any other structure depending on the method of removing the photoresist for forming it. The method of photoresist removal includes wet etching, dry etching, laser evaporation and dicing. In wet etching, the etchant to be employed is essentially ferric chloride or cupric chloride, and the conductive foil is dipped in or showered with the etchant. In wet etching, in general, the conductive foil is etched non-anisotropically, and its etched side wall is therefore curved.

In dry etching, the conductive foil may be etched anisotropically or non-anisotropically. At present, it is said that Cu could not be removed through reactive ion etching, but it may be removed through sputtering. Depending on the condition of sputtering, Cu may be etched anisotropically or non-anisotropically.

In laser evaporation, a laser ray may be directly applied to the conductive foil to form the isolation trench 161. In this case, the side wall of the isolation trench 161 formed may be straight.

Figure 18A:
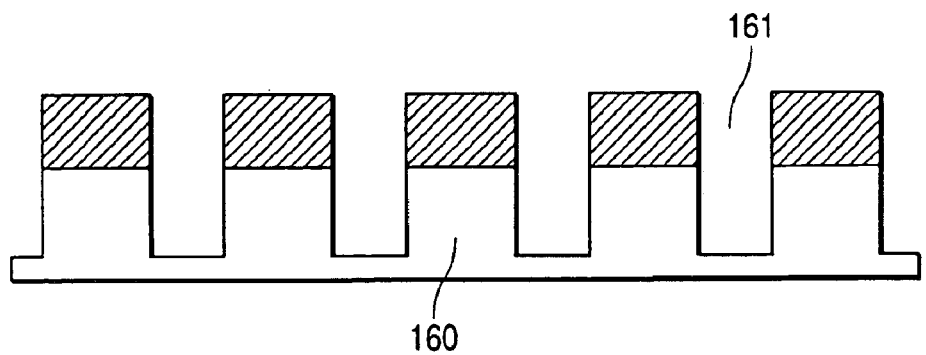
FIG. 18 is a view for showing a method for manufacturing the circuit device of the invention.
Figure 18B:
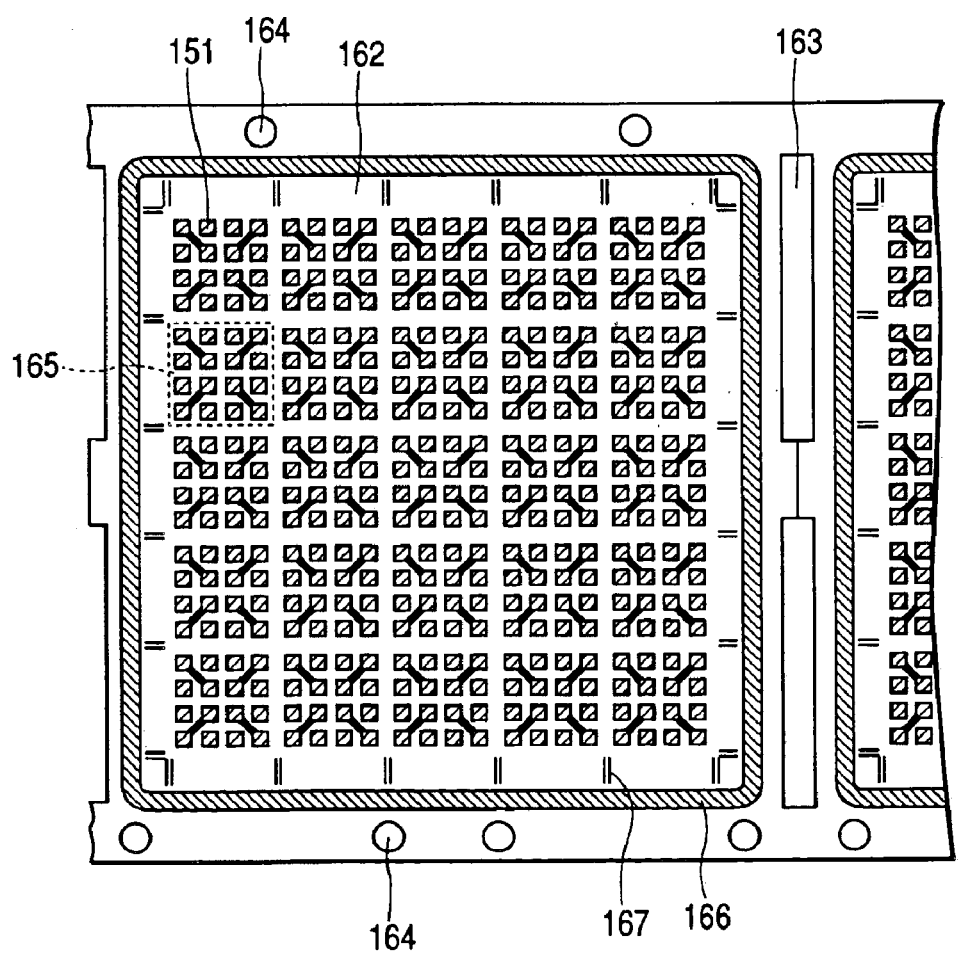

FIG. 18B is a schematic view of the conductive pattern 151. This corresponds to an enlargement of one block 162 shown in FIG. 16B. One black section corresponds to one element-mounting part 165, and the black sections constitute the conductive pattern 151. One block 162 has a large number of element-mounting parts 165 that are aligned in a matrix of 5 lines and 10 rows, and the same conductive pattern 151 is formed for every element-mounting part 165. A frame pattern 166 is formed around every block, and registration marks 167 for dicing are provided inside it, spaced in some degree from it. The frame pattern 166 is for engagement of the patterned conductive foil with a mold, and after back etching of the conductive foil 160, it reinforces the insulating resin 150B.

Figure 19:
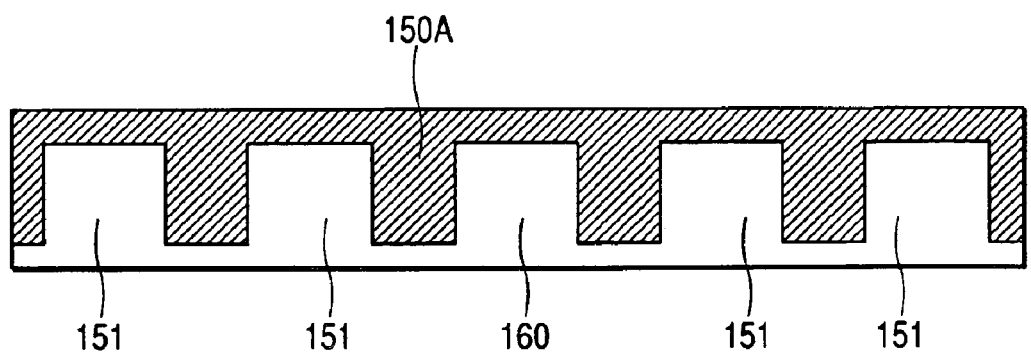
FIG. 19 is a view for showing a method for manufacturing the circuit device of the invention.

The second step of the invention is to form the thermosetting resin layer 150A that covers the isolation trench 161 and the surface of the conductive pattern 151, as in FIG. 19.

This step characterizes the invention, in which a thermosetting resin such as epoxy resin is used for the thermosetting resin layer 150A, and this fills the isolation trench 161 and covers the surface of the conductive pattern 151. For forming the thermosetting resin layer 150A, a liquid material prepared by dissolving a thermosetting resin in an organic solvent is cast over the isolation trench 161 and the conductive pattern 151, heated at 80° C. to 100° C. to semi-cure it with evaporating away the organic solvent, and then further heated at 150° C. to 170° C. for about 1.5 hours to finally cure it. Accordingly, the semi-cured thermosetting resin is in B-stage, and it is not as yet finally set.

Preferably, a filler such as silica or alumina is added to the thermosetting resin layer 150A to reduce the thermal expansion difference between the layer 150A and the conductive pattern 151. In general, the thermal expansion coefficient of epoxy resin is 50 ppm/° C.; that of epoxy resin containing the filler is from 15 to 30 ppm/° C.; and that of copper to form the conductive pattern 151 is 18 ppm/° C. Therefore, the filler may remove the thermal expansion mismatch between epoxy resin and copper.

Since the thermosetting resin for the layer 150A is filled into the isolation trench 161 while it is a liquid of low viscosity, it may well adhere to the inner walls of the isolation trench 161, as compared with epoxy resin to be transfer-molded, and the adhesion strength between the two may be increased significantly. The depth of the isolation trench 161 is about 60 μm for ensuring the necessary adhesion strength in the related art. However, since the adhesion strength in this embodiment is increased, the depth of the isolation trench 161 may be a half of it in the related art as above, concretely from 20 to 30 μm, and this produces an advantage in that the conductive pattern 151 may be a finer pattern.

Another method may be employed for forming the thermosetting resin layer 150A, which comprises pressing a semi-cured film sheet of thermosetting resin such as epoxy resin against the conductive pattern 151 followed by finally curing it thereon under heat to thereby cover the conductive pattern 151 and fill the isolation trench 161 with the resin. The surface of the thermosetting resin film is covered with a cushion sheet, and pressed under 100 kg/cm$^2$ under heat at 150° C. to 170° C., and the resin is finally cured while its melt covers the isolation trench 161 and the surface of the conductive pattern 151.

In this step, it is desirable to roughen the inner wall of the isolation trench 161 for further enhancing the adhesion strength between the isolation trench 161 and the thermosetting resin layer 150A. For it, for example, the inner wall of the isolation trench 161 is oxidized or chemically polished with an organic acid etchant. For the organic acid etchant, for example, usable is Mec's CZ-8100 can be used. The patterned conductive foil is dipped in the etchant for a few minutes to roughen the surface thereof to a degree of from 1 to 2 μm or so. Through the treatment, the inner wall of the isolation trench 161 is roughened, and the adhesion strength between the isolation trench 161 and the thermosetting resin layer 150A is thereby increased.

In another embodiment of this step, a UV-curable resin may be used in place of the thermosetting resin for the layer 150A. Concretely, a UV-curable resin is applied onto the patterned conductive foil, using a vacuum laminator, and then cured through exposure to UV rays and development to thereby form a cured UV resin layer that covers the desired surface of the isolation trench 161 and the conductive pattern 151. This embodiment simplifies the process since it covers the next third step.

Figure 20:
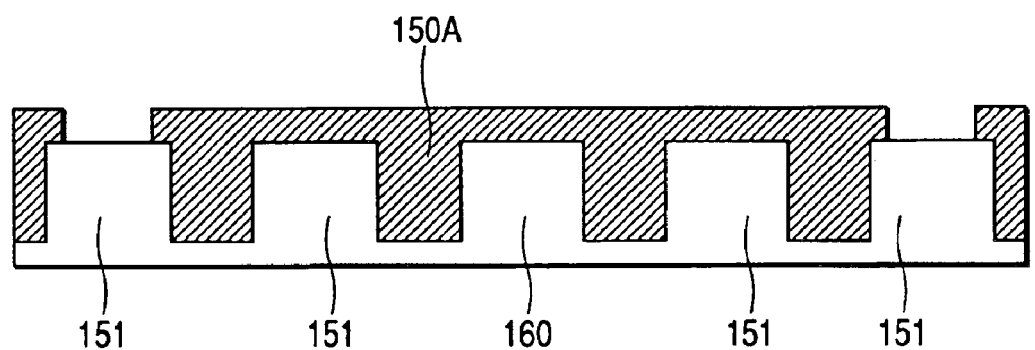
FIG. 20 is a view for showing a method for manufacturing the circuit device of the invention.

The third step of the invention comprises exposing the surface of a predetermined area of the conductive pattern 151 by removing the thermosetting resin layer 150A thereon through laser etching, as in FIG. 20.

In this step, the thermosetting resin layer 150A is partly selectively removed through laser etching for direct patterning to thereby partly expose the conductive pattern 151. For the laser, carbon dioxide laser is preferred, but excimer laser and YAG laser may also be used. When the resin still remains on the bottom of the opening after its removal through laser evaporation, it is removed, for example, through wet etching with sodium permanganate or ammonium persulfate or through dry etching with excimer laser.

Figure 21:
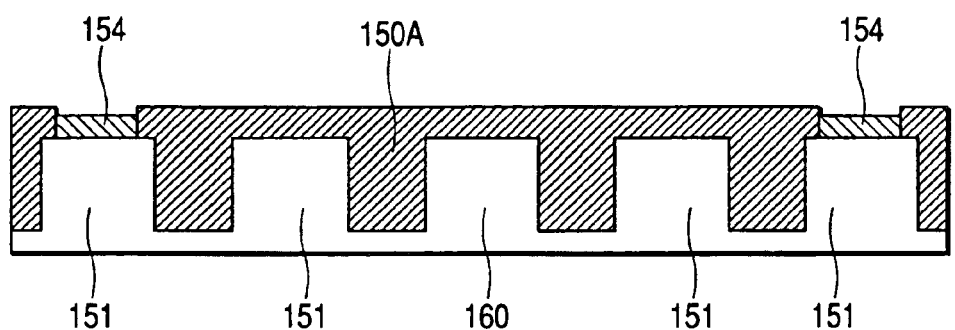
FIG. 21 is a view for showing a method for manufacturing the circuit device of the invention.

The fourth step of the invention comprises forming a conductive film 154 on the exposed conductive pattern 151, as in FIG. 21.

The remaining thermosetting resin layer 150A serves as a mask, and the exposed conductive pattern 151 is plated with any of gold, silver or palladium by electrolytic plating or electroless plating to have the conductive film 154 formed thereon. The conductive film 154 serves as a bonding pad.

For example, a silver film adheres to gold wires and to solder. In addition, fine Au wires may adhere to such a conductive film of silver. Therefore, the conductive film 154 accepts wire bonding, and its one advantage is that the film may serve directly as a bonding pad.

Figure 22:
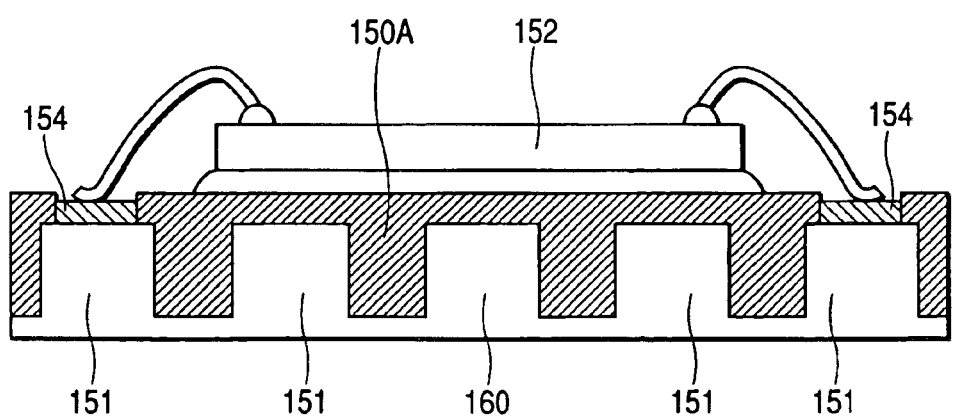
FIG. 22 is a view for showing a method for manufacturing the circuit device of the invention.

The fifth step of the invention comprises fixing a circuit element 152 on the thermosetting resin layer 150 in the element-mounting part 165 thereof with an insulating adhesive 158, and forming a connecting means for electrically connecting the electrode of the circuit element 152 in the element-mounting part 165 to a desired part of the conductive pattern 151, as in FIG. 22.

The circuit element 152 includes semiconductor elements such as transistors, diodes, IC chips. Though thick, face-down semiconductor elements such as CSP or BGA may also be mounted on the structure. Multiple IC chips may be piled up or may be arrayed in plane to constitute the circuit element 152.

In the illustrated embodiment, a bare IC chip 152 is fixed onto the thermosetting resin layer 150A with an insulating adhesive 158 such as epoxy resin, and the electrodes of the IC chip 152 are connected to the corresponding conductive films 154 formed on the conductive pattern 151 around the element-mounting part 165, via a bonding wire 155 bonded to the two by thermal ball bonding or ultrasonic wedge bonding.

A large number of conductive patterns 151 are integrated in every block 162. Therefore, the advantage of this step is that the circuit elements 152 may be efficiently mounted on the conductive patterns through physical fixation and wire bonding.

The sixth step of the invention comprises common-molding the circuit elements 152 on the element-mounting parts 163 with an insulating resin 150B that collectively covers the elements and bonds to the thermosetting resin layer 150A filled in the isolation trench 161, as in FIG. 23.

Figure 23A:
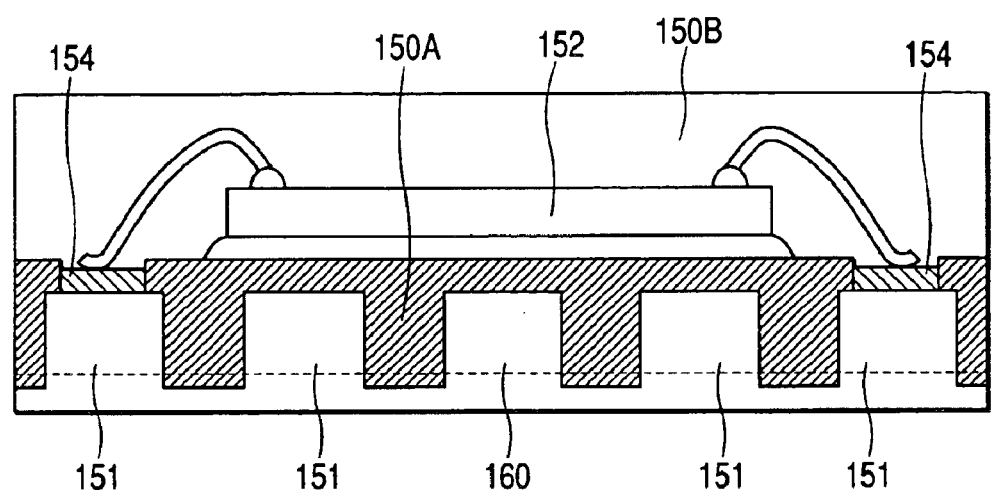
FIG. 23 is a view for showing a method for manufacturing the circuit device of the invention.

The isolation trench 161 and the conductive pattern 151 are covered with the thermosetting resin layer 150A in the previous step, and the insulating resin 150B covers the circuit element 152 and bonds to the thermosetting resin layer 150A remaining in the isolation trench 161 and on the surface of the conductive pattern 151, as in FIG. 23A. In particular, when thermosetting resin of the same type such as epoxy resin is used for both the thermosetting resin layer 150A and the insulating resin 150B, the two have an affinity for each other and therefore produce a higher adhesion strength between them. For further enhancing the adhesion strength, it is desirable that the surface of the thermosetting resin layer 150A is subjected to UV irradiation or plasma irradiation to activate the polar group of the resin in the surface of the layer 150A prior to the molding treatment with the insulating resin 150B. As a result, the thermosetting resin layer 150A is integrated with the insulating resin 150B to more firmly support the conductive pattern 151.

The treatment of this step may be realized by transfer molding, injection molding or dipping. Regarding the type of the resin material, thermosetting resin such as epoxy resin may be transfer-molded; and thermoplastic resin such as polyimide resin or polyphenylene sulfide may be injection-molded.

Figure 23B:
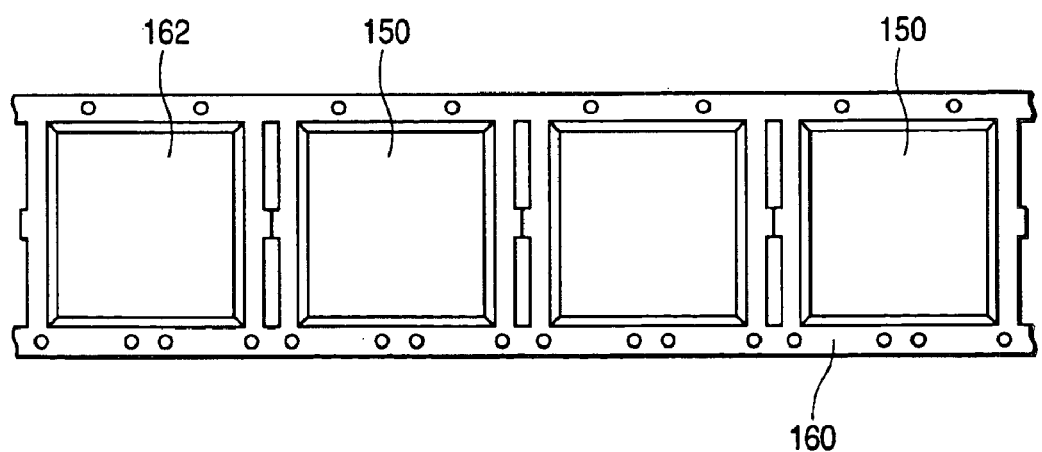

In this step of transfer molding or injection molding, the element-mounting parts 163 in one block 162 are all put in one common mold, and they are common-molded with one insulating resin 150, as in FIG. 23B. In this step, therefore, the amount of the resin to be used may be reduced significantly, as compared with that in conventional transfer molding, and common molds may be used.

The thickness of the insulating resin 150B that covers the surface of the conductive foil 160 is so controlled that it is about 100 μm or so from the top of the circuit element 152. This thickness may be increased or decreased in consideration of the mechanical strength of the resin layer.

Figure 11:
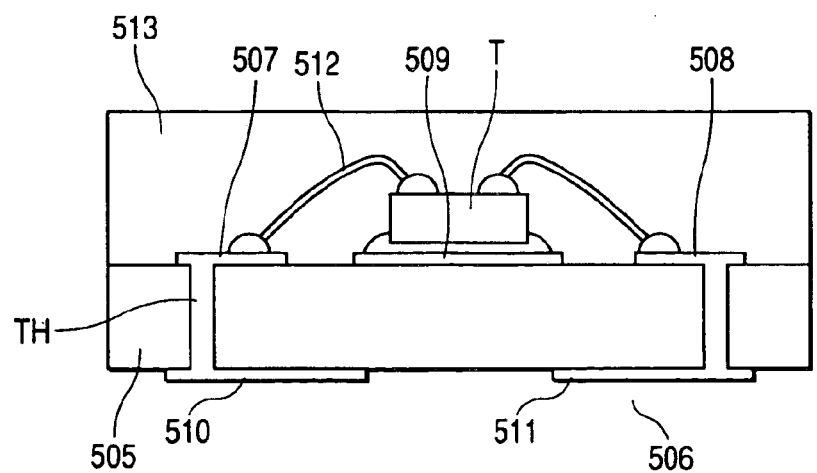
FIG. 11 shows a conventional circuit device.
Figure 12A:
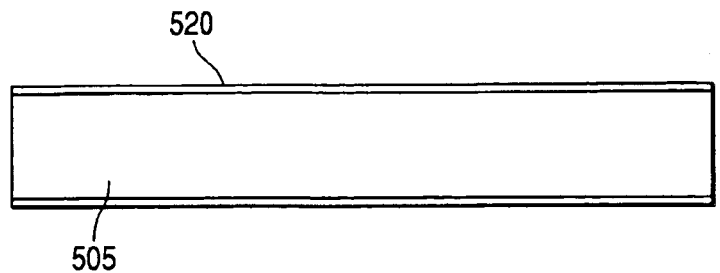
FIG. 12 shows a method for manufacturing the conventional circuit device.
Figure 12B:
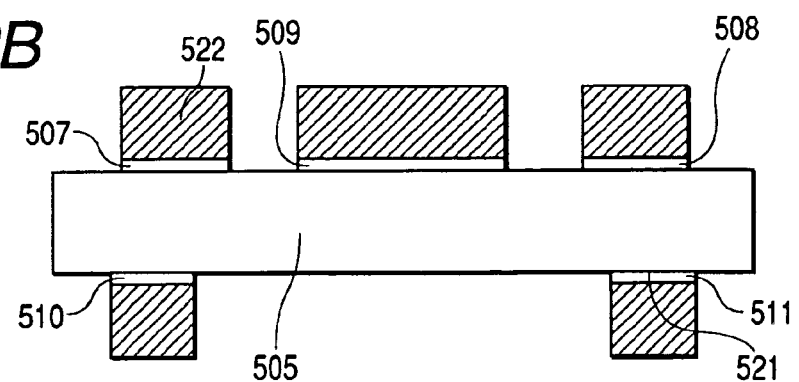
Figure 12C:
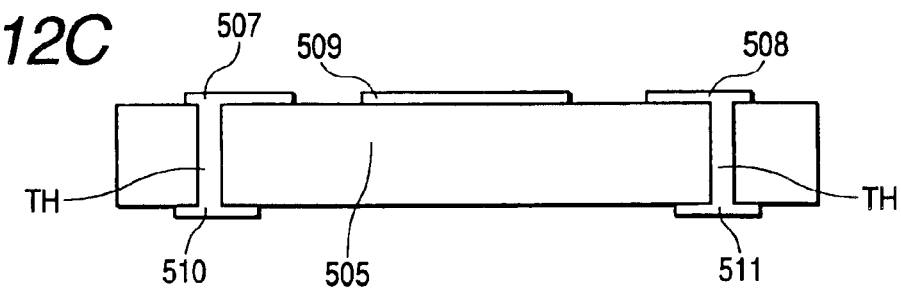
Figure 12D:
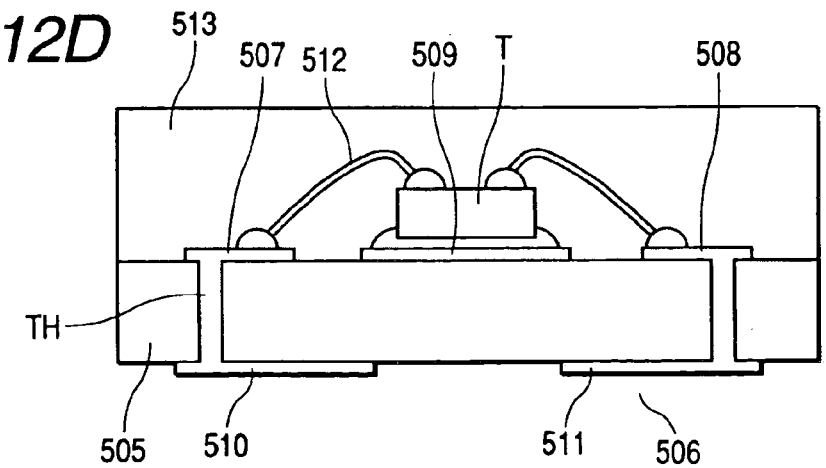
Figure 13:
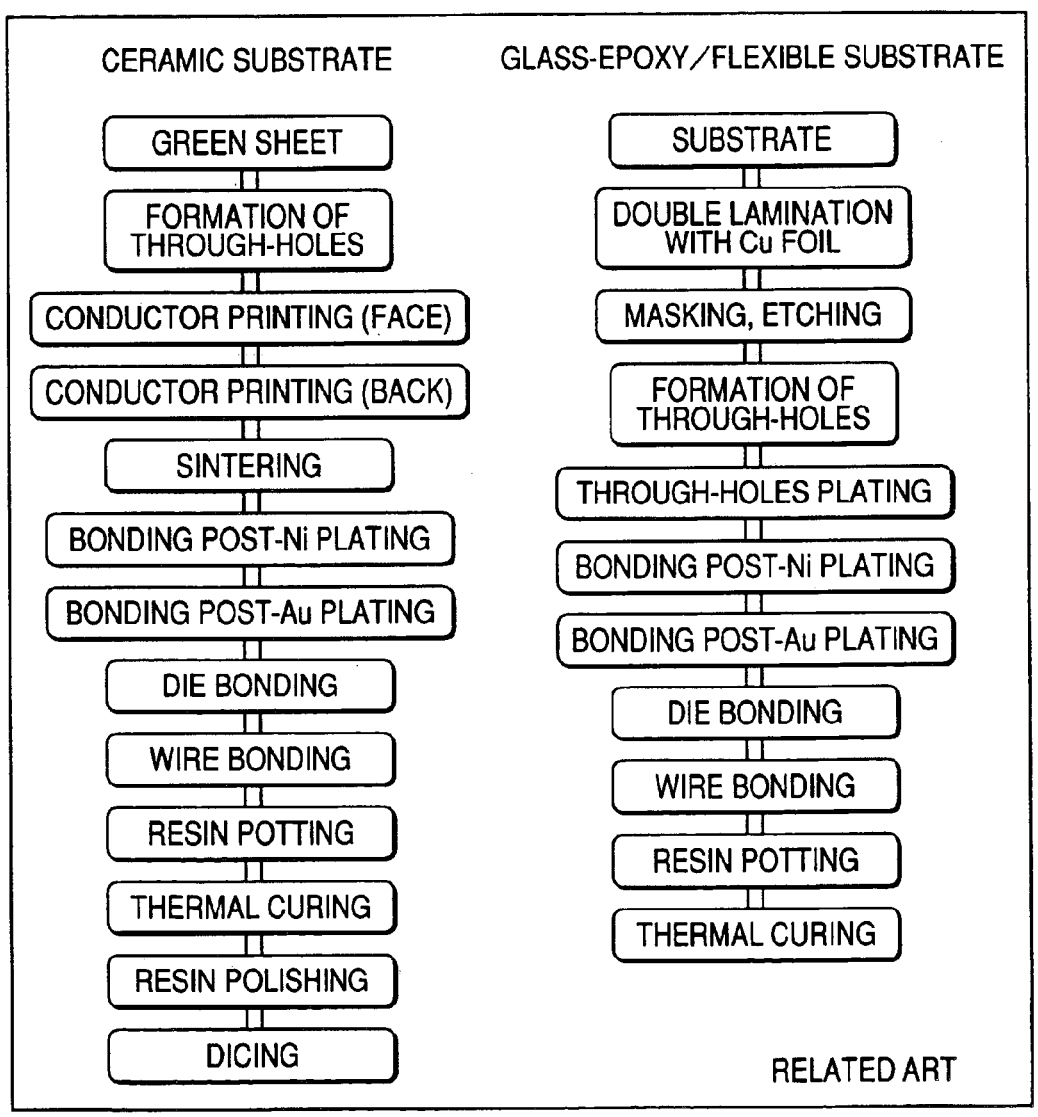
FIG. 13 shows flowcharts of conventional methods of manufacturing circuit devices.

This step is characterized in that the conductive foil 160 to form the conductive pattern 151 serves as a supporting board before it is coated with the insulating resin 150B. In the related art technology, the conductive paths 507 to 511 are formed by the use of the supporting board 505 that is naturally unnecessary, as in FIG. 11. In the invention, however, the conductive foil 160 that serves as the supporting board is a material necessary for electrodes. Accordingly, the invention is advantageous in that the necessary constitutive materials may be reduced to the minimum and the production costs are therefore reduced.

Since the depth of the isolation trench 161 does not exceed the thickness of the conductive foil sheet 160, the conductive pattern 151 of the conductive foil 160 is not individually separated. Accordingly, the sheet-like conductive foil 160 can be handled as one sheet as a whole, and when it is molded with the insulating resin 150B, it may be readily transferred and put into a mold.

The seventh step of the invention comprises removing the conductive foil 160 in the thickness part not having the isolation trench 161 formed therein, as in FIG. 23A.

In this step, the back of the conductive foil 160 is chemically and/or physically removed to individually separate the conductive pattern 151. This may be carried out, for example, through polishing, cutting, etching or metal evaporation with laser.

In one example of this process, the entire back of the conductive foil 160 is cut with a polishing machine or a cutting machine to a depth of about 100 μm or so, whereby the thermosetting resin layer 150A is exposed out of the isolation trench 161. The face to be exposed out through the treatment is represented by the dotted line in FIG. 23A. As a result, the conductive pattern 151 is individually separated to have a thickness of about 30 μm. Apart from it, the entire back of the conductive foil 160 may be wet-etched before the thermosetting resin layer 150A is exposed out, and then it may be cut with a polishing or cutting machine so that the thermosetting resin layer 150A is exposed out. In still another embodiment, the entire back of the conductive foil 160 may be wet-etched to the depth of the dotted line whereby the thermosetting resin layer 150A may also be exposed out.

In the structure thus processed, the back of the conductive pattern 151 is exposed out of the thermosetting resin layer 150A. Specifically, the face of the thermosetting resin layer 150A filled in the isolation trench 161 is substantially on the same level as that of the conductive pattern 151. Accordingly, the circuit device 153 of the invention does not have a difference in level for the back electrodes 510 and 511 as in FIG. 12 that indicates a related art technology, and this is characterized in that, when other elements are mounted thereon, it accepts horizontal movement for self-alignment based on the surface tension of solder or the like.

Further, the back of the conductive pattern 151 is processed to obtain the final structure as in FIG. 14. Concretely, a part of the conductive pattern 151 to form electrodes is selectively exposed out while the other part thereof is coated with a resist layer 157, and a conductive material such as solder is applied to it to form back electrodes 156, thereby completing a final circuit device.

Figure 24:
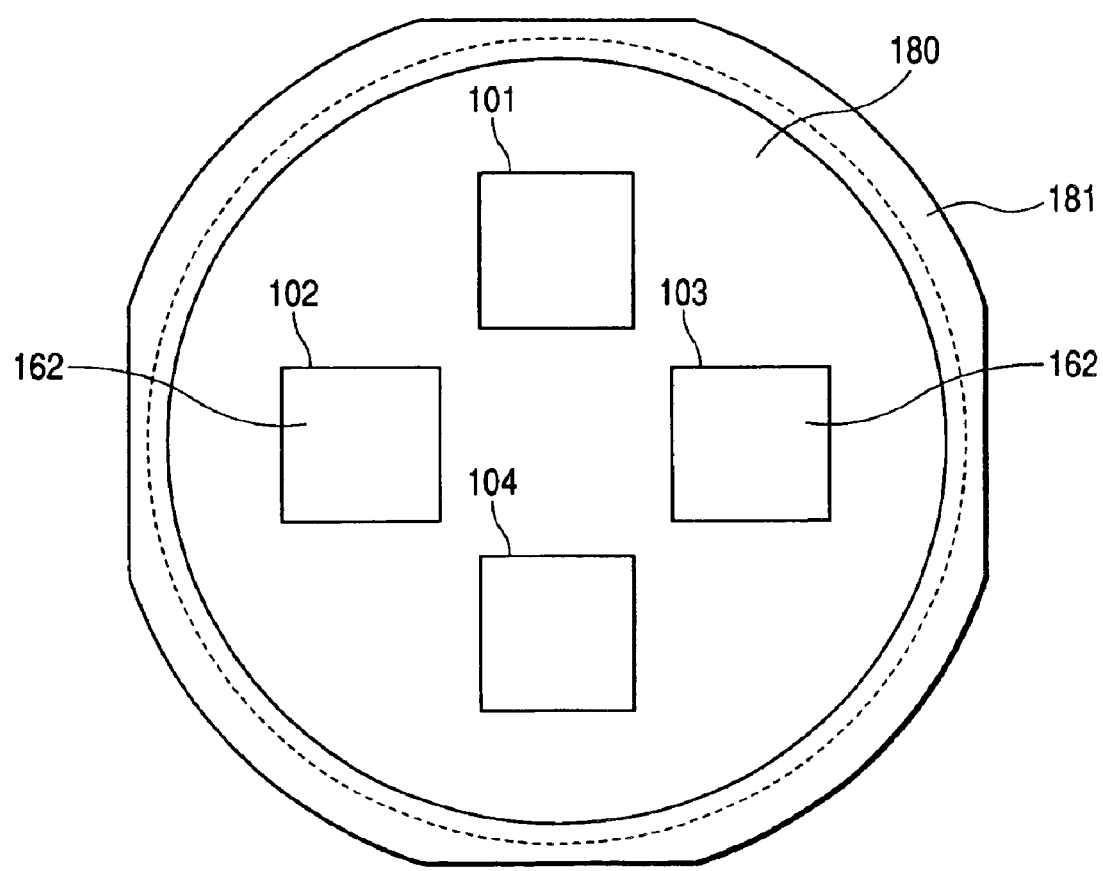
FIG. 24 is a view for showing a method for manufacturing the circuit device of the invention.

The eighth step of the invention comprises sticking the multiple blocks 162 to an adhesive sheet 180 via the insulating resin 150B of each block, as in FIG. 24.

In the previous step, the back of the conductive foil 160 is etched and then it is divided into individual blocks 162. Since the blocks are connected to each other via the thermosetting resin layer 150A and the insulating resin 150B and via the remaining part of the conductive foil 160, they may be individually separated from each other by mechanically peeling them from the remaining part of the conductive foil 160, not using a dicing mold.

In this step, the periphery of an adhesive sheet 180 is stuck to a stainless metal ring frame 181, and four blocks 162 are stuck to the center part of the adhesive sheet 180 via the insulating resin 150B of each block in such as manner that they are spaced from each other so as not to interfere with the blades for dicing. For the adhesive sheet 180, a UV sheet (by Lintec) may be used. In place of it, however, any other dicing sheet may be used since the insulating resin 150B ensures good mechanical strength of each block 162.

Figure 25:
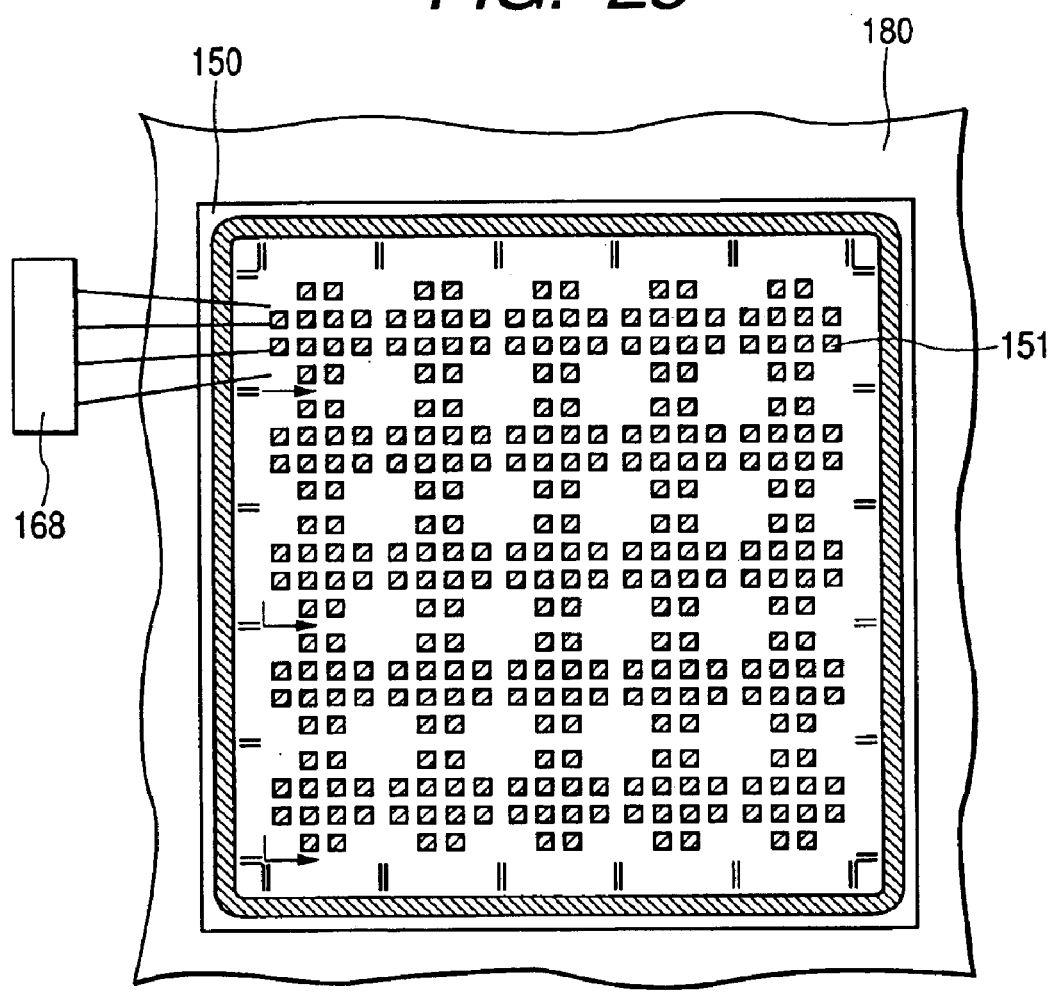
FIG. 25 is a view for showing a method for manufacturing the circuit device of the invention.

The ninth step of the invention comprises measuring the characteristics of the circuit element 152 on each element-mounting part 165 of each block 162 attached to the adhesive sheet 180, as in FIG. 25. As so mentioned hereinabove, the circuit elements in every block are molded all at a time with the thermosetting resin layer 150A and the insulating resin 150B.

On the back of each block 162, the back electrodes 156 are exposed out, and the element-mounting parts 165 are aligned in matrix quite similarly to the initial conductive pattern 151, as in FIG. 14. A probe is applied to the back electrode 156 exposed out of the insulating resin 150B that covers the conductive pattern 151, and the characteristic parameters of the circuit element 152 on every element-mounting part 165 are individually measured for checking the quality of each device. The inferior devices are marked with a magnetic ink or the like.

In this step, the circuit devices 153 on the element-mounting parts 165 are integrally supported by the insulating resin 150B as a whole in every block 162, and are not individually separated from each other. Accordingly, the multiple blocks 162 attached to the adhesive sheet 180 may be vacuum-sucked to the stand of a tester, and each block 162 is moved in the machine direction and in the cross direction, like the arrow, by the size of the element-mounting part 165 at a predetermined pitch, whereby the circuit devices 153 on the element-mounting parts in an extremely large number of blocks 162 may be checked all at a time. This process does not require the discrimination of the back and the face of each circuit device and the recognition of the electrode position that are needed in the related art technology. In addition, the process enables simultaneous treatment of a large number of multiple blocks 162 all at a time, and therefore the test time for it may be significantly shortened.

Figure 26:
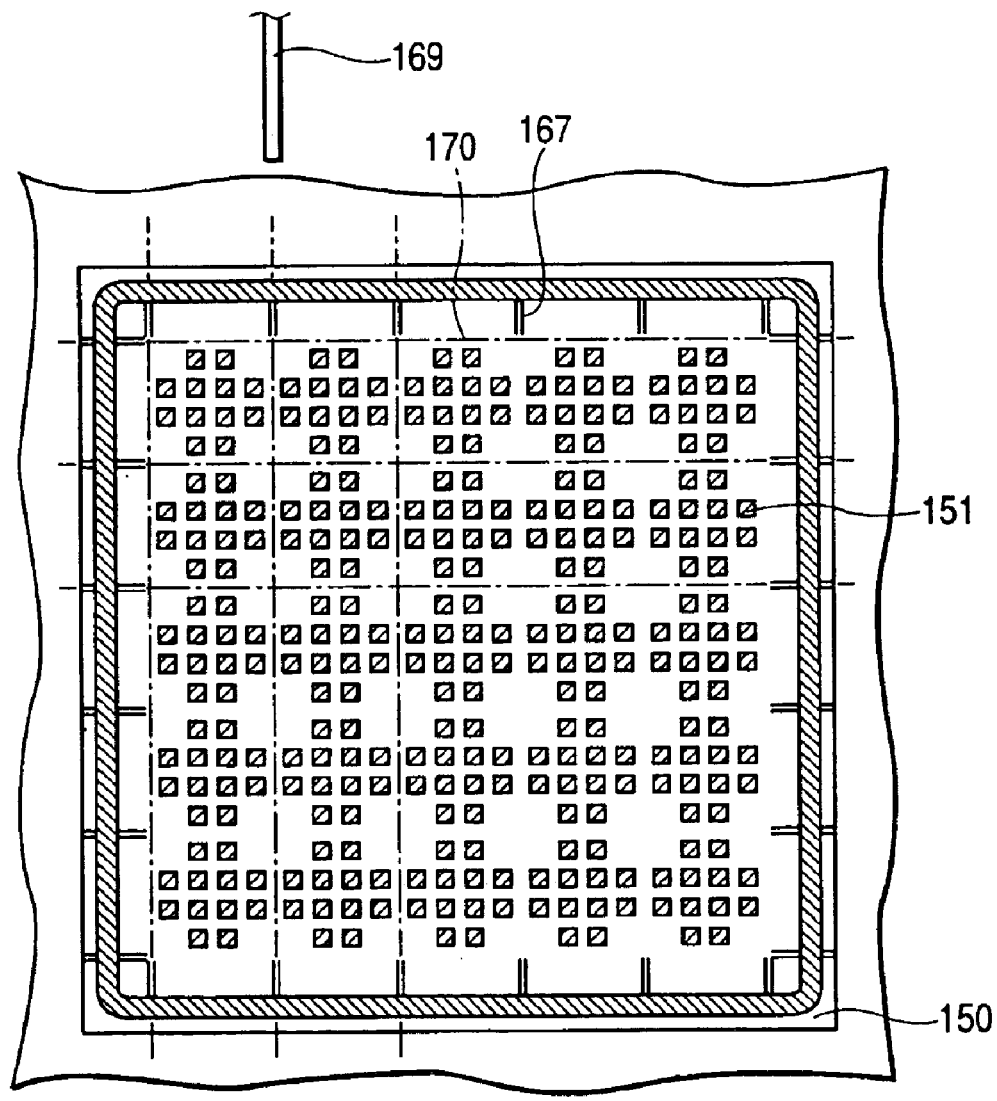
FIG. 26 is a view for showing a method for manufacturing the circuit device of the invention.

The tenth step of the invention comprises dicing the thermosetting resin layer 150A and the insulating resin 150B of the blocks 162 attached to the adhesive sheet 180 into the individual element-mounting parts 165, as in FIG. 26.

In this step, the multiple blocks 162 attached to the adhesive sheet 180 are vacuum-sucked to the stand of a dicing machine, and the thermosetting resin layer 150A and the insulating resin 150B on the isolation trench 161 are diced with a dicing blade 169 along the dicing line 170 between the element-mounting parts 165 to thereby individually separate the circuit devices 153 from each other.

In this step, the dicing blade 169 completely cut the thermosetting resin layer 150A and the insulating resin 150B to the depth that reaches the surface of the adhesive sheet, whereby the element-mounting parts 165 are completely separated from each other. In this step, the registration marks 167 made inside the frame pattern around every block in the first step are recognized, and based on these, the block is diced into individual circuit elements. As well known, each block is first diced along every machine-direction dicing line 170, then the stand is rotated by 90 degrees, and the thus-diced pieces are again diced along the cross-direction dicing line 170.

In this step, the dicing line 170 has only the thermosetting resin layer 150A filled in the isolation trench 161 and the insulating resin 150B that overlies it, and therefore the dicing blade is worn little and produces little metal burr. The process enables extremely accurate dicing into precision devices.

Even after this step, or that is, even after diced, the individual circuit devices are not scattered since they are supported by the adhesive sheet 180. In the subsequent taping step, therefore, they are worked efficiently. Concretely, the circuit devices that are integrally supported by the adhesive sheet 180 are screened, and only the good devices thus selected are released from the adhesive sheet 180 and collected in the collection holes of a carrier tape by the action of a suction collet. Accordingly, the process is characterized in that the microstructured circuit devices are not scattered at all throughout the process and they are well held on a tape.

One embodiment of the manufacturing method of the invention has been described hereinabove. Needless to say, the order of the inspection step and the dicing step may be reversed. This is because the diced devices are all supported on the adhesive sheet 180 and can be tested with no problem. One matter to be specifically taken into consideration in this case is that the diced devices are supported by the adhesive sheet 180 and the deformation of the adhesive sheet 180 must be taken into consideration in the step of inspecting the devices.

In the invention, the conductive foil to be a conductive pattern functions by itself as a supporting board, and the conductive foil supports the entire structure while the isolation trench is formed and while the circuit elements are mounted and covered with an insulating resin. When the conductive foil is separated into the individual conductive pattern, the insulating resin functions as the supporting board. Accordingly, the minimum constitutive components—circuit element, conductive foil and insulating resin may be enough for the invention. This means that the invention does not require the supporting board that is indispensable in the related art technology of manufacturing circuit devices, and it reduces the production costs. In the invention, in addition, the supporting board is unnecessary, the conductive pattern is embedded in the insulating resin, and the thickness of the insulating resin and the conductive foil may be varied in any desired manner. Thus characterized by these advantages, still another advantage of the invention is that it produces extremely thin-walled circuit devices.

Further, since the isolation trench and the conductive pattern are covered with a thermosetting resin, still another advantage of the invention is that the thermosetting resin of low viscosity may have an increased adhesion strength to the isolation trench. In addition, the thermosetting resin and the insulating resin have an affinity to each other as they are the resins of the same type, and they may firmly bond to each other to realize good resin encapsulation for integrated semiconductor package structures. Accordingly, even though the structure of the invention comprises a one-face molded conductive pattern, it completely overcomes the drawback of peeling of the thermosetting resin layer from the insulating resin at the isolation trench. In addition, since the adhesion strength between the two resins in the structure of the invention is increased, the depth of the isolation trench may be from 20 to 30 µm or so, or that is, a half of ordinary isolation trenches. This produces still another advantage in that the conductive pattern may be a finer pattern.

Further, since the conductive pattern is covered with a thermosetting resin layer and a conductive film, its surface is protected from oxidation. In particular, when copper foil is used, its surface is more surely protected from oxidation.

Further, the conductive pattern may be designed in any desired manner below circuit elements. The structure of the invention could not accept multi-layered wiring. However, the single-layered wiring structure of the invention realizes high wiring density like multi-layered wiring structures.

In the manufacturing method of the invention, since the conductive pattern is coated with a semi-cured thermosetting resin layer immediately after its formation, the isolation trench can be completely filled with a liquid thermosetting resin of low viscosity, and the adhesion strength of the two is significantly increased. In addition, since the thermosetting resin layer covers the conductive pattern immediately after the conductive pattern has been formed, the surface of the conductive pattern is not oxidized in the subsequent heating step for die bonding or wire bonding, and the reliability of the devices fabricated is high.

Further, the thermosetting resin layer may be readily selectively removed through laser etching, and the remaining thermosetting resin layer may serve as a mask in plating the exposed conductive pattern with a conductive film. Accordingly, the manufacturing process is simplified.

When an insulating resin is filled into isolation trenches by ordinary transfer molding, it could not be fully filled thereinto since its viscosity is high. Therefore, the problem with the case is that the adhesion strength between the isolation trench and the insulating resin is not good and the insulating resin readily peels from the conductive pattern. The invention has solved the problem by using a semi-cured thermosetting resin of low viscosity, and the adhesion strength between the isolation trench and the thermosetting resin layer in the invention is increased. Specifically, since the thermosetting resin and the insulating resin have an affinity to each other as they are the resins of the same type, and the adhesion strength of the conductive pattern to the thermosetting resin layer and to the insulating resin is greatly increased.

Further, since multiple blocks are attached to the adhesive sheet 180, the microstructured circuit devices are not scattered throughout the process of the invention where they are processed, and still another advantage of the manufacturing method that the invention has realized herein is that its mass-producibility is extremely good.

In addition, still another advantage of the invention is that the multiple blocks attached to the adhesive sheet can be processed in the inspecting step and the dicing step all at a time. Accordingly, in the inspection step, an extremely large number of circuit devices on the element-carrying parts in multiple blocks may be inspected all at a time, and the step does not require the discrimination of the back and the face of each circuit device and the recognition of the electrode position that are needed in the related art technology. In addition, the process enables simultaneous treatment of a large number of multiple blocks all at a time, and therefore the test time for it may be significantly shortened. Further, the advantage of the dicing step is that the dicing lines can be rapidly and surely recognized based on the registration marks made in every block. In the dicing step, the insulating resin layer alone is diced but the conductive foil is not diced. In the step, therefore, the life of the dicing blade to be used is prolonged, and the dicing treatment does not produce metal burr that is inevitable in dicing conductive foil.

(Fifth Embodiment)

The fifth mode of the invention is a modification of the forth mode of the invention, in which the seventh step is modified in the manner mentioned below. In this embodiment, the back of the conductive pattern is exposed out to constitute an external electrode, as illustrated.

Figure 27A:
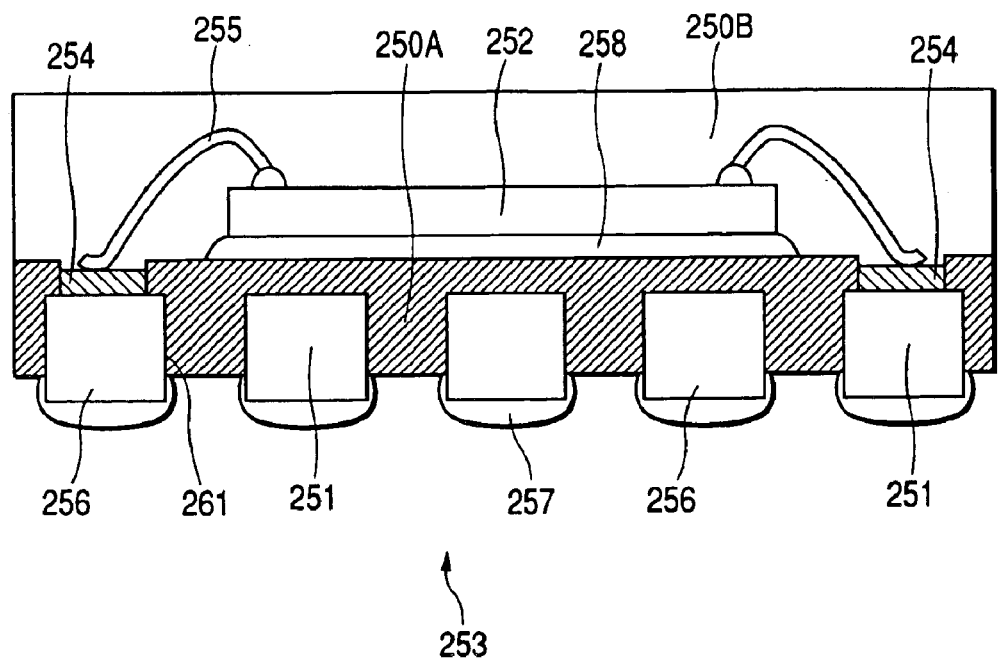
FIG. 27 shows a circuit device of the invention.

Characterizing this embodiment, the external electrode 256 is formed of the conductive pattern 251 of the conductive foil 260 that is below the isolation trench 261, and this protrudes from the back of the thermosetting resin layer 250A, as in FIG. 27A. Accordingly, the external electrode 256 is a protruding electrode by using a part of the conductive foil 260, having a height of about 100 μm. The solder 257 applied to the external electrode 256 runs around the side wall of the external electrode 256, and enhances the bonding strength of the external electrode 256 to the conductive paths of the printed circuit board, as in FIG. 27A.

The conductive pattern 251 with heat-radiating semiconductor chips or the like fixed thereon may constitute a heat sink along with the external electrode 256, having the same thickness as that of the conductive foil 260, and this embodiment may produce a structure of extremely low heat resistance.

Figure 27B:
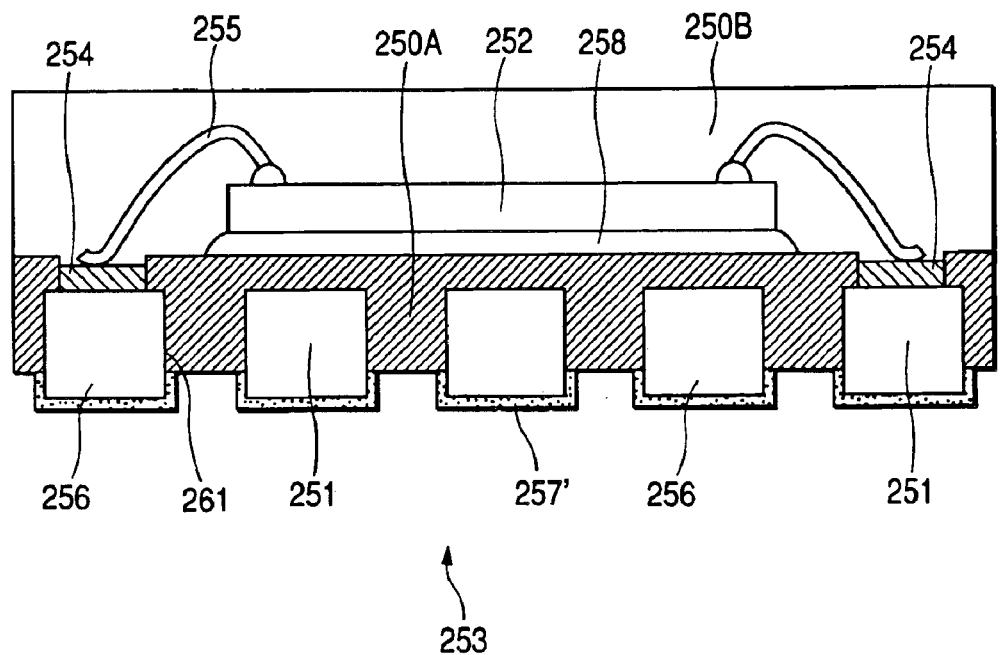

Further, when a thin gold plate layer 257' is formed on the surface of the external electrode 256 as in FIG. 27B, then it realizes a land grid array (LGA) structure. Therefore, the embodiment of this case does not require additional plating to form protruding electrodes.

Figure 28:
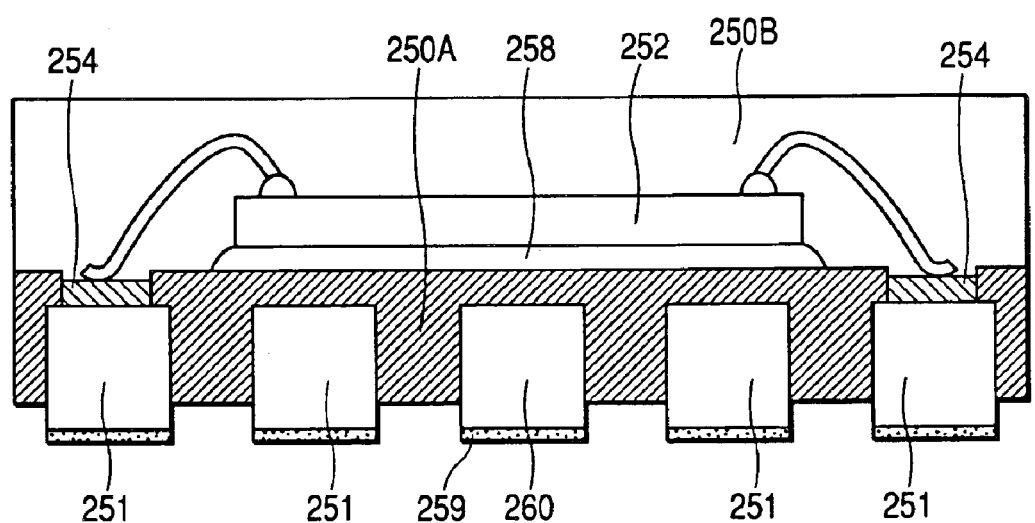
FIG. 28 is a view for showing a method for manufacturing the circuit device of the invention.

The seventh step of this embodiment comprises removing the conductive foil 260 from the area of the isolation trench 261, as in FIG. 28.

In this step, a resist layer 259 is applied to the back of the conductive foil 260 except the area corresponding to the isolation trench 261, and the conductive foil 260 is chemically etched with a solution of ferric chloride or the like via the mask of the resist layer 259. As a result, the conductive foil 260 in the area of the isolation trench 261 is selectively removed and the bottom of the thermosetting resin layer 250A is exposed out. Since the bonding part of the conductive foil 260 now not having the isolation trench 261 therein is removed, the conductive pattern 251 is individually separated to have the thickness of the conductive foil 260.

As a result, the back of the conductive pattern 251 that is almost filled with thermosetting resin layer 250A is exposed out, and the external electrode 256 forms a protruding electrode that protrudes by about 100 μm from the back of the thermosetting resin layer 250A. Specifically, the external electrode 256 means that it is formed as a protruding electrode in the bonding area of the conductive foil 260 not having the isolation trench 261 therein.

Further, the back of the external electrode 256 is processed to obtain the final structure as in FIG. 27. Concretely, the external electrode 256 is coated with a conductive material such as solder, and the circuit device is thus completed. In this case, the conductive material such as solder spreads to cover the side wall of the external electrode 256, and the conductive paths of the printed circuit board are fixed to both the surface and the side wall of the external electrode to increase the bonding strength between them.

Further, when the external electrode 256 is coated with a thin gold plate layer 257', it realizes a land grid array (LGA) structure.

This back treatment does not require a mask since only the external electrode 256 is exposed out of the thermosetting resin layer 250A and the insulating resin 250B, and its advantage is that the treatment is extremely simple.

The exposure of the back of the conductive pattern in this embodiment characterizes the invention. The back of the conductive pattern serves as the external electrode 256 to be connected with external units, and, in addition, the external electrode 256 acts as a heat sink and a protruding electrode.

(Sixth Embodiments)

Figure 29A:
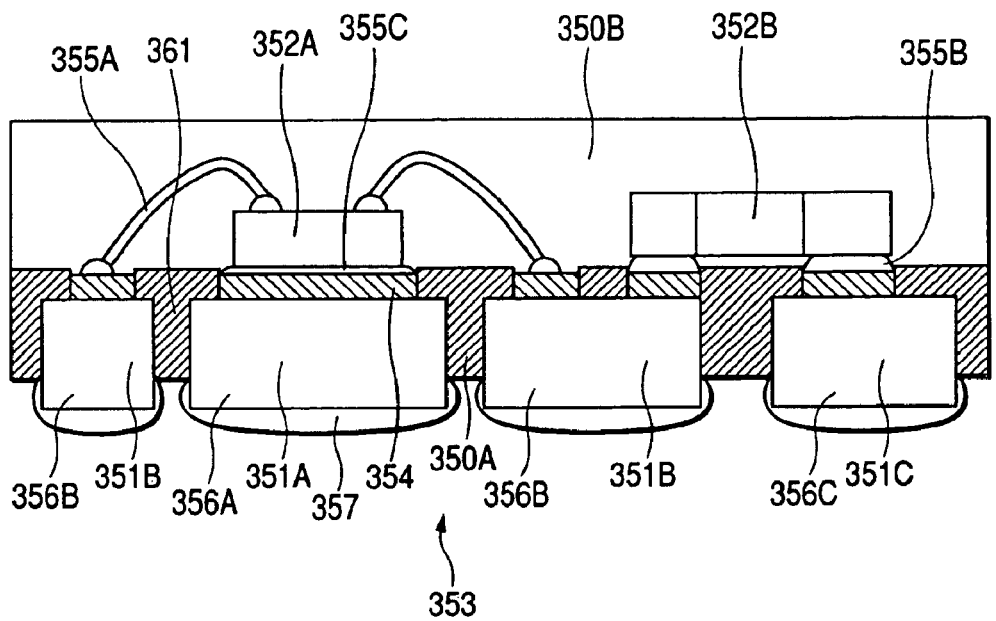
FIG. 29 shows a circuit device of the invention.

The sixth mode of the circuit device of the invention is described with reference to FIG. 29.

The circuit device of the invention comprises a multiple conductive patterns for element mounting thereon that are electrically separated from each other by a isolation trench, a thermosetting resin layer that fills the isolation trench to cover the surface of the conductive pattern, a circuit element fixed on a desired region of the conductive pattern exposed out of the thermosetting resin layer, an insulating resin that covers the circuit element to integrally support the conductive pattern bonded to the thermosetting resin layer, and an external electrode formed by exposing the back of the conductive pattern.

FIG. 29 shows a circuit device 353 having a conductive pattern 351 almost embedded in a thermosetting resin layer 350A, in which a circuit element 352 is fixed on the conductive pattern 351 and the conductive pattern 351 is supported by an insulating resin 350B bonded to the thermosetting resin layer 350A.

This structure comprises four types of elements, the circuit elements 352A and 352B, the multiple conductive patterns 351A, 351B and 351C, the thermosetting resin layer 350A to envelop the conductive patterns 351A, 351B and 351C, and the insulating resin 350B that bonds to the resin layer 350A. In this, the conductive pattern 351 is separated by the isolation trench 361 filled with the thermosetting resin layer 350A. The conductive pattern 351 is supported by the thermosetting resin layer 350A and the insulating resin 350B.

For the thermosetting resin layer 350A that characterizes the invention, a thermosetting resin such as epoxy resin is used. The resin fills the isolation trench 361 and covers the surfaces of the conductive patterns 351A, 351B and 351C. To form the thermosetting resin layer 350A, a liquid material prepared by dissolving a thermosetting resin in an organic solvent is cast over the isolation trench 361 and the conductive patterns 351A, 351B and 351C, semi-cured to evaporate away the organic solvent, and then finally cured. Preferably, a filler such as silica or alumina is added to the thermosetting resin layer 350A to reduce the thermal expansion difference between the layer 350A and the conductive patterns 351A, 351B and 351C. In general, the thermal expansion coefficient of epoxy resin is 50 ppm/° C.; that of epoxy resin containing the filler is from 15 to 30 ppm/° C.; and that of copper to form the conductive patterns 351A, 351B and 351C is 18 ppm/° C. Therefore, the filler may remove the thermal expansion mismatch between epoxy resin and copper.

Since the thermosetting resin for the layer 350A is filled into the isolation trench 361 while it is a liquid of low viscosity, it may well adhere to the inner walls of the isolation trench 361, as compared with epoxy resin to be transfer-molded, and the adhesion strength between the two may be increased significantly.

Another method may be employed for forming the thermosetting resin layer 350A, which comprises pressing a semi-cured film sheet of thermosetting resin such as epoxy resin against the conductive patterns 351A, 351B and 351C followed by finally curing it thereon under heat to thereby cover the conductive patterns and fill the isolation trench 361 with the resin.

For the insulating resin 350B, any of thermosetting resin such as epoxy resin, or thermoplastic resin such as polyimide resin or polyphenylene sulfide may be employed. Not limited to these, the insulating resin may be any and every resin that may be solidified in molds, or may be applied to semiconductor by dipping or coating. However, in consideration of its bonding strength to the thermosetting resin layer 350A, resin of the same type is preferred for the two. Therefore, in this, thermosetting resin such as epoxy resin is used for the insulating resin 350B.

For the conductive pattern 351, for example, any of conductive foil consisting essentially of Cu, conductive foil consisting essentially of Al, or conductive foil consisting essentially of Fe—Ni or the like alloy may be employed. Needless to say, any other conductive material may also be used. Especially preferred are etchable conductive materials and conductive materials evaporable by laser.

For connecting the circuit element 352 to any other element, any of a bonding wire 355A, a conductive ball of solder, a flattenable conductive ball, a solder 355B, a conductive paste 355C of Ag or the like, a conductive film or an anisotropic conductive resin maybe used. The connecting means is selected depending on the type of the circuit element 352 and the mounting mode thereof. For example, for a baser semiconductor element, a bonding wire is selected for connecting the surface electrode and the conductive pattern 351; and for CSP, a solder ball or a solder bump is selected. For the chip resistor and the chip capacitor, selected is a solder 355B or a silver paste. A semiconductor device package such as BGA may be mounted on the conductive pattern 351 with no problem. In this case, solder is selected for the connecting means.

When the circuit element is fixed to the conductive pattern 351A not requiring electric connection between them, an insulating adhesive is selected for the fixation. On the other hand, when the fixation requires electric connection, a conductive film is employed for it. In this case, at least one conductive film will be enough.

For the conductive film, any of Ag, Au, Pt or Pd is usable. The conductive film may be formed through low-vacuum or high-vacuum coating, plating or sintering that includes vapor deposition, sputtering, CVD and the like.

For example, Ag adheres to Au and also to solder. Accordingly, when the back of a chip is coated with Au, the chip may be directly bonded to the conductive path 351A coated with an Ag film, Au film or solder film, or the chip may also be bonded thereto via solder. The conductive film may be the uppermost layer of a multi-layered conductive film. For example, two layers of Ni film and Au film may be formed in that order on the Cu conductive pattern 351A; or three layers of Ni film, Cu film and solder film may be formed in that order thereon; or two layers of Ag film and Ni film may be formed in that order thereon. Apart from these, there are many different types of conductive films and many different laminate structures thereof, but the description relating to them is omitted herein.

The external electrode 356 characterizes the invention, and it is formed of the conductive foil 360 of the conductive pattern 351 that remains below the isolation trench 361. This protrudes from the back of the thermosetting resin layer 350A. Accordingly, a part of the conductive foil 360 forms the external electrode 356, which is a protruding electrode having a height of about 100 μm. Therefore, the solder 357 applied to the external electrode 356 runs around the side wall of the external electrode 356, and enhances the bonding strength of the external electrode 356 to the conductive paths of the printed circuit board, as in FIG. 29A.

The conductive pattern 351A with heat-radiating semiconductor chips or the like fixed thereon may constitute a heat sink along with the external electrode 356A, and this embodiment may produce a structure of extremely low heat resistance.

Figure 29B:
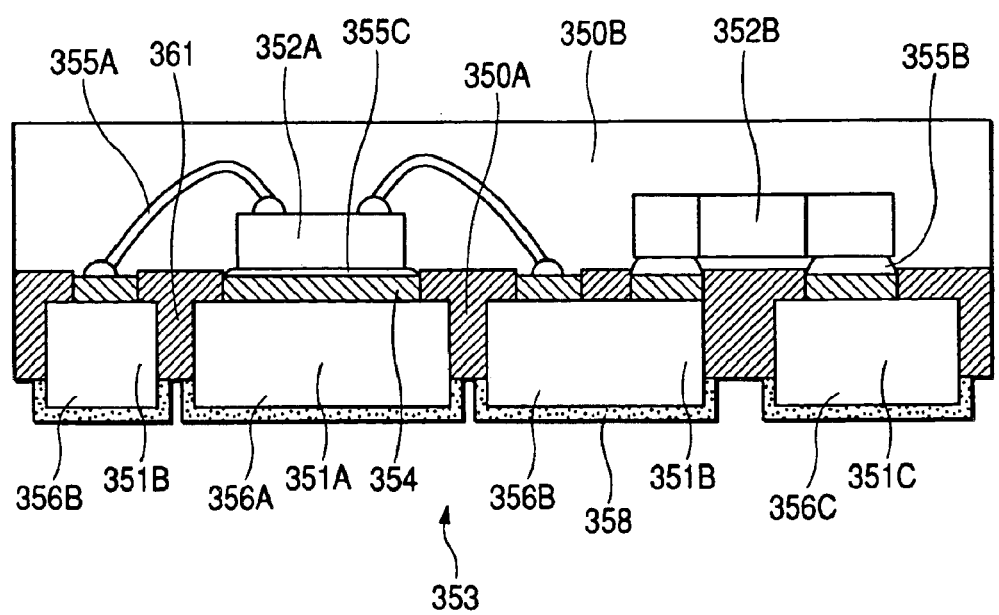

Further, when a thin gold plate layer 358 is formed on the surface of the external electrode 356 as in FIG. 29B, then it realizes a land grid array (LGA) structure. Therefore, the embodiment of this case does not require additional plating to form protruding electrodes.

In this circuit device, the conductive pattern 351 is supported by the thermosetting resin layer 350A and the insulating resin 350B, and therefore does not require a supporting board for it. This constitution characterizes the invention. As so described hereinabove with reference to the related art, the conductive paths in conventional circuit devices are supported by a supporting board or by a lead frame, and they require superfluous structures that are naturally unnecessary. However, the circuit device of the invention is composed of the least necessary constitutive elements, not requiring a supporting board, and it may be thinned and low-priced.

Another advantage of the circuit device of the invention is that the thermosetting resin layer 350A therein covers the circuit element 352 and fills the isolation trench 361 between the conductive pattern 351 for individual insulation.

In the circuit device, the thermosetting resin layer 350A and the insulating resin 350B integrally support the structure in such a manner that the insulating resin 350B covers the circuit element 352 and the thermosetting resin layer 350A fills the isolation trench 361 between the conductive pattern 351 with the back alone of the conductive pattern 351 exposed outside.

Exposing the back of the conductive pattern characterizes the invention. The back of the conductive pattern is connected to the external electrode 356 and serves for further connection to other external elements. In addition, the external electrode 356 acts as a heat sink and a protruding electrode.

In addition, when the circuit element is directly bonded to the structure via a conductive film of solder, Au, Ag or the like, the heat generated by the circuit element 352A may be transferred to the substrate via the conductive pattern 351A since the back of the conductive pattern 351 is exposed out to form the external electrode 356A. Accordingly, the structure of this embodiment is effective for semiconductor chips that require heat radiation when the driving current increases.

In another embodiment, a UV-curable resin may be used in place of the thermosetting resin layer 350A. Concretely, a UV-curable resin is applied onto the structure, using a vacuum laminator, and then cured through exposure to UV rays and development to thereby form a cured UV resin film that covers the desired surface of the isolation trench 361 and the conductive pattern 351. UV-curable resin is a type of epoxy resin, and is therefore effective like the thermosetting resin layer 350A.

One embodiment of manufacturing the circuit device of the sixth mode of the invention is described with reference to FIG. 30.

The method of the invention comprises a step of preparing conductive foil and forming a isolation trench that does not exceed the thickness of the conductive foil in a region of the conductive foil at least except the region to be a conductive pattern that has a number of parts to carry circuit elements mounted thereon, thereby to form the conductive pattern in multiple blocks; a step of coating the isolation trench and the conductive pattern with a thermosetting resin; a step of exposing a predetermined surface of the conductive pattern through laser etching; a step of forming a conductive film selectively on the exposed conductive pattern; a step of fixing circuit elements on the element-mounting parts of the desired conductive pattern; a step of connecting the electrode of the circuit element to the conductive film of the conductive pattern by wire bonding; a step of common-molding it with an insulating resin to collectively cover the circuit element on every element-mounting part and to fill the isolation trench; a step of removing the conductive foil in the part of the isolation trench; a step of sticking the multiple blocks to an adhesive sheet via the insulating resin of each block; a step of measuring the characteristics of the circuit element on each element-mounting part of each block attached to the adhesive sheet; and a step of dicing the insulating resin into the individual element-mounting parts of each block attached to the adhesive sheet.

Figure 30:
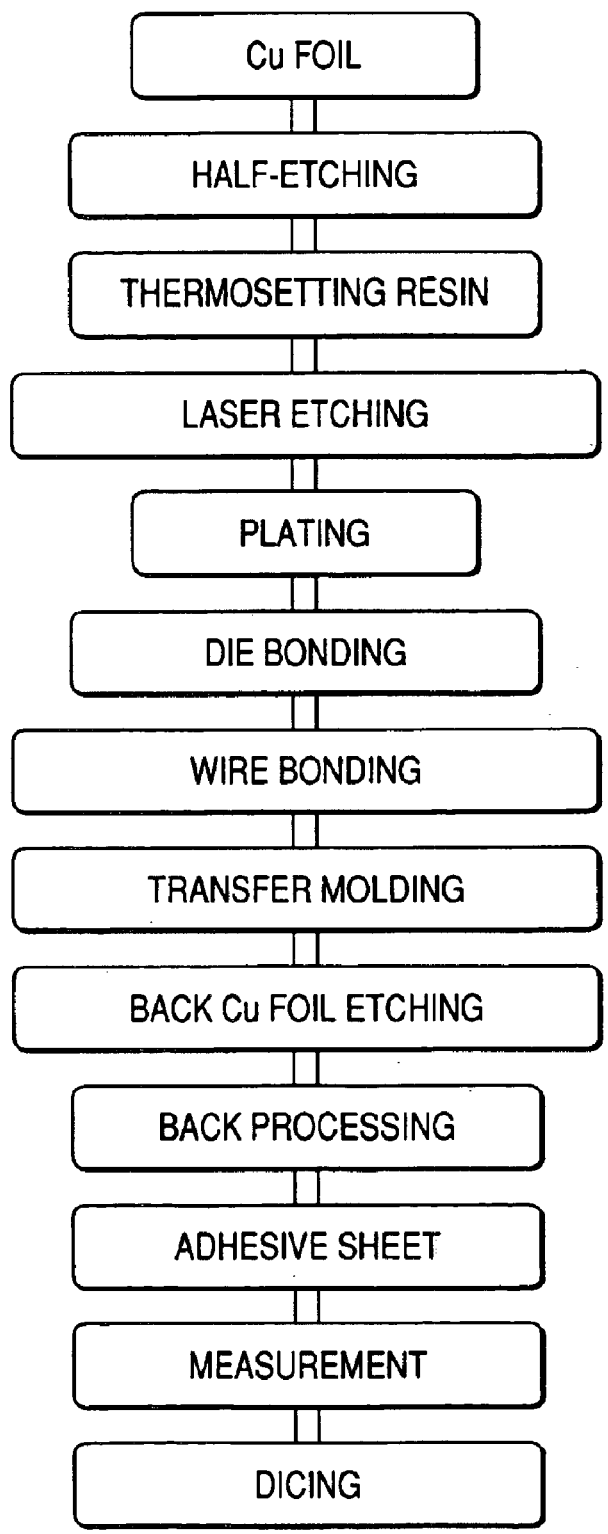
FIG. 30 is a view for showing a method for manufacturing the circuit device of the invention.

The flowchart of FIG. 30 does not correspond to the method as above. In this, the two flows of Cu foil and half-etching are to form a conductive pattern. In the next flow of thermosetting resin, the surface of the isolation trench and the conductive pattern are covered with a thermosetting resin. In the two flows of die bonding and wire bonding, a circuit element is fixed on each element-mounting part, and its electrodes are connected to the conductive pattern. In the flow of transfer molding, an insulating resin is applied to the structure by common molding. In the flow of removing the back Cu foil, the conductive foil in the part of the isolation trench is etched away. In the flow of back processing, the external electrodes that protrude from the back of the structure are subjected to surface treatment. In the flow of adhesive sheet, multiple blocks are attached to an adhesive sheet. In the flow of measurement, the circuit elements built in the structure are checked and graded. In the flow of dicing, the insulating resin is diced into individual circuit devices.

Next described are the steps of the invention with reference to FIG. 29 and FIGS. 31 to 39.

Figure 31A:
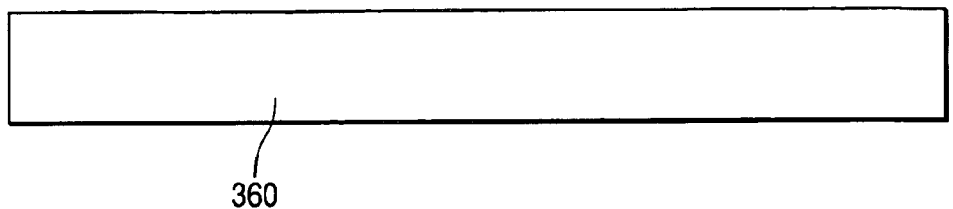
FIG. 31 is a view for showing a method for manufacturing the circuit device of the invention.
Figure 31B:
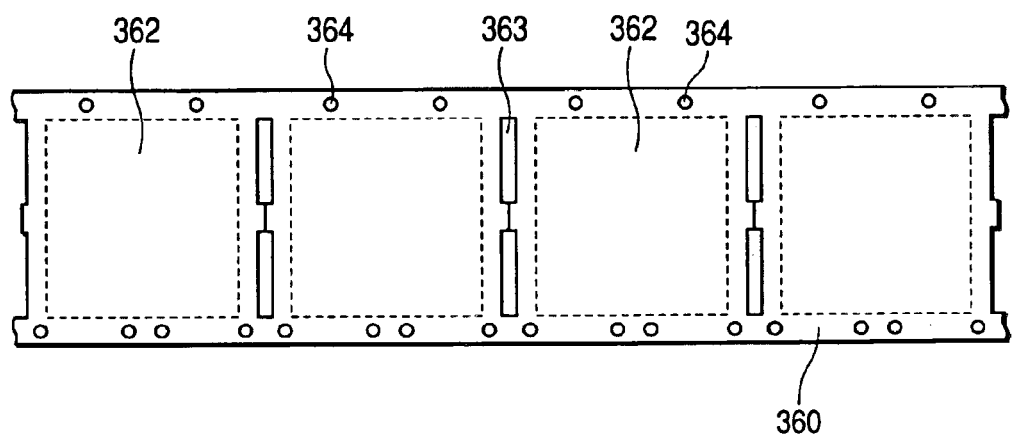
Figure 32:
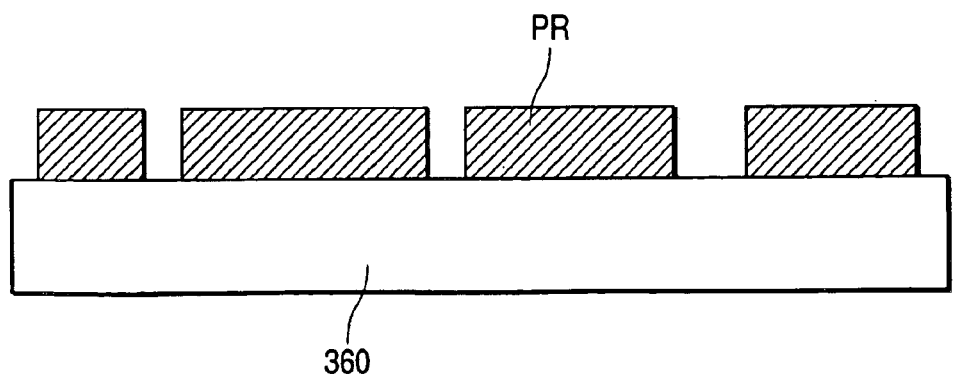
FIG. 32 is a view for showing a method for manufacturing the circuit device of the invention.

As in FIG. 31 to FIG. 33, the first step comprises preparing conductive foil 360, and forming a isolation trench 361 that does not exceed the thickness of the conductive foil 360 in a region of the conductive foil sheet 360 at least except the region to be a conductive pattern 351 that has a number of parts to carry circuit elements 352 mounted thereon, thereby to form the conductive pattern 351 in multiple blocks.

In this step, a sheet like—conductive foil 360 is prepared, as in FIG. 31A. The material for the conductive foil 360 is selected in consideration of solder adhesiveness thereto and the bondability and the platability thereof. For example, conductive foil of essentially Cu, conductive foil of essentially Al, or conductive foil of essentially Fe—Ni alloy or the like may be used.

The thickness of the conductive foil is preferably from 10 $\mu$m to 300 $\mu$m or so in view of the easiness in etching it. In this, copper foil having a thickness of 125 $\mu$m is used. Basically, however, the conductive foil may be thicker than 300 $\mu$m or thinner than 10 $\mu$m. As will be mentioned hereinunder, the thickness of the conductive foil 360 may be such that it accepts the formation of a shallow isolation trench 361 therein.

The conductive foil sheet 360 may be prepared in the form of a roll having a predetermined width, for example, 45 mm, and this may be fed to each step. Alternatively, strips of conductive foil 360 cut to have a predetermined size may be prepared and these may be fed to each step.

Concretely, four or five blocks 362 are formed on a conductive foil strip 360, spaced from each other as in FIG. 31B. Each block shall have a large number of element-mounting parts to be formed therein. A slit 363 is formed between the neighboring blocks 362, and this acts to absorb the stress of the conductive foil 360 in thermal treatment in the molding step, etc. Index holes 364 are formed at predetermined intervals in the upper and lower peripheries of the conductive foil 360, and these are for location in every step.

Next, a conductive pattern 351 is formed in every block.

As in FIG. 32, a photoresist (etching-resistant mask) PR is formed on the Cu foil 360, and this is patterned to partly expose the conductive foil 360 except the region to be a conductive pattern 351. Next, as in FIG. 33A, the conductive foil 360 is selectively etched via the photoresist PR.

The depth of the isolation trench 361 formed by the etching is, for example, from 20 to 30 $\mu$m, and the side wall thereof is roughened through oxidation or chemical polishing so as to increase its adhesiveness to the thermosetting resin layer 350A.

The side wall of the isolation trench 361 is schematically drawn to be straight in the figures, but may have any other structure depending on the method of removing the photoresist for forming it. The method of photoresist removal includes wet etching, dry etching, laser evaporation and dicing. In wet etching, the etchant to be employed is essentially ferric chloride or cupric chloride, and the conductive foil is dipped in or showered with the etchant. In wet etching, in general, the conductive foil is etched non-anisotropically, and its etched side wall is therefore curved.

In dry etching, the conductive foil may be etched aniso-tropically or non-anisotropically. At present, it is said that Cu could not be removed through reactive ion etching, but it may be removed through sputtering. Depending on the condition of sputtering, Cu may be etched anisotropically or non-anisotropically.

In laser evaporation, a laser ray may be directly applied to the conductive foil to form the isolation trench 361. In this case, the side wall of the isolation trench 361 formed may be straight.

Figure 33A:
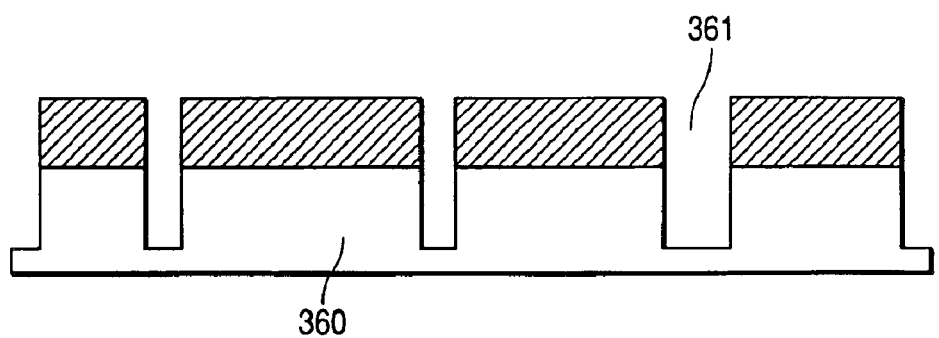
FIG. 33 is a view for showing a method for manufacturing the circuit device of the invention.
Figure 33B:
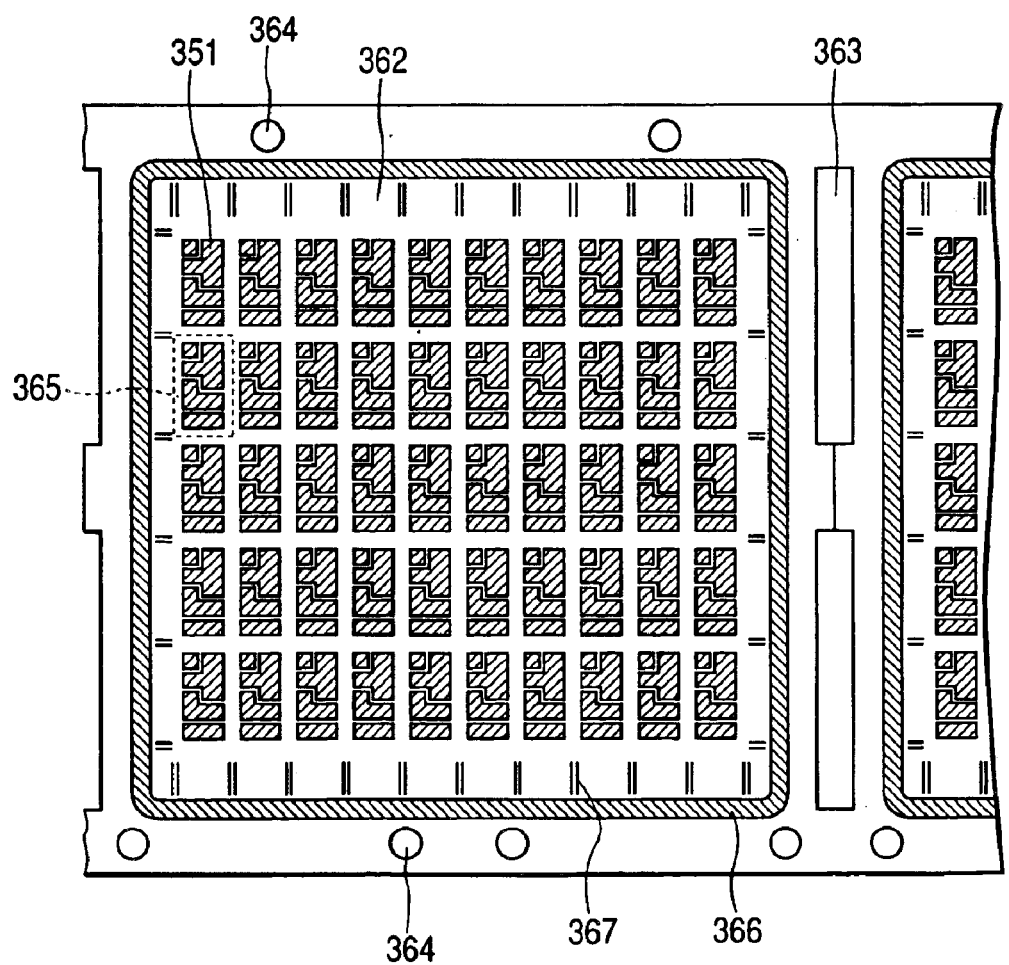

FIG. 33B is a schematic view of the conductive pattern 351. This corresponds to an enlargement of one block 362 shown in FIG. 31B. One black section corresponds to one element-mounting part 365, and the black sections constitute the conductive pattern 351. One block 362 has a large number of element-mounting parts 365 that are aligned in a matrix of 5 lines and 10 rows, and the same conductive pattern 351 is formed for every element-mounting part 365. A frame pattern 366 is formed around every block, and registration marks 367 for dicing are provided inside it, spaced in some degree from it. The frame pattern 366 is for engagement of the patterned conductive foil with a mold, and after back etching of the conductive foil 360, it reinforces the insulating resin 350B.

Figure 34:
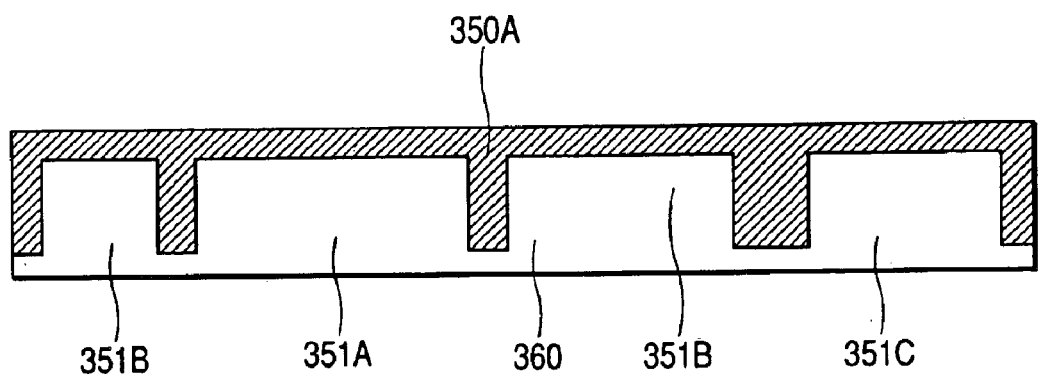
FIG. 34 is a view for showing a method for manufacturing the circuit device of the invention.

The second step of the invention is to form the thermosetting resin layer 350A that covers the isolation trench 361 and the surface of the conductive pattern 351, as in FIG. 34.

This step characterizes the invention, in which a thermosetting resin such as epoxy resin is used for the thermosetting resin layer 350A, and this fills the isolation trench 361 and covers the surfaces of the conductive patterns 351A, 351B and 351C. For forming the thermosetting resin layer 350A, a liquid material prepared by dissolving a thermosetting resin in an organic solvent is cast over the isolation trench 361 and the conductive patterns 351A, 351B and 351C, heated at 80° C. to 100° C. to semi-cure it with evaporating away the organic solvent, and then further heated at 150° C. to 170° C. for about 1.5 hours to finally cure it. Accordingly, the semi-cured thermosetting resin is in B-stage, and it is not as yet finally set.

Preferably, a filler such as silica or alumina is added to the thermosetting resin layer 350A to reduce the thermal expansion difference between the layer 350A and the conductive patterns 351A, 351B and 351C. In general, the thermal expansion coefficient of epoxy resin is 50 ppm/° C.; that of epoxy resin containing the filler is from 15 to 30 ppm/° C.; and that of copper to form the conductive patterns 351A, 351B and 351C is 18 ppm/° C. Therefore, the filler may remove the thermal expansion mismatch between epoxy resin and copper.

Since the thermosetting resin for the layer 350A is filled into the isolation trench 361 while it is a liquid of low viscosity, it may well adhere to the inner walls of the isolation trench 361, as compared with epoxy resin to be transfer-molded, and the adhesion strength between the two may be increased significantly. The depth of the isolation trench 161 is about 60 μm for ensuring the necessary adhesion strength in the related art. However, since the adhesion strength in this embodiment is increased, the depth of the isolation trench 361 may be a half of it in the related art as above, concretely from 20 to 30 μm, and this produces an advantage in that the conductive pattern 351 may be a finer pattern.

Another method may be employed for forming the thermosetting resin layer 350A, which comprises pressing a semi-cured film sheet of thermosetting resin such as epoxy resin against the conductive patterns 351A, 351B and 351C followed by finally curing it thereon under heat to thereby cover the conductive patterns and fill the isolation trench 361 with the resin. The surface of the thermosetting resin film is covered with a cushion sheet, and pressed under 100 kg/cm² under heat at 150° C. to 170° C., and the resin is finally cured while its melt covers the isolation trench 361 and the surfaces of the conductive patterns 351A, 351B and 351C.

In this step, it is desirable to roughen the inner wall of the isolation trench 361 for further enhancing the adhesion strength between the isolation trench 361 and the thermosetting resin layer 350A. For it, for example, the inner wall of the isolation trench 361 is oxidized or chemically polished with an organic acid etchant. For the organic acid etchant, for example, Mec's CZ-8100 may be used. The patterned conductive foil is dipped in the etchant for a few minutes to roughen the surface thereof to a degree of from 1 to 2 μm or so. Through the treatment, the inner wall of the isolation trench 361 is roughened, and the adhesion strength between the isolation trench 361 and the thermosetting resin layer 350A is thereby increased.

In another embodiment of this step, a UV-curable resin may be used in place of thermosetting resin. Concretely, a UV-curable resin is applied onto the patterned conductive foil, using a vacuum laminator, and then cured through exposure to UV rays and development to thereby form a cured UV resin layer that covers the desired surface of the isolation trench 361 and the conductive pattern 351. This embodiment simplifies the process since it covers the next third step.

Figure 35:
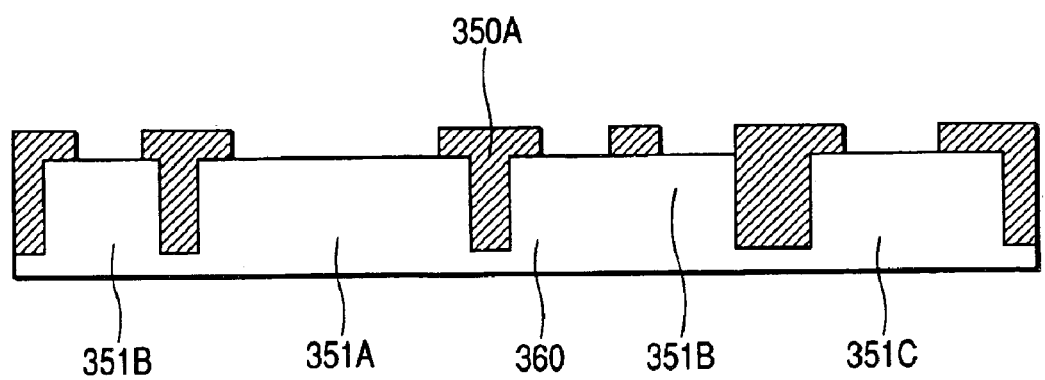
FIG. 35 is a view for showing a method for manufacturing the circuit device of the invention.

The third step of the invention comprises exposing the surface of a predetermined area of the conductive pattern 351 by removing the thermosetting resin layer 350A thereon through laser etching, as in FIG. 35.

In this step, the thermosetting resin layer 350A is partly selectively removed through laser etching for direct patterning to thereby partly expose the conductive pattern 351. For the laser, carbon dioxide laser is preferred, but excimer laser and YAG laser may also be used. When the resin still remains on the bottom of the opening after its removal through laser evaporation, it is removed, for example, through wet etching with sodium permanganate or ammonium persulfate or through dry etching with excimer laser.

Figure 36:
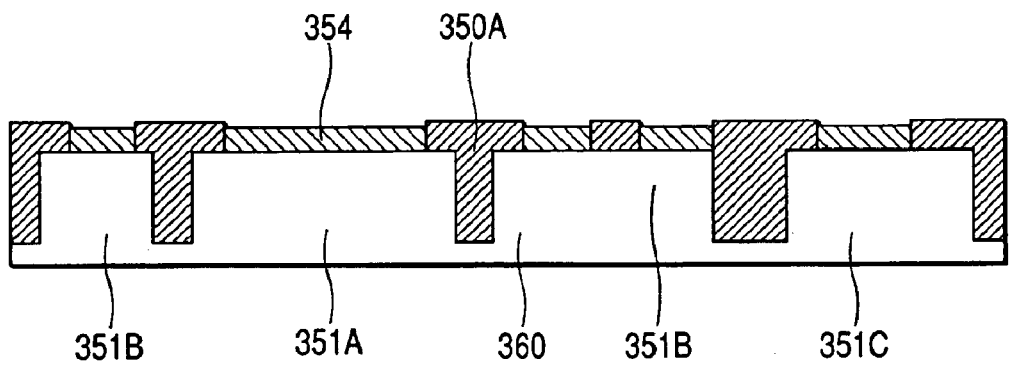
FIG. 36 is a view for showing a method for manufacturing the circuit device of the invention.

The fourth step of the invention comprises forming a conductive film 354 on the exposed conductive pattern 351, as in FIG. 36.

The remaining thermosetting resin layer 350A serves as a mask, and the exposed conductive pattern 351 is plated with any of gold, silver or palladium by electrolytic plating or electroless plating to have the conductive film 354 formed thereon. The conductive film 354 serves as a die pad or a bonding pad.

For example, a silver film adheres to gold wires and to solder. Therefore, when the back of the chip to be applied to the structure of this embodiment is coated with gold, the chip may directly be bonded to the silver film formed on the conductive pattern 351 or may be bonded thereto via solder. In addition, fine Au wires may adhere to the conductive film of silver. Therefore, the conductive film 354 accepts wire bonding, and its one advantage is that the film may serve directly as a die pad or a bonding pad.

Figure 37:
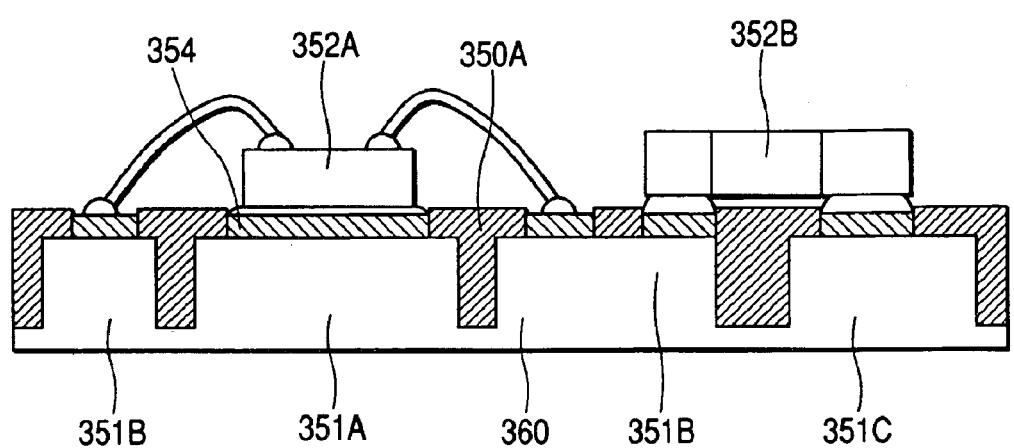
FIG. 37 is a view for showing a method for manufacturing the circuit device of the invention.

The fifth step of the invention comprises fixing a circuit element 352 on the element-mounting part 365 of the desired conductive pattern 351, and forming a connecting means for electrically connecting the electrode of the circuit element 352 in the element-mounting part 365 to a desired part of the conductive pattern 351, as in FIG. 37.

The circuit element 352 includes semiconductor elements such as transistors, diodes, IC chips, and passive elements such as chip capacitors and chip resistors. Though thick, face-down semiconductor elements such as CSP or BGA may also be mounted on the structure.

In the illustrated embodiment, a bare transistor chip 352A is die-bonded to the conductive film 354 on the conductive pattern 351A, and its emitter electrode is bonded to the conductive film 354 on the conductive pattern 351B with its base electrode to the conductive film 354 on the conductive pattern 351B, via a bonding wire 355A bonded to the two by thermal ball bonding or ultrasonic wedge bonding. 352B is a chip capacitor or a passive element, and it is bonded to the structure via solder or conductive paste 355B.

A large number of conductive patterns 351 are integrated in every block 362. Therefore, the advantage of this step is that the circuit elements 352 may be efficiently mounted on the conductive patterns through physical fixation and wire bonding.

The sixth step of the invention comprises common-molding the circuit elements 352 on the element-mounting parts 363 with an insulating resin 350B that collectively covers the elements and bonds to the thermosetting resin layer 350A filled in the isolation trench 361, as in FIG. 38.

Figure 38A:
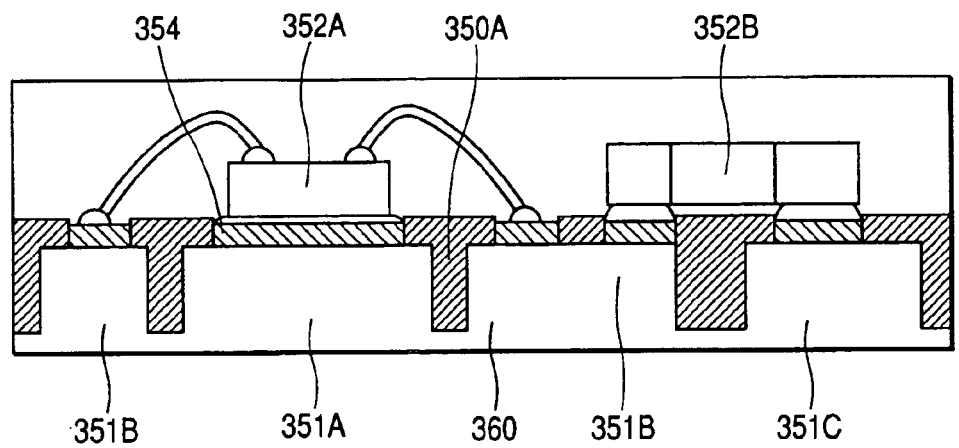
FIG. 38 is a view for showing a method for manufacturing the circuit device of the invention.

The isolation trench 361 and the multiple conductive patterns 351A, 351B and 351C are covered with the thermosetting resin layer 350A in the previous step, and the insulating resin 350B covers the circuit element 352 and bonds to the thermosetting resin layer 350A remaining in the isolation trench 361 and on the surface of the conductive pattern 351, as in FIG. 38A. In particular, when thermosetting resin of the same type such as epoxy resin is used for both the thermosetting resin layer 350A and the insulating resin 350B, the two have an affinity for each other and therefore produce a higher adhesion strength between them. For further enhancing the adhesion strength, it is desirable that the surface of the thermosetting resin layer 350A is subject to UV irradiation or plasma irradiation to activate the polar group of the resin in the surface of the layer 350A prior to the molding treatment with the insulating resin 350B. As a result, the thermosetting resin layer 350A is integrated with the insulating resin 350B to more firmly support the conductive pattern 351.

The treatment of this step may be realized by transfer molding, injection molding or dipping. Regarding the type of the resin material, thermosetting resin such as epoxy resin may be transfer-molded; and thermoplastic resin such as polyimide resin or polyphenylene sulfide may be injection-molded.

Figure 38B:
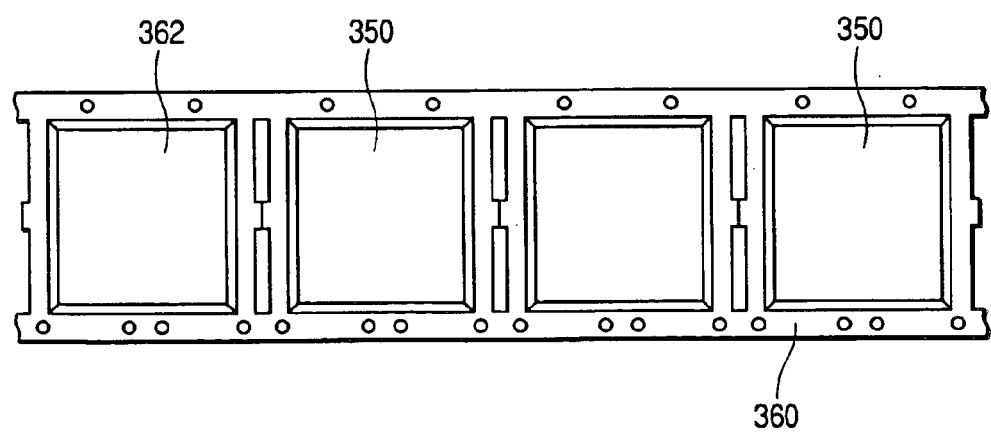

In this step of transfer molding or injection molding, the element-mounting parts 363 in one block 362 are all put in one common mold, and they are common-molded with one insulating resin 350, as in FIG. 38B. In this step, therefore, the amount of the resin to be used may be reduced significantly, as compared with that in conventional transfer molding, and common molds may be used.

The thickness of the insulating resin 350B that covers the surface of the conductive foil 360 is so controlled that it is about 100 $\mu$m or so from the top of the circuit element 352. This thickness may be increased or decreased in consideration of the mechanical strength of the resin layer.

This step is characterized in that the conductive foil 360 to form the conductive pattern 351 serves as a supporting board before it is coated with the insulating resin 130B. In the related art technology, the conductive paths 507 to 511 are formed by the use of the supporting board 505 that is naturally unnecessary, as in FIG. 11. In the invention, however, the conductive foil 360 that serves as the supporting board is a material necessary for electrodes. Accordingly, the invention is advantageous in that the necessary constitutive materials may be reduced to the minimum and the production costs are therefore reduced.

Since the depth of the isolation trench 361 does not exceed the thickness of the conductive foil 360, the conductive pattern 351 of the conductive foil 360 is not individually separated. Accordingly, the conductive foil 360 can be handled as one sheet as a whole, and when it is molded with the insulating resin 350B, it may be readily transferred and put into a mold.

Figure 39:
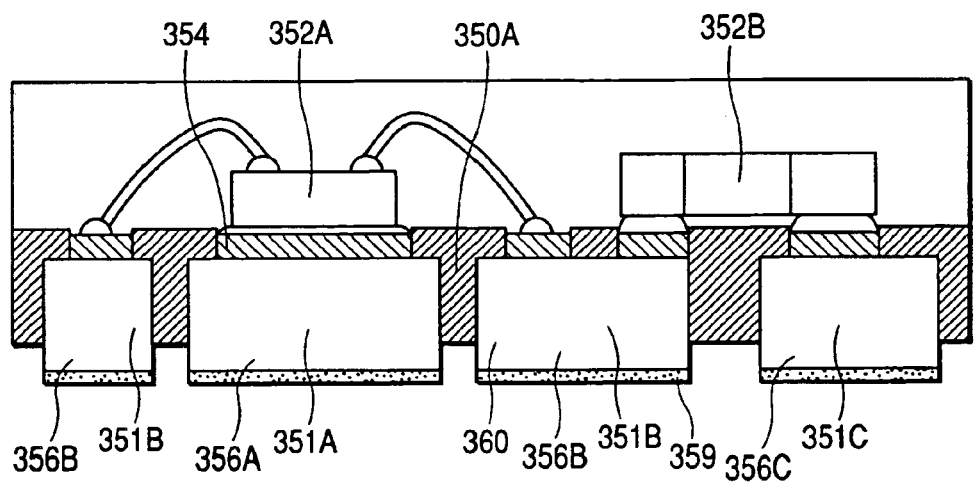
FIG. 39 is a view for showing a method for manufacturing the circuit device of the invention.

The seventh step of the invention comprises removing the conductive foil 360 in the part of the isolation trench 361, as in FIG. 39.

In this step, a resist layer 359 is formed on the back of the conductive foil 360 except a part thereof that corresponds to the isolation trench 361. Via the resist layer 359 that serves as a mask, the conducive foil 360 is chemically etched with an etchant of ferric chloride or the like. As a result, the conductive foil 360 corresponding to the part of the isolation trench 361 is selectively removed, and the bottom of the thermosetting resin layer 350A in that part is exposed out. In this step, the joint part of the conductive foil 360 not having the isolation trench 361 is removed, and the conductive pattern 351 of which the thickness corresponds to that of the conductive foil 360 is separated from each other.

In the structure thus processed, the back of the conductive pattern 351 that is almost completely embedded in the thermosetting resin layer 350A is exposed out. As a result, protruding external electrodes 356A, 356B and 356C that protrudes from the back of the thermosetting resin layer 350A by about 100 $\mu$m are formed. This means that the external electrodes 356A, 356B and 356C are formed as protruding electrodes in the joint part of the conductive foil 360 not having the isolation trench 361.

Further, the back of the external electrodes 356A, 356B and 356C is processed to obtain the final structure as in FIG. 39. Concretely, the external electrodes 356A, 356B and 356C are covered with a conductive material such as solder to complete the circuit device of the invention. In this case, the conductive material such as solder runs along the side walls of the external electrodes 356A, 356B and 356C, whereby the conducive paths of the printed circuit board bond to the external electrodes 356A, 356B and 356C via their surfaces and side walls and the bonding strength between them is thereby enhanced.

Further, when the external electrodes 356A, 356B and 356C are coated with a thin gold plate layer, they realize a land grid array (LGA) structure.

Through the back treatment, only the external electrodes 356A, 356B and 356C are exposed out of the thermosetting resin layer 350A and the insulating resin 350B, and this embodiment is advantageous in that it does not require a mask and is therefore simple.

The eighth to tenth steps of this mode are the same as those of the fourth mode described hereinabove.

In the invention, the conductive foil to be a conductive pattern functions by itself as a supporting board, and the conductive foil supports the entire structure while the isolation trench is formed and while the circuit elements are mounted and covered with an insulating resin. When the conductive foil is separated into the individual conductive pattern, the insulating resin functions as the supporting board. Accordingly, the minimum constitutive components—circuit element, conductive foil and insulating resin may be enough for the invention. This means that the invention does not require the supporting board that is indispensable in the related art technology of manufacturing circuit devices, and it reduces the production costs. In the invention, in addition, the supporting board is unnecessary, the conductive pattern is embedded in the insulating resin, and the thickness of the insulating resin and the conductive foil may be varied in any desired manner. Thus characterized by these advantages, still another advantage of the invention is that it produces extremely thin-walled circuit devices.

Further, since the isolation trench and the conductive pattern are covered with a thermosetting resin, still another advantage of the invention is that the thermosetting resin of low viscosity may have an increased adhesion strength to the isolation trench. In addition, the thermosetting resin and the insulating resin have an affinity to each other as they are the resins of the same type, and they may firmly bond to each other to realize good resin encapsulation for integrated semiconductor package structures. Accordingly, even though the structure of the invention comprises a one-face molded conductive pattern, it completely overcomes the drawback of peeling of the thermosetting resin layer from the insulating resin at the isolation trench. In addition, since the adhesion strength between the two resins in the structure of the invention is increased, the depth of the isolation trench may be from 20 to 30 μm or so, or that is, a half of ordinary isolation trenches. This produces still another advantage in that the conductive pattern may be a finer pattern.

Further, since the conductive pattern is covered with a thermosetting resin layer and a conductive film, its surface is protected from oxidation. In particular, when copper foil is used, its surface is more surely protected from oxidation.

Further, since the external electrodes are formed of the joint part of the conductive foil not having the isolation trench, they may be protruding electrodes with ease. When they serve as a heat sink, the heat radiation of the circuit device may be improved.

In the manufacturing method of the invention, since the conductive pattern is coated with a semi-cured thermosetting resin layer immediately after its formation, the isolation trench can be completely filled with a liquid thermosetting resin of low viscosity, and the adhesion strength of the two is significantly increased. In addition, since the thermosetting resin layer covers the conductive pattern immediately after the conductive pattern has been formed, the surface of the conductive pattern is not oxidized in the subsequent heating step for die bonding or wire bonding, and the reliability of the devices fabricated is high.

Further, the thermosetting resin layer may be readily selectively removed through laser etching, and the remaining thermosetting resin layer may serve as a mask in plating the exposed conductive pattern with a conductive film. Accordingly, the manufacturing process is simplified.

When an insulating resin is filled into isolation trenches by ordinary transfer molding, it could not be fully filled thereinto since its viscosity is high. Therefore, the problem with the case is that the adhesion strength between the isolation trench and the insulating resin is not good and the insulating resin readily peels from the conductive pattern. The invention has solved the problem by using a semi-cured thermosetting resin of low viscosity, and the adhesion strength between the isolation trench and the thermosetting resin layer in the invention is increased. Specifically, since the thermosetting resin and the insulating resin have an affinity to each other as they are the resins of the same type, and the adhesion strength of the conductive pattern to the thermosetting resin layer and to the insulating resin is greatly increased.

Further, since the external electrodes are formed by selectively etching the joint part of the conductive foil in the isolation trench area, they do not require plating treatment and may be readily protruding electrodes.

(Seventh Embodiment)

The seventh mode of the circuit device of the invention is described with reference to FIG. 40.

The circuit device of the invention comprises a first multiple conductive patterns for element mounting thereon that are electrically separated from each other by a isolation trench, a thermosetting resin layer that fills the isolation trench to cover the surface of the first conductive pattern, a second conductive pattern formed on the thermosetting resin layer and connected to desired region of the first conductive pattern, a circuit element fixed on the second conductive pattern while insulated from it, and an insulating resin that covers the circuit element to integrally support the first and second conductive patterns bonded to the thermosetting resin layer.

Figure 40:
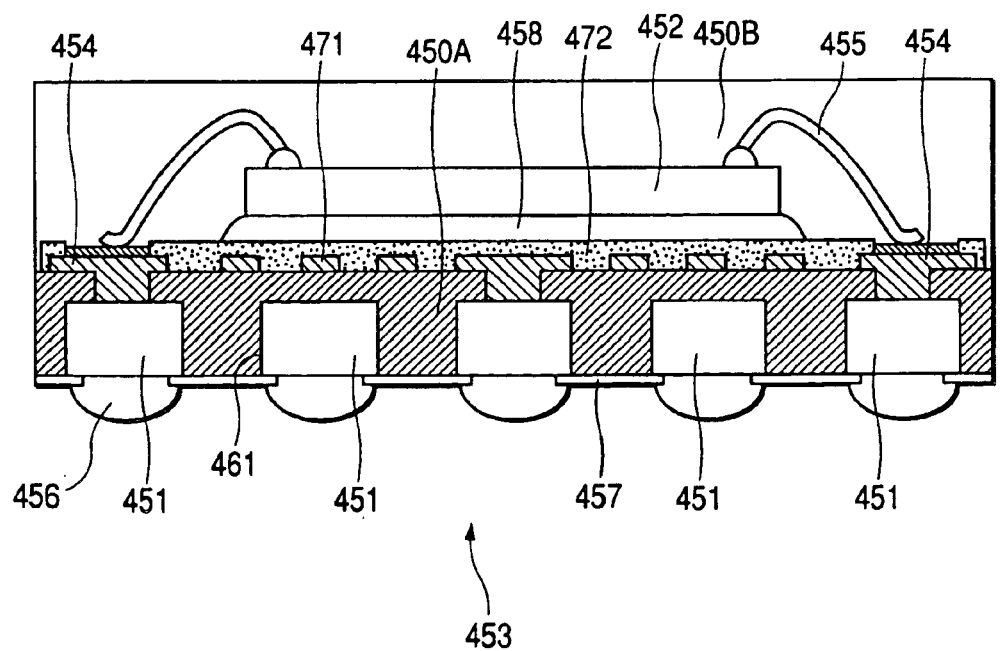
FIG. 40 shows a circuit device of the invention.

FIG. 40 shows a circuit device 453 having a first conductive pattern 351 almost embedded in a thermosetting resin layer 450A, in which a second conductive pattern 471 is formed on the thermosetting resin layer 450A, a circuit element 452 is fixed onto the second conductive pattern 451 while electrically insulated from it, and the first conductive pattern 451 is supported by an insulating resin 450B bonded to the thermosetting resin layer 450A.

This structure comprises four types of elements, the circuit element 452, the first multiple conductive pattern 451 and the second conductive pattern 471, the thermosetting resin layer 450A to envelop the first conductive pattern 451, and the insulating resin 450B that bonds to the resin layer 450A. In this, the first conductive pattern 451 is separated by the isolation trench 461 filled with the thermosetting resin layer 450A. The first conductive pattern 451 and the second conductive pattern 471 are supported by the thermosetting resin layer 450A and the insulating resin 450B.

For the thermosetting resin layer 450A that characterizes the invention, a thermosetting resin such as epoxy resin is used. The resin fills the isolation trench 461 and covers the surface of the first conductive pattern 451. To form the thermosetting resin layer 450A, a liquid material prepared by dissolving a thermosetting resin in an organic solvent is cast over the isolation trench 461 and the first conductive pattern 451, semi-cured to evaporate away the organic solvent, and then finally cured. Preferably, a filler such as silica or alumina is added to the thermosetting resin layer 450A to reduce the thermal expansion difference between the layer 450A and the first conductive pattern 451. In general, the thermal expansion coefficient of epoxy resin is 50 ppm/° C.; that of epoxy resin containing the filler is from 15 to 30 ppm/° C.; and that of copper to form the first conductive pattern 451 is 18 ppm/° C. Therefore, the filler may remove the thermal expansion mismatch between epoxy resin and copper.

Since the thermosetting resin for the layer 450A is filled into the isolation trench 461 while it is a liquid of low viscosity, it may well adhere to the inner walls of the isolation trench 461, as compared with epoxy resin to be transfer-molded, and the adhesion strength between the two may be increased significantly.

Another method may be employed for forming the thermosetting resin layer 450A, which comprises pressing a semi-cured film sheet of thermosetting resin such as epoxy resin against the first conductive pattern 451 followed by finally curing it thereon under heat to thereby cover the conductive pattern and fill the isolation trench 461 with the resin.

For the insulating resin 450B, any of thermosetting resin such as epoxy resin, or thermoplastic resin such as polyphenylene sulfide may be employed. Not limited to these, the insulating resin may be any and every resin that may be solidified in molds, or may be applied to semiconductor by dipping or coating. However, in consideration of its bonding strength to the thermosetting resin layer 450A, resin of the same type is preferred for the two. Therefore, in this, thermosetting resin such as epoxy resin is used for the insulating resin 450B.

For the first conductive pattern 451, for example, any of conductive foil consisting essentially of Cu maybe employed, conductive foil consisting essentially of Al, or conductive foil consisting essentially of Fe—Ni alloy or the like may be used. Needless to say, any other conductive material may also be used. Especially preferred are etchable conductive materials and conductive materials evaporable by laser.

For the second conductive pattern 471, a conductive film of Cu may be used which is formed on the surface of the thermosetting resin layer 450A through electrolytic or electroless plating with Cu thereon. The thermosetting resin layer 450A is selectively removed from the spots of the first conductive pattern 451 for electric bonding thereof to the second conductive pattern.

For connecting the circuit element 452 to any other element, a bonding wire 455 is used in a face-up structure, or a conductive ball of solder, a flattenable conductive ball or other solder material in a face-down structure. The connecting means is selected depending on the type of the circuit element 452 and the mounting mode thereof.

The second conductive pattern 471 to which the bonding wire 455 or solder is bonded is selectively exposed out of the insulating film 472, and a conductive film 454 is formed on the surface of the thus-exposed second conductive pattern 471. The material for the conductive film 454 is, for example, any of Ag, Au, Pt or Pd. The conductive film may be formed through low-vacuum or high-vacuum coating, plating or sintering that includes vapor deposition, sputtering, CVD and the like.

The back electrode 456 is formed by selectively exposing out a predetermined region of the first conductive pattern 451 with masking the other region thereof with a resist layer 457, followed by applying a conductive material such as solder to the exposed region, and the back electrodes are protruding electrodes.

In this circuit device, the first conductive pattern 451 and the second conductive pattern 471 are supported by the thermosetting resin layer 450A and the insulating resin 450B, and therefore do not require a supporting board for them. This constitution characterizes the invention. As so described hereinabove with reference to the related art, the conductive paths in conventional circuit devices are supported by a supporting board or by a lead frame, and they require superfluous structures that are naturally unnecessary. However, the circuit device of the invention is composed of the least necessary constitutive elements, not requiring a supporting board, and it may be thinned and low-priced.

Another advantage of the circuit device of the invention is that the thermosetting resin layer 450A therein covers the circuit element 452 and fills the isolation trench 461 between the first conductive patterning 451 for individual insulation.

In the circuit device, the thermosetting resin layer 450A and the insulating resin 450B integrally support the structure in such a manner that the insulating resin 450B covers the circuit element 452 and the thermosetting resin layer 450A fills the isolation trench 461 between the first conductive pattern 451 with the back alone of the first conductive pattern 451 exposed outside.

The circuit element 452 is bonded onto the insulating film 472 that covers the second conductive pattern 471, via an insulating adhesive 458, and the circuit element 452 is electrically insulated from the second conductive pattern 471. Accordingly, the first conductive pattern 451 and the second conductive pattern 471 may be wired in any desired manner below the circuit element 452, and this realizes multi-layer wiring. Each electrode pad of the circuit element 452 is connected to the conductive film 454 formed of a part of the second conductive pattern 471 around the circuit element and serving as a bonding pad, via a bonding wire 455.

Exposing the back of the first conductive pattern 451 characterizes the invention. The back of the conductive path may be connected to external elements, therefore not requiring through-holes TH as in the conventional structure in FIG. 11.

In this circuit device, the surface of the isolation trench 461 is substantially on the same level as the back of the first conductive pattern 451. This structure characterizes the invention. This does not have a difference in level for the back electrodes 510 and 511 as in FIG. 11. Therefore, the circuit device 453 is characterized in that it accepts horizontal movement.

In another embodiment, a UV-curable resin may be used in place of the thermosetting resin layer 450A. Concretely, a UV-curable resin is applied onto the structure, using a vacuum laminator, and then cured through exposure to UV rays and development to thereby form a cured UV resin film that covers the desired surface of the isolation trench 461 and the first conductive pattern 451. UV-curable resin is a type of epoxy resin, and is therefore effective like the thermosetting resin layer 450A.

One embodiment of manufacturing the circuit device of the invention is described with reference to FIG. 41.

The method of the invention comprises a step of preparing conductive foil and forming a isolation trench that does not exceed the thickness of the conductive foil in a region of the conductive foil at least except the region to be a first conductive pattern that has a number of parts to carry circuit elements mounted thereon, thereby to form the first conductive pattern in multiple blocks; a step of coating the isolation trench and the first conductive pattern with a thermosetting resin; a step of exposing a predetermined surface of the first conductive pattern through laser etching; a step of forming a conductive film of Cu plate on the surface of the thermosetting resin layer in contact with the exposed first conductive pattern, followed by etching it in a predetermined pattern to form a second conductive pattern; a step of forming a conductive film selectively on the exposed second conductive pattern; a step of fixing circuit elements onto the insulating film that covers the second conductive pattern; a step of forming a connecting means for electrically connecting the electrode of each circuit element to a desired part of the second conductive pattern; a step of common-molding it with an insulating resin to collectively cover the circuit element on every element-mounting part; a step of removing the conductive foil in the thickness part with no isolation trench formed therein; a step of sticking the multiple blocks to an adhesive sheet via the insulating resin of each block; a step of measuring the characteristics of the circuit element on each element-mounting part of each block attached to the adhesive sheet; and a step of dicing the insulating resin into the individual element-mounting parts of each block attached to the adhesive sheet.

Figure 41:
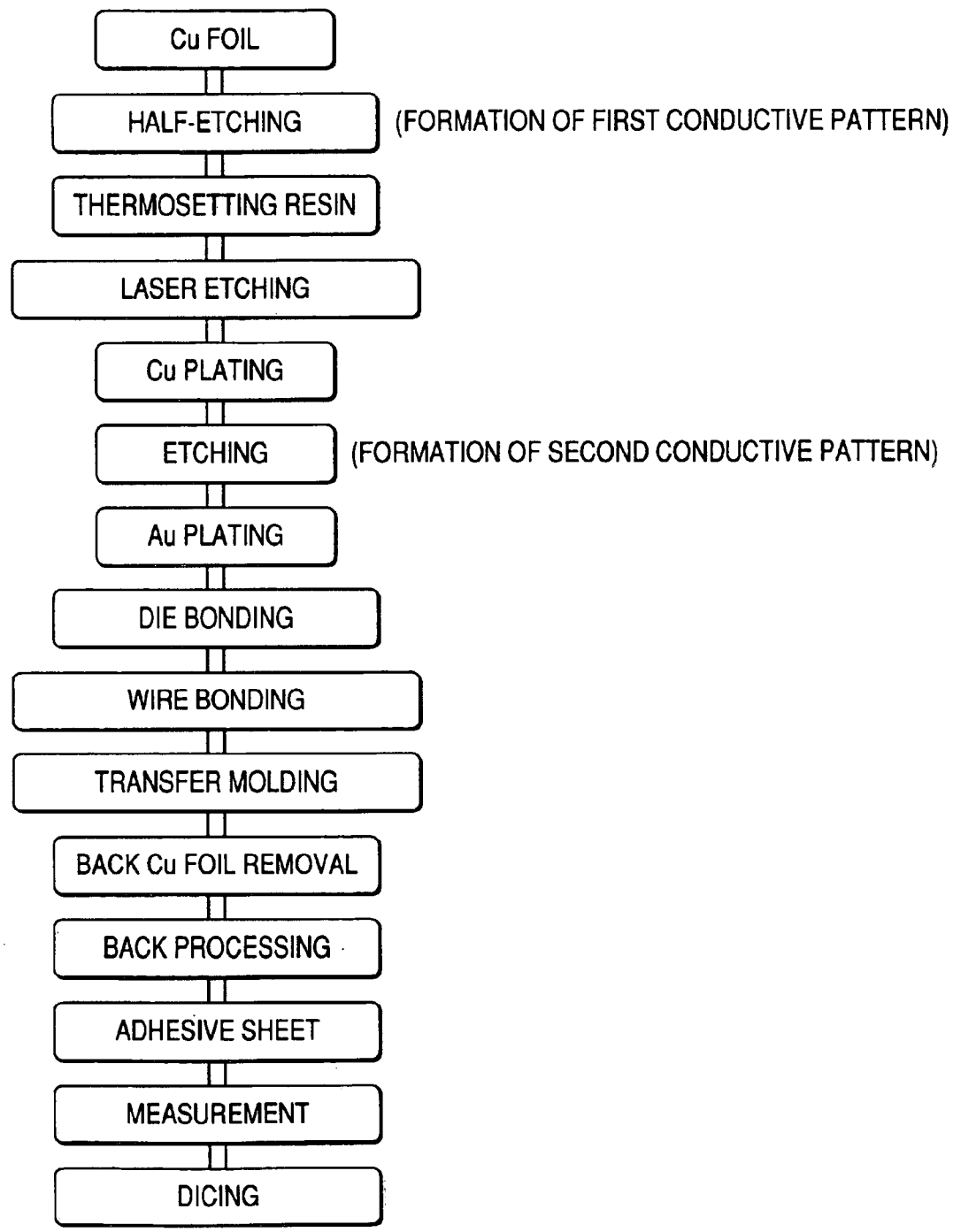
FIG. 41 is a view for showing a method for manufacturing the circuit device of the invention.

The flowchart of FIG. 41 does not correspond to the method as above. In this, the two flows of Cu foil and half-etching are to form a conductive pattern. In the next flow of thermosetting resin, the surface of the isolation trench and the first conductive pattern is covered with a thermosetting resin. In the flows of laser etching, Cu plating and etching, the second conductive pattern is formed. In the flow of Au plating, a bonding pad is selectively formed in the second conductive pattern. In the two flows of die bonding and wire bonding, a circuit element is fixed onto each element-mounting part, and its electrodes are connected to the second conductive pattern. In the flow of transfer molding, an insulating resin is applied to the structure by common molding. In the flow of removing the back Cu foil, the conductive foil in the thickness part with no isolation trench therein is etched away. In the flow of back processing, the electrodes of the first conductive pattern exposed to the back are processed. In the flow of adhesive sheet, multiple blocks are attached to an adhesive sheet. In the flow of measurement, the circuit elements built in the structure are checked and graded. In the flow of dicing, the insulating resin is diced into individual circuit devices.

Next described are the steps of the invention with reference to FIG. 40 and FIGS. 42 to 50.

Figure 42A:
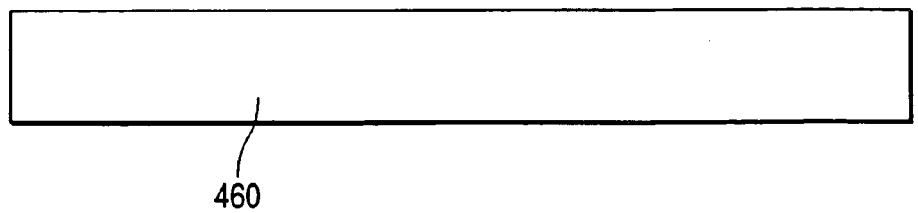
FIG. 42 is a view for showing a method for manufacturing the circuit device of the invention.
Figure 42B:
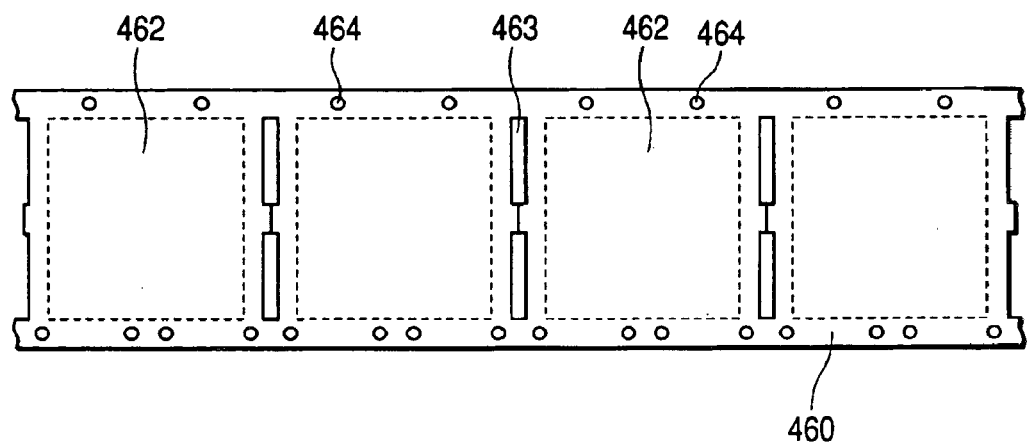
Figure 43:
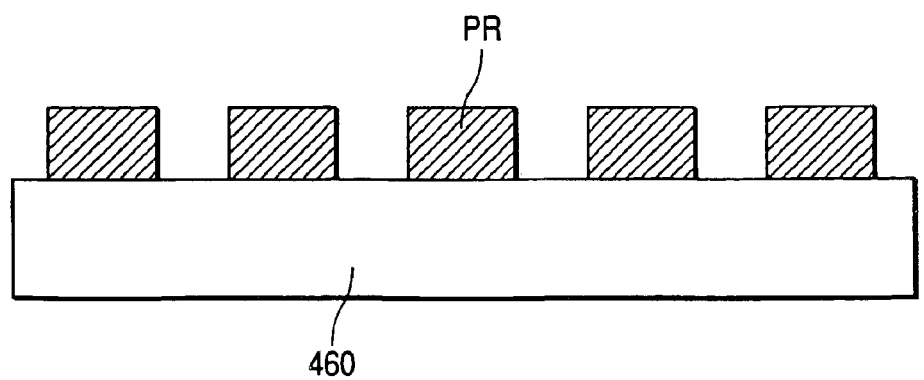
FIG. 43 is a view for showing a method for manufacturing the circuit device of the invention.
Figure 44:
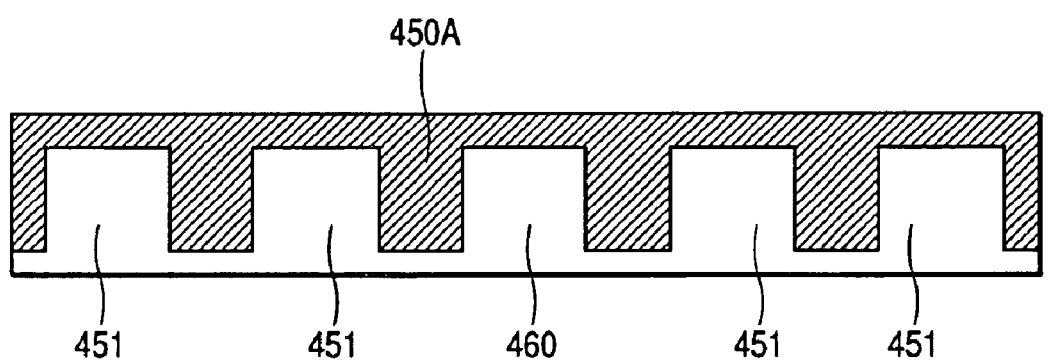
FIG. 44 is a view for showing a method for manufacturing the circuit device of the invention.

As in FIG. 42 to FIG. 44, the first step comprises preparing conductive foil 460, and forming a isolation trench 461 that does not exceed the thickness of the conductive foil 460 in a region of the conductive foil 460 at least except the region to be a first conductive pattern 451 that has a number of parts to carry circuit elements 452 mounted thereon, thereby to form the first conductive pattern 451 in multiple blocks.

In this step, a sheet of conductive foil 460 is prepared, as in FIG. 42A. The material for the conductive foil 460 is selected in consideration of solder adhesiveness thereto and the bondability and the platability thereof. For example, usable is conductive foil of essentially Cu, conductive foil of essentially Al, or conductive foil of essentially Fe—Ni or the like alloy.

The thickness of the conductive foil is preferably from 10 $\mu$m to 300 $\mu$m or so in view of the easiness in etching it. In this, used is copper foil having a thickness of 125 $\mu$m. Basically, however, the conductive foil may be thicker than 300 $\mu$m or thinner than 10 $\mu$m. As will be mentioned hereinunder, the thickness of the conductive foil 460 may be such that it accepts the formation of a shallow isolation trench 461 therein.

The conductive foil sheet 460 may be prepared in the form of a roll having a predetermined width, for example, 45 mm, and this may be fed to each step. Alternatively, strips of conductive foil 460 cut to have a predetermined size may be prepared and these may be fed to each step.

Concretely, four or five blocks 462 are formed on a conductive foil strip 460, spaced from each other as in FIG. 42B. Each block shall have a large number of element-mounting parts to be formed therein. A slit 463 is formed between the neighboring blocks 462, and this acts to absorb the stress of the conductive foil 460 in thermal treatment in the molding step, etc. Index holes 464 are formed at predetermined intervals in the upper and lower peripheries of the conductive foil 460, and these are for location in every step.

Next, a first conductive pattern 451 is formed in every block.

As in FIG. 43, a photoresist (etching-resistant mask) PR is formed on the Cu foil 460, and this is patterned to partly expose the conductive foil 460 except the region to be a first conductive pattern 451. Next, as in FIG. 44A, the conductive foil 460 is selectively etched via the photoresist PR.

The depth of the isolation trench 461 formed by the etching is, for example, from 20 to 30 $\mu$m, and the side wall thereof is roughened through oxidation or chemical polishing so as to increase its adhesiveness to the thermosetting resin layer 450A.

The side wall of the isolation trench 461 is schematically drawn to be straight in the figures, but may have any other structure depending on the method of removing the photoresist for forming it. The method of photoresist removal includes wet etching, dry etching, laser evaporation and dicing. In wet etching, the etchant to be employed is essentially ferric chloride or cupric chloride, and the conductive foil is dipped in or showered with the etchant. In wet etching, in general, the conductive foil is etched non-anisotropically, and its etched side wall is therefore curved.

In dry etching, the conductive foil may be etched aniso-tropically or non-anisotropically. At present, it is said that Cu could not be removed through reactive ion etching, but it may be removed through sputtering. Depending on the condition of sputtering, Cu may be etched anisotropically or non-anisotropically.

In laser evaporation, a laser ray may be directly applied to the conductive foil to form the isolation trench 461. In this case, the side wall of the isolation trench 461 formed may be straight.

FIG. 44B is a schematic view of the first conductive pattern 451. This corresponds to an enlargement of one block 462 shown in FIG. 42B. One black section corresponds to one element-mounting part 465, and the black sections constitute the first conductive pattern 451. One block 462 has a large number of element-mounting parts 465 that are aligned in a matrix of 5 lines and 10 rows, and the same first conductive pattern 451 is formed for every element-mounting part 465. A frame pattern 466 is formed around every block, and registration marks 467 for dicing are provided inside it, spaced in some degree from it. The frame pattern 466 is for engagement of the patterned conductive foil with a mold, and after back etching of the conductive foil 460, it reinforces the insulating resin 450B.

Figure 45:
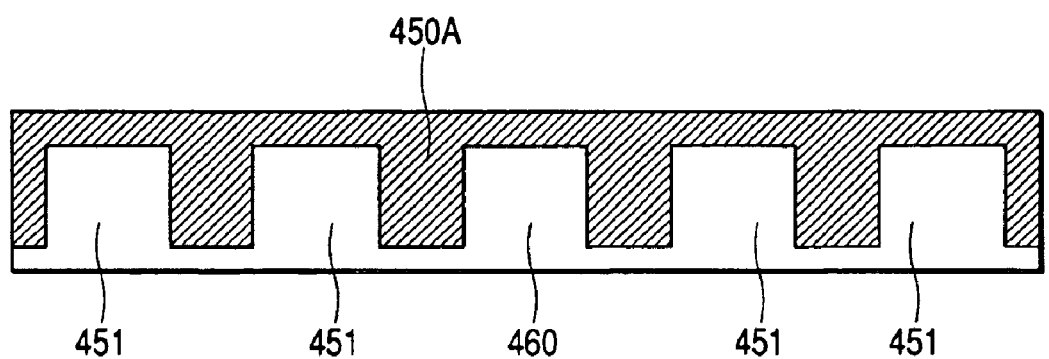
FIG. 45 is a view for showing a method for manufacturing the circuit device of the invention.

The second step of the invention is to form the thermosetting resin layer 450A that covers the isolation trench 461 and the surface of the first conductive pattern 451, as in FIG. 45.

This step characterizes the invention, in which a thermosetting resin such as epoxy resin is used for the thermosetting resin layer 450A, and this fills the isolation trench 461 and covers the surface of the first conductive pattern 451. For forming the thermosetting resin layer 450A, a liquid material prepared by dissolving a thermosetting resin in an organic solvent is cast over the isolation trench 461 and the first conductive pattern 451, heated at 80° C. to 100° C. to semi-cure it with evaporating away the organic solvent, and then further heated at 150° C. to 170° C. for about 1.5 hours to finally cure it. Accordingly, the semi-cured thermosetting resin is in B-stage, and it is not as yet finally set.

Preferably, a filler such as silica or alumina is added to the thermosetting resin layer 450A to reduce the thermal expansion difference between the layer 450A and the first conductive pattern 451. In general, the thermal expansion coefficient of epoxy resin is 50 ppm/° C.; that of epoxy resin containing the filler is from 15 to 30 ppm/° C.; and that of copper to form the conductive pattern 451 is 18 ppm/° C. Therefore, the filler may remove the thermal expansion mismatch between epoxy resin and copper.

Since the thermosetting resin for the layer 450A is filled into the isolation trench 461 while it is a liquid of low viscosity, it may well adhere to the inner walls of the isolation trench 461, as compared with epoxy resin to be transfer-molded, and the adhesion strength between the two may be increased significantly. The depth of the isolation trench 461 is about 60 $\mu$m for ensuring the necessary adhesion strength in the related art. However, since the adhesion strength in this embodiment is increased, the depth of the isolation trench 461 may be a half of it in the related art as above, concretely from 20 to 30 μm, and this produces an advantage in that the first conductive pattern 451 may be a finer pattern.

Another method may be employed for forming the thermosetting resin layer 450A, which comprises pressing a semi-cured film sheet of thermosetting resin such as epoxy resin against the first conductive pattern 451 followed by finally curing it thereon under heat to thereby cover the first conductive pattern 451 and fill the isolation trench 461 with the resin. The surface of the thermosetting resin film is covered with a cushion sheet, and pressed under 100 kg/cm$^2$ under heat at 150° C. to 170° C., and the resin is finally cured while its melt covers the isolation trench 461 and the surface of the first conductive pattern 451.

In this step, it is desirable to roughen the inner wall of the isolation trench 461 for further enhancing the adhesion strength between the isolation trench 461 and the thermosetting resin layer 450A. For it, for example, the inner wall of the isolation trench 461 is oxidized or chemically polished with an organic acid etchant. For the organic acid etchant, for example, usable is Mec's CZ-8100. The patterned conductive foil is dipped in the etchant for a few minutes to roughen the surface thereof to a degree of from 1 to 2 μm or so. Through the treatment, the inner wall of the isolation trench 461 is roughened, and the adhesion strength between the isolation trench 461 and the thermosetting resin layer 450A is thereby increased.

In another embodiment of this step, a UV-curable resin may be used in place of the thermosetting resin for the layer 450A. Concretely, a UV-curable resin is applied onto the patterned conductive foil, using a vacuum laminator, and then cured through exposure to UV rays and development to thereby form a cured UV resin layer that covers the desired surface of the isolation trench 461 and the first conductive pattern 451. This embodiment simplifies the process since it covers the next third step.

Figure 46:
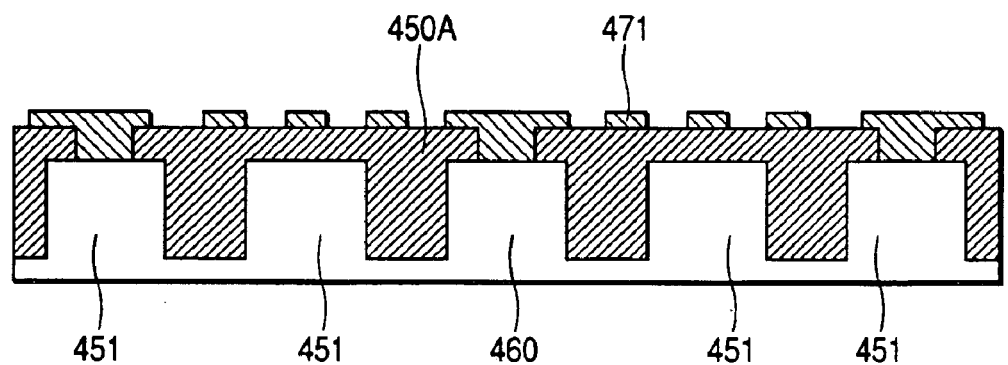
FIG. 46 is a view for showing a method for manufacturing the circuit device of the invention.

The third step of the invention comprises exposing the surface of a predetermined area of the first conductive pattern 451 by removing the thermosetting resin layer 450A thereon through laser etching, followed by applying a conductive plate film 474 thereto for forming a second conductive pattern 471 thereon, as in FIG. 46.

In this step, the thermosetting resin layer 450A is partly selectively removed through laser etching for direct patterning to thereby partly expose the first conductive pattern 451 with forming through-holes 473 therein. For the laser, carbon dioxide laser is preferred, but excimer laser and YAG laser may also be used. When the resin still remains on the bottom of the opening after its removal through laser evaporation, it is removed, for example, through wet etching with sodium permanganate or ammonium persulfate or through dry etching with excimer laser.

Next, a conductive plate film 474 is formed to cover the through-holes 474 and the surface of the thermosetting resin layer 450A, as in FIG. 46.

Concretely, a conductive plate film 474 is formed over the entire surface of the structure including the through-holes 473 and the thermosetting resin layer 450A, with no mask. The conductive plate film 474 maybe formed in any mode of electroless plating or electrolytic plating. In this case, it is formed through electroless plating with Cu to have a thickness of about 2 μm, and it covers the entire surface of the structure including the through-holes 473 and the thermosetting resin layer 450A. Accordingly, the conductive plate film 474 is electrically connected to the first conductive pattern 451. Using the first conductive pattern 451 formed of the conductive foil 460 as an electrode, this is further electrolytically plated with Cu to form thereon a Cu plate having a thickness of about 20 μm. As a result, the through-holes 473 are all filled with the conductive plate film 474. Cu is used for the conductive plate film 474, for which, however, any other of Au, Ag or Pd may also be used. As the case may be, the structure may be partly plated via a mask.

Figure 47:
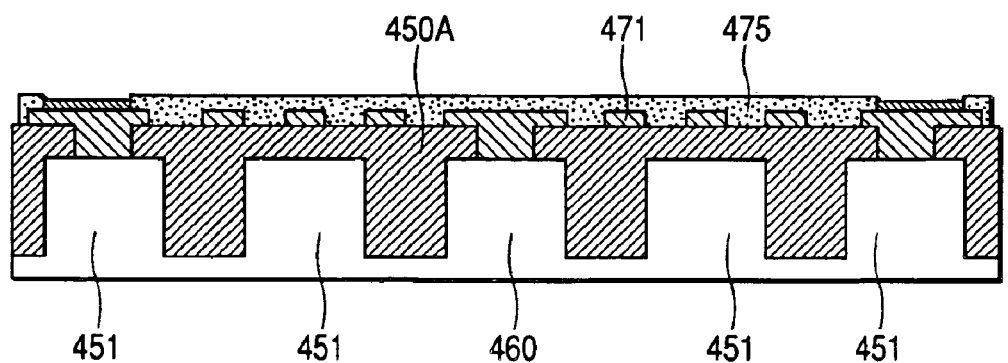
FIG. 47 is a view for showing a method for manufacturing the circuit device of the invention.

The fourth step of the invention comprises etching the conductive plate film 474 in a predetermined pattern to form the second conductive pattern 471, as in FIG. 47.

The conductive plate film 474 is coated with a photoresist layer of a predetermined pattern, and this is chemically etched to form the conductive film 454 that is to be a bonding pad and the second conductive pattern 471 that extends toward the center from the bonding pad. The conductive plate film 474 is formed of a material of essentially Cu, and the etchant for it may be ferric chloride or cupric chloride.

The thickness of the conductive plate film 474 is approximately from 5 to 20 μm. Therefore, its advantage is that the second conductive pattern 471 may be a fine pattern of at most 20 μm.

Figure 48A:
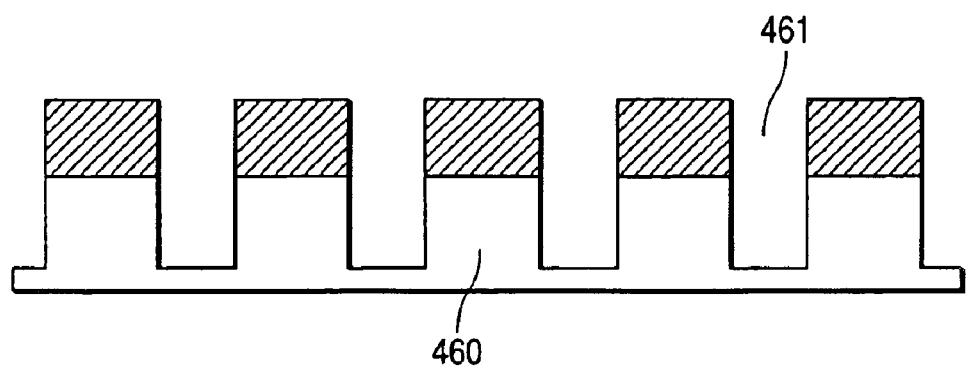
FIG. 48 is a view for showing a method for manufacturing the circuit device of the invention.
Figure 48B:
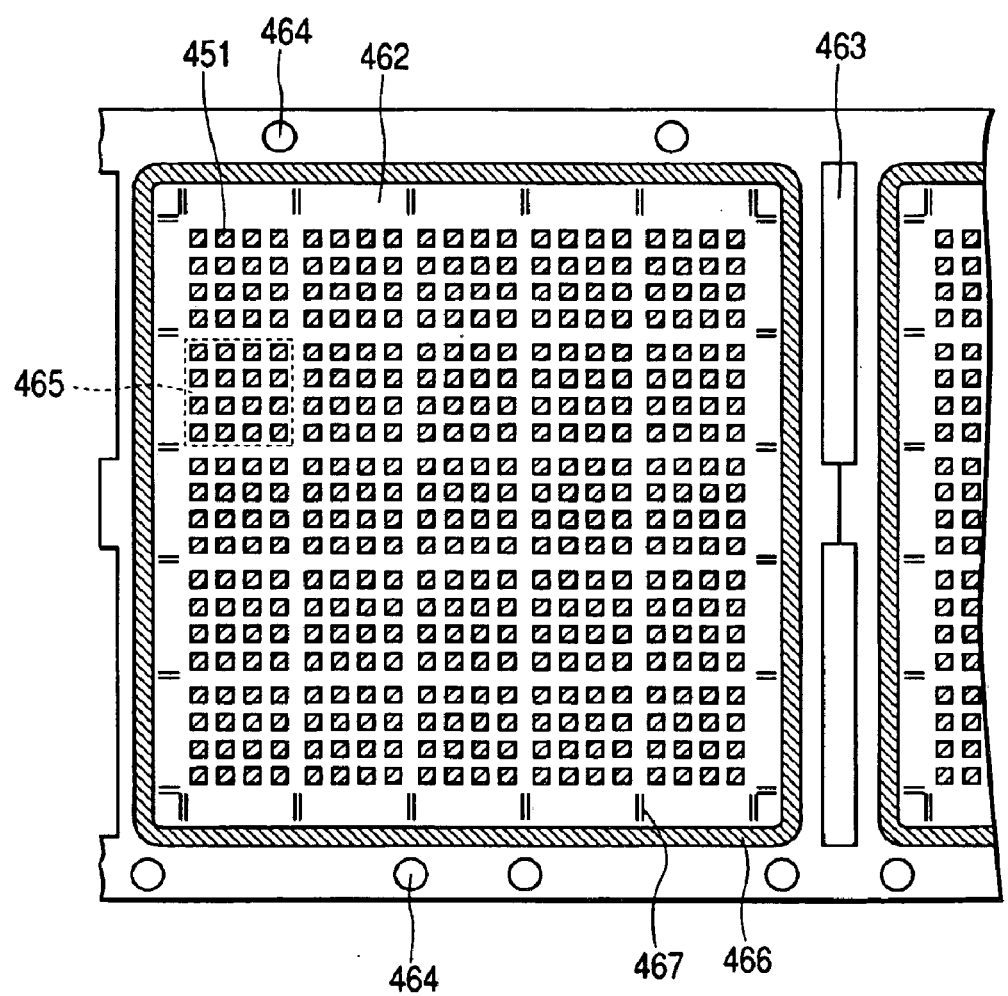
Figure 49:
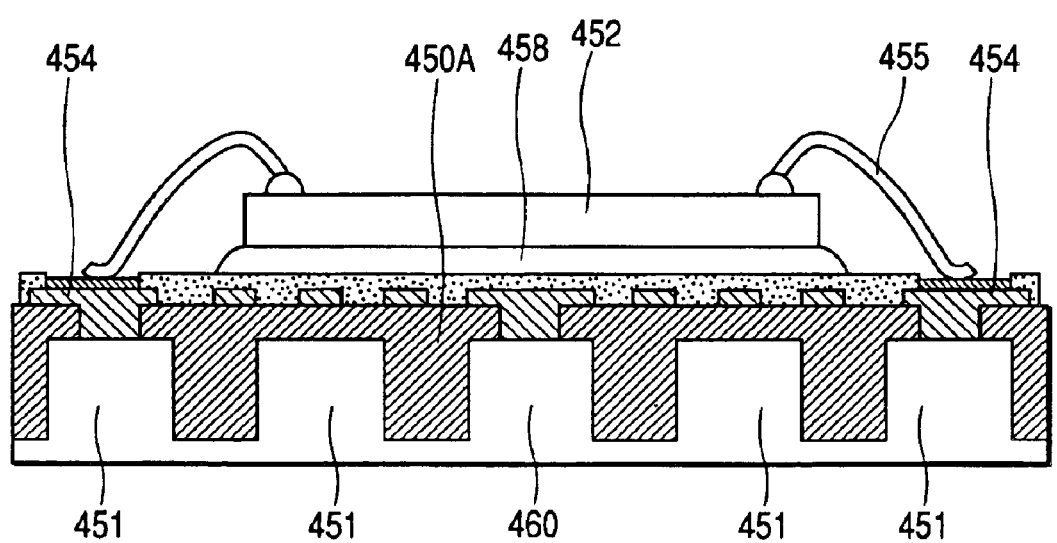
FIG. 49 is a view for showing a method for manufacturing the circuit device of the invention.

The fifth step of the invention comprises forming a conductive film 454 on the exposed second conductive pattern 471, as in FIG. 48.

The second conductive pattern 471 is coated with an insulating film 475 such as overcoating resin. For forming the insulating film 475, for example, epoxy resin or the like dissolved in a solvent may be applied to the structure by screen-printing and then thermally cured. Alternatively, a photo-solder resist may be used for the insulating film 475, and it may be partly left through exposure and development.

Next, the second conductive pattern 471 is masked with a photoresist layer except the part thereof to be a bonding pad, and the insulating film 474 is selectively removed through laser etching whereby the second conductive pattern 471 is selectively exposed out. For the laser, carbon dioxide laser is preferred, but excimer layer and YAG laser may also be used. When the insulating resin still remains on the bottom of the opening after its removal through laser evaporation, it is removed, for example, through wet etching with sodium permanganate or ammonium persulfate or through dry etching with excimer laser.

The remaining insulating film 475 serves as a mask, and the conductive film 454 is plated with any of gold, silver or palladium by electrolytic plating or electroless plating. Thus plated, it may serve as a bonding pad.

For example, a silver film adheres to gold wires and to solder. In addition, fine Au wires may adhere to such a conductive film of silver. Therefore, the conductive film 554 accepts wire bonding, and its one advantage is that the film may serve directly as a bonding pad.

The sixth step of the invention comprises fixing a circuit element 452 onto the insulating film 457 in the element-mounting part 465 thereof with a conductive or insulating adhesive 458, and forming a connecting means for electrically connecting the electrode of the circuit element 452 in the element-mounting part 465 to a desired part of the second conductive pattern 471, as in FIG. 49B.

The circuit element 452 includes semiconductor elements such as transistors, diodes, IC chips. Though thick, face-down semiconductor elements such as CSP or BGA may also be mounted on the structure. Multiple IC chips may be piled up or may be arrayed in plane to constitute the circuit element 452.

In the illustrated embodiment, a bare IC chip 452 is fixed onto insulating film 457 with an insulating adhesive 458 such as epoxy resin, and the electrodes of the IC chip 452 are connected to the corresponding conductive films 454 formed on the second conductive pattern 471 around the element-mounting part 465, via a bonding wire 455 bonded to the two by thermal ball bonding or ultrasonic wedge bonding.

A large number of second conductive patterns 471 are integrated in every block 462. Therefore, the advantage of this step is that the circuit elements 452 may be efficiently mounted on the second conductive patterns through physical fixation and wire bonding.

The seventh step of the invention comprises common-molding the circuit elements 452 on the element-mounting parts 463 with an insulating resin 450B that collectively covers the elements and bonds to the thermosetting resin layer 450A filled in the isolation trench 461, as in FIG. 50.

Figure 50A:
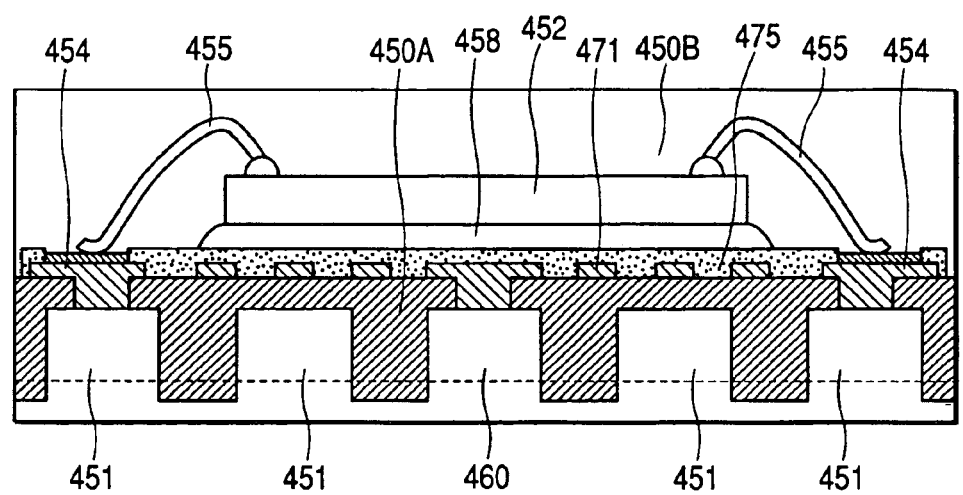
FIG. 50 is a view for showing a method for manufacturing the circuit device of the invention.

The isolation trench 461 and the multiple conductive patterns 451 are covered with the thermosetting resin layer 450A in the previous step, and the insulating resin 450B covers the circuit element 452 and bonds to the thermosetting resin layer 450A remaining in the isolation trench 461 and on the surface of the first conductive pattern 451, as in FIG. 50A. The insulating resin 475 exists between the thermosetting resin layer 450A and the insulating resin 450B, but this is extremely thin and is formed of epoxy resin, a type of thermosetting resin. Therefore, they are well compatible with each other and produce a strong adhesion strength. For further enhancing the adhesion strength, it is desirable that the surface of the insulating film 475 is subject to UV irradiation or plasma irradiation to activate the polar group of the resin in the surface of the insulating film 475 prior to the molding treatment with the insulating resin 450B. As a result, the thermosetting resin layer 450A is integrated with the insulating resin 450B to more firmly support the first conductive pattern 451.

In this step, when direct bonding between the thermosetting resin layer 450A and the insulating resin 450B is desired, it is preferable that the part of the insulating film 475 not having the second conductive pattern 471 therein is removed in the treatment of etching the insulating film 475 in the previous step.

The treatment of this step may be realized by transfer molding, injection molding or dipping. Regarding the type of the resin material, thermosetting resin such as epoxy resin may be transfer-molded; and thermoplastic resin such as polyimide resin or polyphenylene sulfide may be injection-molded.

Figure 50B:
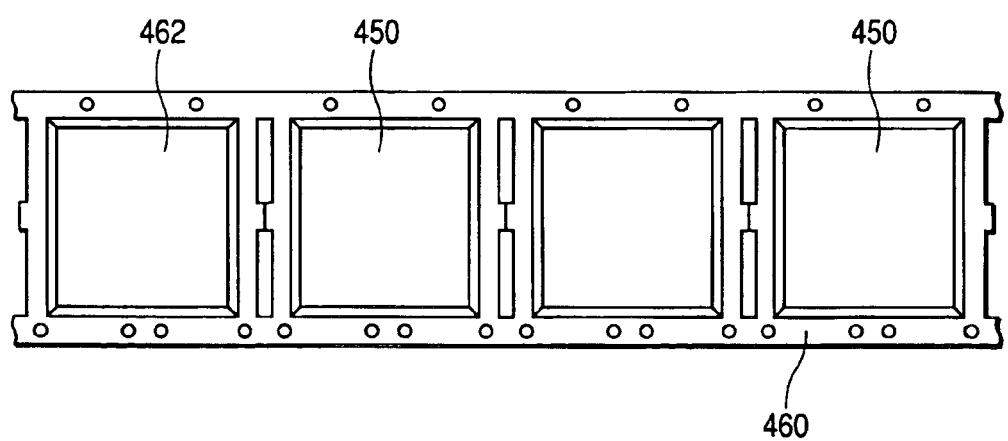

In this step of transfer molding or injection molding, the element-mounting parts 463 in one block 462 are all put in one common mold, and they are common-molded with one insulating resin 450B, as in FIG. 50B. In this step, therefore, the amount of the resin to be used may be reduced significantly, as compared with that in conventional transfer molding, and common molds may be used.

The thickness of the insulating resin 450B that covers the surface of the conductive foil 460 is so controlled that it is about 100 μm or so from the top of the circuit element 452. This thickness may be increased or decreased in consideration of the mechanical strength of the resin layer.

Figure 10:
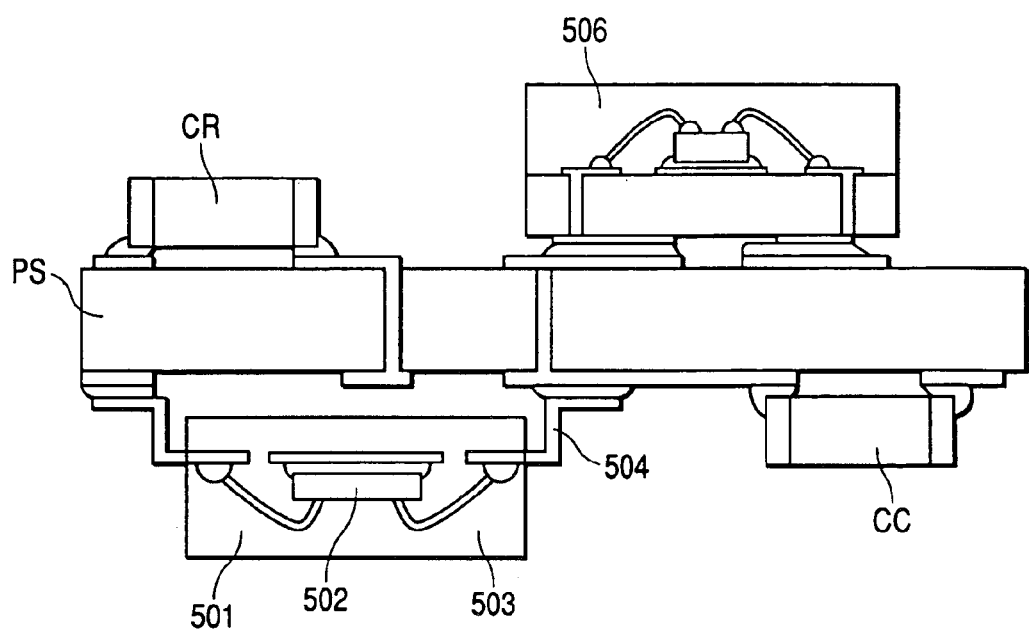
FIG. 10 shows a package structure of a conventional circuit device.

This step is characterized in that the conductive foil 460 to form the first conductive pattern 451 serves as a supporting board before it is coated with the insulating resin 450B. In the related art technology, the conductive paths 507 to 511 are formed by the use of the supporting board 505 that is naturally unnecessary, as in FIG. 10. In the invention, however, the conductive foil 460 that serves as the supporting board is a material necessary for electrodes. Accordingly, the invention is advantageous in that the necessary constitutive materials may be reduced to the minimum and the production costs are therefore reduced.

Since the depth of the isolation trench 461 does not exceed the thickness of the conductive foil 460, the first conductive pattern 451 of the conductive foil 460 is not individually separated. Accordingly, the conductive foil 460 can be handled as one sheet as a whole, and when it is molded with the insulating resin 450B, it may be readily transferred and put into a mold.

The seventh step of the invention comprises removing the conductive foil 460 in the thickness part not having the isolation trench 461 formed therein, as in FIG. 50A.

In this step, the back of the conductive foil 460 is chemically and/or physically removed to individually separate the conductive pattern 451. This may be carried out, for example, through polishing, cutting, etching or metal evaporation with laser.

In one example of this process, the entire back of the conductive foil 460 is cut with a polishing machine or a cutting machine to a depth of about 100 μm or so, whereby the thermosetting resin layer 450A is exposed out of the isolation trench 461. The face to be exposed out through the treatment is represented by the dotted line in FIG. 50A. As a result, the first conductive pattern 451 is individually separated to have a thickness of about 30 μm. Apart from it, the entire back of the conductive foil 460 may be wet-etched before the thermosetting resin layer 450A is exposed out, and then it may be cut with a polishing or cutting machine so that the thermosetting resin layer 450A is exposed out. In still another embodiment, the entire back of the conductive foil 460 may be wet-etched to the depth of the dotted line whereby the thermosetting resin layer 450A may also be exposed out.

In the structure thus processed, the back of the first conductive pattern 451 is exposed out of the thermosetting resin layer 450A. Specifically, the face of the thermosetting resin layer 450A filled in the isolation trench 461 is substantially on the same level as that of the first conductive pattern 451. Accordingly, the circuit device 453 of the invention does not have a difference in level for the back electrodes 510 and 511 as in FIG. 12 that indicates a related art technology, and this is characterized in that, when other elements are mounted thereon, it accepts horizontal movement for self-alignment based on the surface tension of solder or the like.

Further, the back of the first conductive pattern 451 is processed to obtain the final structure as in FIG. 40. Concretely, a part of the first conductive pattern 451 to form electrodes is selectively exposed out while the other part thereof is coated with a resist layer 457, and a conductive material such as solder is applied to it to form back electrodes 456, thereby completing a final circuit device.

The eighth to tenth steps of this mode are the same as those of the fourth mode described hereinabove.

Figure 51:
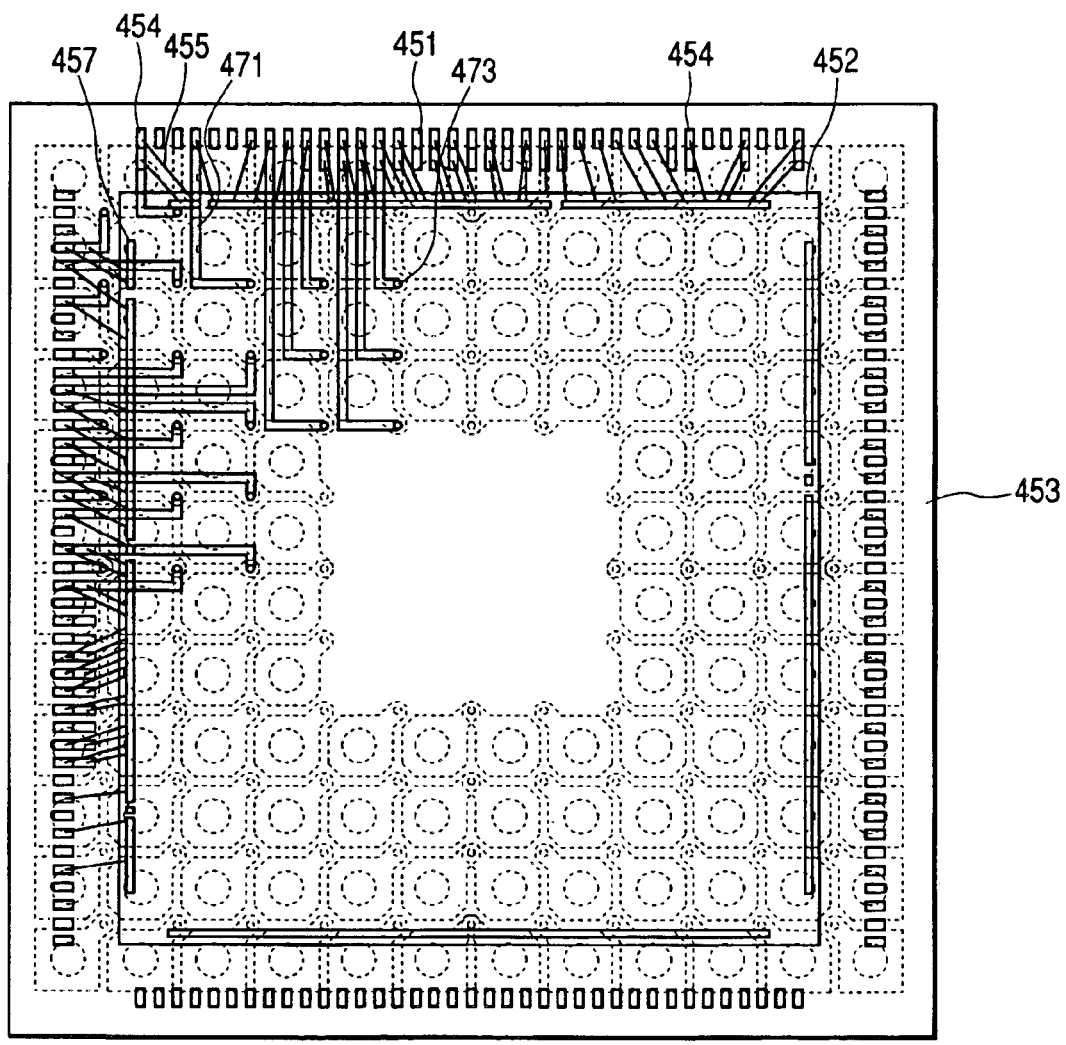
FIG. 51 shows an embodied circuit device of the invention.

FIG. 51 is referred to, which shows an embodied circuit device of the invention. In this, the pattern indicated by solid lines is the second conductive pattern 471, and the pattern indicated by dotted lines are the first conductive pattern 451. The second conductive pattern 471 is worked to form the conductive film 454 that serves as a bonding pad around the bare semiconductor chip 452. This partly has a two-layered structure, corresponding to the bare semiconductor chip 452 with multiple pads therearound. The bonding pad is connected to the corresponding electrode pad 475 of the bare semiconductor chip 452 via the bonding wire 455. Many fine patterns, second conductive patterns 471 extend from the bonding pad to the area below the bare semiconductor chip 452, and these are connected to the first conductive pattern 451 through the through-holes 473 shown by black spots.

Having the constitution, even a semiconductor circuit device having 200 or more pads may be connected to the desired first conductive pattern via the fine patterns, second conductive patterns 471, by multi-layered wiring connection, and the back electrode 456 fitted to the first conductive pattern may be connected to other external circuits. In FIG. 51, the thermosetting resin layer 450A and the insulating resin 450B are omitted for simplifying the description.

What is claimed is:

1. A circuit device comprising:
    plurality of conductive patterns for element mounting thereon and electrically separated from each other by a isolation trench;
    a thermosetting resin layer filling the isolation trench to cover at least a part of the surface of the conductive pattern;
    a circuit element fixed above the conductive pattern; and
    an insulating resin covering the circuit element to integrally support the conductive pattern bonded to the thermosetting resin layer.

2. The circuit device as claimed in claim 1, wherein the thermosetting resin layer is provided between the circuit element and the conductive pattern.

3. The circuit device as claimed in claim 1, wherein the back of the conductive pattern is exposed out to form external electrodes.

4. The circuit device as claimed in claim 1, wherein the circuit element is fixed on a desired region of the conductive pattern exposed from the thermosetting resin layer.

5. The circuit device as claimed in claim 1, further comprising:
    a second conductive pattern formed on the thermosetting resin layer and connected to the conductive pattern at desired sites;
    wherein the circuit element is fixed on the second conductive pattern while insulated from the second conductive pattern; and
    wherein the insulating resin integrally supports the conductive pattern and the second conductive pattern.

6. The circuit device as claimed in claim 1, wherein the insulating resin covers the circuit element and bonds to the thermosetting resin layer to integrally support the conductive pattern with the back alone of the conductive pattern being exposed out.

7. The circuit device as claimed in claim 1, further comprising a connecting means for connecting the electrodes of the circuit element to the other conductive pattern.

8. The circuit device as claimed in claim 7, wherein the connecting means is formed of a bonding wire.

9. The circuit device as claimed in claim 1, wherein the conductive pattern is formed of conductive foil of any of copper, aluminium or iron-nickel.

10. The circuit device as claimed in claim 1, wherein a conductive film of a metal material that differs from the material of the conductive pattern is provided on a desired region of the conductive pattern exposed from the thermosetting resin layer.

11. The circuit device as claimed in claim 10, wherein the conductive film is formed of a plating layer of gold, silver or palladium.

12. The circuit device as claimed in claim 1, wherein the circuit element comprises either one or both of a bare semiconductor chip and a chip circuit part.

13. The circuit device as claimed in claim 1, wherein the back of the conductive pattern and the back of the thermosetting resin layer that fills the isolation trench are substantially flattened.

14. The circuit device as claimed in claim 1, wherein the conductive pattern is used for electrodes and bonding pads.

15. A circuit device comprising:
    multiple conductive pattern for element mounting thereon;
    a circuit element fixed above at least a part of the conductive pattern;
    a conductive adhesion means for connecting the conductive pattern to the circuit element and adhering the conductive pattern and the circuit element;
    an insulating resin that covers the circuit element to integrally support the conductive pattern and the circuit element.

16. A method for manufacturing circuit devices, comprising the step of:
    preparing conductive foil;
    forming multiple conductive pattern for element mounting thereon;
    fixing a circuit element to at least a part of the conductive pattern via a conductive adhesion means electrically connecting the two and adhering the two; and
    providing an insulating resin to seal the circuit element and the conductive pattern.

* * * * *